(12) United States Patent
Kaneko et al.

(10) Patent No.: US 11,604,412 B2
(45) Date of Patent: Mar. 14, 2023

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Akihiro Kaneko, Shizuoka (JP); Junichi Ito, Shizuoka (JP); Takashi Kawashima, Shizuoka (JP); Michihiro Ogawa, Shizuoka (JP); Tomotaka Tsuchimura, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 290 days.

(21) Appl. No.: 16/722,026

(22) Filed: Dec. 20, 2019

(65) Prior Publication Data

US 2020/0124963 A1  Apr. 23, 2020

Related U.S. Application Data

(63) Continuation of application No. PCT/JP2018/027290, filed on Jul. 20, 2018.

(30) Foreign Application Priority Data

Aug. 31, 2017  (JP) .............................. JP2017-167802

(51) Int. Cl.
| G03F 7/039 | (2006.01) |
| G03F 7/004 | (2006.01) |
| C08F 212/14 | (2006.01) |
| G03F 7/20 | (2006.01) |
| G03F 7/30 | (2006.01) |

(52) U.S. Cl.
CPC .......... G03F 7/0046 (2013.01); C08F 212/20 (2020.02); C08F 212/22 (2020.02); G03F 7/039 (2013.01); G03F 7/20 (2013.01); G03F 7/30 (2013.01)

(58) Field of Classification Search
CPC ... G03F 7/039; G03F 7/20; G03F 7/30; G03F 7/0046; G03F 7/0397; G03F 7/2041; H01L 21/28; H01L 21/288; H01L 21/3205; H01L 21/768; H05K 1/03; H05K 3/10; H05K 3/40; C07C 69/63; C08F 112/14; C08F 12/20; C08F 12/22; C08F 12/24; C08F 220/28; C08F 8/14; C08F 220/24; C08F 2220/302; C09D 125/18; Y10S 430/106; Y10S 430/146
See application file for complete search history.

(56) References Cited

U.S. PATENT DOCUMENTS

| 2005/0164119 A1 | 7/2005 | Maeda et al. |
| 2009/0047602 A1* | 2/2009 | Furuya .................. G03F 7/2041 430/285.1 |
| 2013/0115556 A1 | 5/2013 | Iwato et al. |
| 2014/0272692 A1 | 9/2014 | Yokokawa et al. |
| 2017/0042038 A1 | 2/2017 | Hamaguchi et al. |

FOREIGN PATENT DOCUMENTS

| JP | 2003-252928 A | 9/2003 |
| JP | 2012-008500 A | 1/2012 |
| JP | 2013-137537 A | 7/2013 |
| JP | 2016-095506 A | 5/2016 |
| WO | 2015/137248 A1 | 9/2015 |
| WO | 2016/136481 A1 | 9/2016 |
| WO | WO-2017018129 A1 * | 2/2017 ............... H05K 3/10 |

OTHER PUBLICATIONS

English translation of WO 2017/018129 A1; Kenrou Tanaka; Published: Feb. 2, 2017 (Year: 2017).*
International Search Report dated Oct. 2, 2018, issued by the International Searching Authority in application No. PCT/JP2018/027290.
Written Opinion dated Oct. 2, 2018, issued by the International Searching Authority in application No. PCT/JP2018/027290.
International Preliminary Report on Patentability dated Mar. 3, 2020, issued by the International Bureau in application No. PCT/JP2018/027290.

* cited by examiner

*Primary Examiner* — Peter L Vajda
*Assistant Examiner* — Richard David Champion
(74) *Attorney, Agent, or Firm* — Sughrue Mion, PLLC

(57) ABSTRACT

An actinic ray-sensitive or radiation-sensitive resin composition includes a resin having a group represented by General Formula (1) and a compound that generates an acid upon irradiation with actinic rays or radiation.

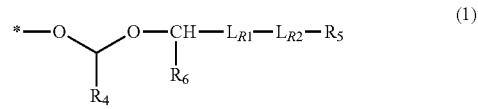

(1)

16 Claims, No Drawings

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2018/027290 filed on Jul. 20, 2018, which claims priority under 35 U.S.C. § 119(a) to Japanese Patent Application No. 2017-167802 filed on Aug. 31, 2017. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using an actinic ray-sensitive or radiation-sensitive resin composition has been performed. In recent years, formation of an ultrafine pattern in a submicron region or a quarter-micron region has been demanded in accordance with realization of a high degree of integration for integrated circuits. With such a demand, a tendency that an exposure wavelength has been shifted from g-rays to i-rays, and further, as with KrF excimer laser light, the exposure wavelength becomes shorter is observed. Moreover, developments in lithography with electron beams, X-rays, or extreme ultraviolet rays (EUV), in addition to the excimer laser light, have also been currently proceeding.

For example, WO2015/137248A discloses a method for producing a pipe, the method including a step of forming a coating film by applying a radiation-sensitive composition which is a composition including a compound having an acid-dissociable group and an acid generator, in which the acid-dissociable group includes a fluorine atom.

SUMMARY OF THE INVENTION

However, EUV light (wavelength: 13.5 nm) has a short wavelength, as compared with, for example, ArF excimer laser light (wavelength: 193 nm), and therefore, it may have a small number of incident photons with the same sensitivity upon exposure of a resist film. As a result, in lithography with EUV light, an effect of a "photon shot noise" that the number of photons becomes uneven stochastically is significant, which has become a major cause of deterioration in pattern performance.

Under the background, there has been a demand for an actinic ray-sensitive or radiation-sensitive resin composition which can form an excellent pattern in lithography with EUV light.

The present inventors have found that according to a method in which many halogen atoms having a high EUV light absorbing efficiency are introduced into a resist film, the EUV light absorption efficiency of the resist film is improved. On the other hand, they have also confirmed that the performance of a pattern thus formed is likely to be deteriorated depending on a form in which halogen atoms are introduced into a resist film.

The present inventors have conducted studies on the technology disclosed in the section of Examples of WO2015/137248A, and have thus found that the radiation-sensitive resin composition obtained based on WO2015/137248A has a room for improvement in the line edge roughness (LER) performance of a pattern thus obtained and suppression of pattern collapse.

Therefore, an object of the present invention is to provide an actinic ray-sensitive or radiation-sensitive resin composition which can form a pattern having excellent LER performance and can also suppress pattern collapse.

In addition, another object of the present invention is to provide a resist film, a pattern forming method, and a method for manufacturing an electronic device, each using the actinic ray-sensitive or radiation-sensitive resin composition.

The present inventors have conducted extensive studies to achieve the objects, and as a result, they have found that the objects can be achieved by using a resin having a specific group, thereby completing the present invention.

That is, the present inventors have found that the objects can be achieved by the following constitutions.

[1] An actinic ray-sensitive or radiation-sensitive resin composition comprising a resin having a group represented by General Formula (1) which will be described later and a compound that generates an acid upon irradiation with actinic rays or radiation.

[2] The actinic ray-sensitive or radiation-sensitive resin composition as described in [1],
in which in General Formula (1) which will be described later, the halogen atom is a fluorine atom and the halogenated alkyl group is a fluorinated alkyl group.

[3] The actinic ray-sensitive or radiation-sensitive resin composition as described in [1] or [2],
in which in General Formula (1) which will be described later, $L_{R2}$ represents a single bond.

[4] The actinic ray-sensitive or radiation-sensitive resin composition as described in any one of [1] to [3],
in which in General Formula (1) which will be described later, at least one of $R_4$ or $R_5$ represents an aryl group substituted with a fluorine atom or a fluorinated alkyl group.

[5] The actinic ray-sensitive or radiation-sensitive resin composition as described in any one of [1] to [4],
in which in General Formula (1) which will be described later, $R_4$ represents an aryl group substituted with a fluorine atom or a fluorinated alkyl group.

[6] The actinic ray-sensitive or radiation-sensitive resin composition as described in any one of [1] to [5],
in which the resin has a repeating unit represented by General Formula (2) which will be described later.

[7] The actinic ray-sensitive or radiation-sensitive resin composition as described in [6],
in which in General Formula (2) which will be described later, Ar represents a benzene ring group.

[8] The actinic ray-sensitive or radiation-sensitive resin composition as described in [6] or [7],
in which in General Formula (2) which will be described later, $L_1$ represents a single bond.

[9] The actinic ray-sensitive or radiation-sensitive resin composition as described in any one of [6] to [8], in which in General Formula (2) which will be described later, $L_2$ represents a single bond or a perfluoroalkylene group.

[10] The actinic ray-sensitive or radiation-sensitive resin composition as described in any one of [1] to [9], in which the resin further has a repeating unit having a fluorine atom and having no acid-decomposable group.

[11] A resist film formed with the actinic ray-sensitive or radiation-sensitive resin composition as described in any one of [1] to [10].

[12] A pattern forming method comprising:

a resist film forming step of forming a resist film with the actinic ray-sensitive or radiation-sensitive resin composition as described in any one of [1] to [10];

exposing the resist film; and developing the exposed resist film with a developer.

[13] A method for manufacturing an electronic device, the method comprising the pattern forming method as described in [12].

According to the present invention, it is possible to provide an actinic ray-sensitive or radiation-sensitive resin composition which can form a pattern having excellent LER performance and can also suppress pattern collapse.

In addition, according to the present invention, it is possible to provide a resist film, a pattern forming method, and a method for manufacturing an electronic device, each using the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV rays), X-rays, electron beams (EB), or the like. "Light" in the present specification means actinic rays or radiation.

"Exposure" in the present specification encompasses, unless otherwise specified, not only exposure by a bright line spectrum of a mercury lamp, far ultraviolet rays typified by an excimer laser, extreme ultraviolet rays, X-rays, EUV rays, or the like, but also writing by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, "(meth)acrylate" represents acrylate and methacrylate, and "(meth)acrylic acid" represents acrylic acid and methacrylic acid.

In the present specification, a weight-average molecular weight and a number-average molecular weight are defined as values in terms of polystyrene, as measured by means of gel permeation chromatography (GPC). In the present specification, the weight-average molecular weight (Mw) and the number-average molecular weight (Mn) can be determined, for example, by using HLC-8220GPC (manufactured by Tosoh Corporation) with TSKgel Super AWM-H (manufactured by Tosoh Corporation, 6.0 mm (inner diameter (ID))× 15.0 cm) as columns and a 10-mmol/L lithium bromide N-methylpyrrolidone (NMP) solution as an eluent.

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group except for a hydrogen atom, and the substituent can be selected from, for example, the following substituent group T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; an alkyl group; a cycloalkyl group; an aryl group; a heteroaryl group; a hydroxyl group; a carboxy group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

A bonding direction of a divalent group (for example, —COO—) cited in the present specification is not limited unless otherwise specified. For example, in a case where M in a compound represented by a general formula formed of "L-M-N" is —COO—, a position bonded to the L side and a position bonded to the N side are defined as *1 and *2, respectively, M may be either *1-O—CO-*2 or *1-CO—O-*2.

[Actinic Ray-Sensitive or Radiation-Sensitive Resin Composition]

The actinic ray-sensitive or radiation-sensitive resin composition of an embodiment of the present invention (hereinafter also simply referred to as a "composition") may include a resin having a group represented by General Formula (1) which will be described later.

The present inventors have found that in a case where many halogen atoms are included in the resin, the glass transition temperature (Tg) of the resin is lowered, which causes collapse of a pattern thus formed to easily occur.

In contrast, the present inventors have considered that since the group represented by General Formula (1) contained in the resin included in the composition of the embodiment of the present invention has a structure having low flexibility, it is possible to avoid pattern collapse in a case where halogen atoms are introduced into the resin.

In addition, by incorporating the halogen atoms into the resin, the EUV light absorption efficiency of a resist film (a coating film of the actinic ray-sensitive or radiation-sensitive resin composition) is improved. That is, the present inventors have considered that a resist film formed with the composition of the embodiment of the present invention has excellent sensitivity, and as a result, the LER performance of a pattern formed by exposure and development is excellent.

By the action mechanism, the composition of the embodiment of the present invention can form a pattern having excellent LER performance and can also suppress pattern collapse.

Hereinafter, the components included in the composition of the embodiment of the present invention will be described in detail. Furthermore, the composition of the embodiment of the present invention is a so-called resist composition, and may be either a positive-tone resist composition or a negative-tone resist composition. In addition, the composition of the embodiment of the present invention may be either a resist composition for alkali development or a resist composition for organic solvent development. Among those, the positive-tone resist composition which is the resist composition for alkali development is preferable.

The composition of the embodiment of the present invention is typically a chemically amplified resist composition.

<Resin (A)>

The composition of the embodiment of the present invention includes a resin whose polarity increases by the action of an acid (hereinafter also referred to as a "resin (A)").

Furthermore, in the composition of the embodiment of the present invention, the resin (A) has a group represented by General Formula (1). In addition, the group represented by General Formula (1) is a group whose polarity increases through decomposition by the action of an acid (hereinafter also referred to as an "acid-decomposable group").

(General Formula (1))

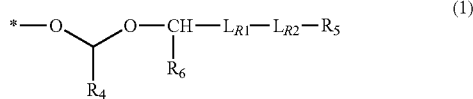

(1)

$R_4$ represents an alkyl group which may be substituted with a halogen atom, a cycloalkyl group which may be substituted with a halogen atom or a halogenated alkyl group, or an aryl group which may be substituted with a halogen atom or a halogenated alkyl group.

Furthermore, in the present specification, the halogenated alkyl group is intended to mean an alkyl group whose hydrogen atom is substituted with a halogen atom.

Among those, $R_4$ is preferably an aryl group which may be substituted with a halogen atom or a halogenated alkyl group.

The alkyl group which may be substituted with a halogen atom may be linear or branched, and is preferably branched. The number of carbon atoms is preferably 1 to 10, more preferably 1 to 6, and still more preferably 1 to 4. The alkyl group may or may not be substituted with a halogen atom. The number of halogen atoms in a case where the halogen atoms are contained as a substituent is preferably 1 to 20, more preferably 3 to 10, and still more preferably 3 to 5.

The cycloalkyl group in the cycloalkyl group which may be substituted with a halogen atom or a halogenated alkyl group may be either a monocycle or a polycycle, and is preferably the polycycle. The number of carbon atoms is preferably 3 to 20, more preferably 5 to 20, and still more preferably 7 to 15. The cycloalkyl group is preferably, for example, an adamantyl group.

The cycloalkyl group may or may not be substituted with a halogen atom or a halogenated alkyl group.

The number of halogen atoms in a case where the halogen atoms are contained as a substituent is preferably 1 to 40, more preferably 5 to 40, and still more preferably 10 to 30.

The number of halogenated alkyl groups in a case where the halogenated alkyl groups are contained as a substituent is preferably 1 to 10, more preferably 1 to 7, and still more preferably 1 to 5. The number of carbon atoms of the halogenated alkyl groups is each independently preferably 1 to 10, more preferably 1 to 5, and still more preferably 1. The number of halogen atoms contained in the halogenated alkyl group is each independently preferably 1 to 20, more preferably 3 to 10, and still more preferably 3. Among those, the halogenated alkyl group is preferably a perhalogenated alkyl group, and more preferably a trihalogenated methyl group.

The aryl group in the aryl group which may be substituted with a halogen atom or a halogenated alkyl group may be either a monocycle or a polycycle, and is preferably the monocycle. The number of carbon atoms is preferably 6 to 20, more preferably 6 to 15, and still more preferably 6 to 10.

The aryl group may or may not be substituted with a halogen atom or a halogenated alkyl group, and is preferably substituted with a halogen atom or a halogenated alkyl group.

The number of halogen atoms in a case where the halogen atoms are contained as a substituent is preferably 1 to 40, more preferably 3 to 20, and still more preferably 3 to 10.

The number of halogenated alkyl groups in a case where the halogenated alkyl groups are contained as a substituent is preferably 1 to 10, more preferably 1 to 7, and still more preferably 1 to 5. The number of carbon atoms of the halogenated alkyl groups is each independently preferably 1 to 10, more preferably 1 to 5, and still more preferably 1. The number of halogen atoms contained in the halogenated alkyl group is each independently preferably 1 to 20, more preferably 3 to 10, and still more preferably 3. Among those, the halogenated alkyl group is preferably a perhalogenated alkyl group, and more preferably a trihalogenated methyl group.

$R_5$ represents a hydrogen atom, a halogen atom, a cycloalkyl group which may be substituted with a halogen atom or a halogenated alkyl group, or an aryl group which may be substituted with a halogen atom or a halogenated alkyl group.

Among those, $R_5$ is preferably the hydrogen atom, the halogen atom, or the aryl group which may be substituted with a halogen atom or a halogenated alkyl group.

The cycloalkyl group in the cycloalkyl group which may be substituted with a halogen atom or a halogenated alkyl group may be either a monocycle or a polycycle. The number of carbon atoms is preferably 3 to 20, more preferably 5 to 20, and still more preferably 7 to 15.

The cycloalkyl group may or may not be substituted with a halogen atom or a halogenated alkyl group.

The number of halogen atoms in a case where the halogen atoms are contained as a substituent is preferably 1 to 40, more preferably 5 to 40, and still more preferably 10 to 30.

The number of halogenated alkyl groups in a case where the halogenated alkyl groups are contained as a substituent is preferably 1 to 10, more preferably 1 to 7, and still more preferably 1 to 5. The number of carbon atoms of the halogenated alkyl groups is each independently preferably 1 to 10, more preferably 1 to 5, and still more preferably 1. The number of halogen atoms contained in the halogenated alkyl group is each independently preferably 1 to 20, more preferably 3 to 10, and still more preferably 3. Among those, the halogenated alkyl group is preferably a perhalogenated alkyl group, and more preferably a trihalogenated methyl group.

The aryl group in the aryl group which may be substituted with a halogen atom or a halogenated alkyl group may be either a monocycle or a polycycle, and is preferably the monocycle. The number of carbon atoms is preferably 6 to 20, more preferably 6 to 15, and still more preferably 6 to 10.

The aryl group may or may not be substituted with a halogen atom or a halogenated alkyl group, and is preferably substituted with a halogenated alkyl group.

The number of halogen atoms in a case where the halogen atoms are contained as a substituent is preferably 1 to 40, more preferably 3 to 20, and still more preferably 3 to 10.

The number of halogenated alkyl groups in a case where the halogenated alkyl groups are contained as a substituent is preferably 1 to 10, more preferably 1 to 7, and still more preferably 1 to 5. The number of carbon atoms of the halogenated alkyl groups is each independently preferably 1 to 10, more preferably 1 to 5, and still more preferably 1. The number of halogen atoms contained in the halogenated alkyl group is each independently preferably 1 to 20, more preferably 3 to 10, and still more preferably 3. Among those, the halogenated alkyl group is preferably a perhalogenated alkyl group, and more preferably a trihalogenated methyl group.

$R_6$ represents a hydrogen atom, or a methyl group which may be substituted with a halogen atom.

$R_6$ is preferably the hydrogen atom or a trihalogenated methyl group, and more preferably the hydrogen atom.

$L_{R1}$ represents a single bond, or a methylene group which may be substituted with a halogen atom.

$L_{R1}$ is preferably a single bond, an unsubstituted methylene group, or a perhalogenated methylene group. In addition, the perhalogenated methylene group is a methylene group in which all hydrogen atoms are substituted with halogen atoms.

$L_{R2}$ represents a single bond, —CO—, —COO—, —NHCO—, —SO—, —SO$_2$—, —SO$_3$—, or —NHSO—.

$L_{R2}$ is preferably a single bond.

In General Formula (1), the group represented by —CH($R_6$)-$L_{R1}$-$L_{R2}$-$R_5$ is preferably a methyl group, an ethyl group, a 1,1,1-trihalogenated ethyl group, a 1,1,1,3,3,3-hexahalogenated isopropyl group, or a benzyl group having one or two trihalogenated methyl groups as a substituent, and more preferably the methyl group, the ethyl group, the 1,1,1-trihalogenated ethyl group, or the benzyl group having one or two trihalogenated methyl groups as a substituent.

In the group represented by General Formula (1), a total number of halogen atoms included in $R_4$, $R_5$, $R_6$, and $L_{R1}$ is 4 or more, preferably 4 to 30, more preferably 4 to 20, and still more preferably 5 to 15.

From the viewpoint that the pattern collapse is further suppressed, in the group represented by General Formula (1), the halogen atom which can be included in each of $R_4$, $R_5$, $R_6$, and $L_{R1}$ is preferably a fluorine atom, a chlorine atom, a bromine atom, or an iodine atom, more preferably the fluorine atom or the iodine atom, and still more preferably the fluorine atom.

Similarly, in General Formula (1), the halogenated alkyl group is also preferably a fluorinated alkyl group, a chlorinated alkyl group, a brominated alkyl group, or an iodinated alkyl group, more preferably the fluorinated alkyl group or the iodinated alkyl group, and still more preferably the fluorinated alkyl group.

That is, in the above-mentioned perhalogenated alkyl group, trihalogenated methyl group, perhalogenated methylene group, 1,1,1,3,3,3-hexahalogenated isopropyl group, and 1,1,1-trihalogenated ethyl group, and the like, the halogen atom contained in these groups is preferably a fluorine atom, a chlorine atom, a bromine atom, or an iodine atom, more preferably the fluorine atom or the iodine atom, and still more preferably the fluorine atom.

From the viewpoint that the pattern collapse is further suppressed, it is preferable that at least one of $R_4$ or $R_5$ is an aryl group which is substituted with a fluorine atom or a fluorinated alkyl group.

In addition, from the viewpoint that the LER performance of a pattern is more excellent, it is more preferable that $R_4$ is an aryl group which is substituted with a fluorine atom or a fluorinated alkyl group.

Moreover, one repeating unit in the resin (A) may have two or more groups represented by General Formula (1), and in this case, the groups represented by General Formula (1) may be the same as or different from each other and are preferably the same as each other.

(General Formula (1'))

Examples of the repeating unit having the group represented by General Formula (1) include a repeating unit represented by General Formula (1').

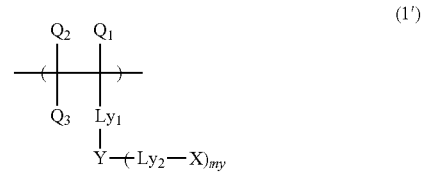

(1')

my represents an integer of 1 or more, and my is preferably 1 to 4, more preferably 1 to 3, and still more preferably 1 or 2. In a case where my is an integer of 2 or more, (-Ly$_2$-X)'s which are present in plural number may be the same as or different from each other.

$Q_1$ to $Q_3$ each independently represent a hydrogen atom, a halogen atom, an alkyl group, a cycloalkyl group, a cyano group, an alkoxycarbonyl group, or a phenyl group.

$Q_1$ is preferably the hydrogen atom or the alkyl group, and more preferably the hydrogen atom or the methyl group.

$Q_2$ is preferably the hydrogen atom or the phenyl group, and more preferably the hydrogen atom.

$Q_3$ is preferably the hydrogen atom.

Y represents a single bond or a (my+1)-valent linking group. It should be noted that Y is the single bond only in a case of my=1.

Examples of the (my+1)-valent linking group include an aromatic ring group. In addition, the aromatic ring group is not limited as long as it is a group formed by removing a hydrogen atom from a compound having an aromatic ring.

The aromatic ring group may be either a monocycle or a polycycle, and may or may not have a heteroatom.

Examples of the aromatic ring group include an aromatic hydrocarbon ring group having 6 to 18 carbon atoms, such as a benzene ring group, a naphthalene ring group, and an anthracene ring group, and a hetero-aromatic ring group such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group.

Among those, as Y, the single bond or the aromatic ring group is preferable, the aromatic hydrocarbon ring group is more preferable, the benzene ring group or the naphthalene ring group is still more preferable, and the benzene ring group is even still more preferable.

Furthermore, the aromatic ring group may have a substituent, and as the substituent, a halogen atom is preferable, and a fluorine atom is more preferable. For example, in a case where my is 1, it is also preferable that Y is the tetrafluorophenylene group.

$Q_3$ and Y may be bonded to each other to form a ring. In this case, Y represents an (my+2)-valent linking group.

$Ly_1$ and $Ly_2$ each independently represent a single bond or a divalent linking group.

Examples of the divalent linking group include an ether group (—O—), a carbonyl group (—CO—), an ester group (—COO—), a thioether group (—S—), —$SO_2$—, —NR— (R represents a hydrogen atom or an alkyl group), an alkylene group, an alkenylene group (for example, —CH=CH—), an alkynylene group (for example, —C≡C—), and an arylene group, or a group formed by combination thereof.

Furthermore, the alkylene group may be linear or branched, and may have a cyclic structure.

In addition, the alkylene group may have a substituent, and as the substituent, a halogen atom is preferable, a fluorine atom or an iodine atom is more preferable, and the fluorine atom is still more preferable.

In a case where my represents 1, examples of -$Ly_1$-Y-$Ly_2$- include -phenylene group-, -phenylene group-alkylene group (preferably a perfluoroalkylene group having 1 to 3 carbon atoms, more preferably —C(CF$_3$)$_2$—)—, -tetrafluorophenylene group-, -naphthalenediyl group-, -ester group-phenylene group-, -carbonyl group-, and -phenylene group-carbonyl group-.

In a case where my represents 2, examples of -$Ly_1$-Y(-$Ly_2$-)$_2$ include a benzenetriyl group.

X represents the group represented by General Formula (1), and a preferred range thereof is also the same as described above.

(General Formula (2))

Among those, from the viewpoint that the pattern collapse is further suppressed, the repeating unit having the group represented by General Formula (1) is preferably a repeating unit represented by General Formula (2).

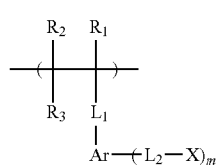

(2)

m represents an integer of 1 or more, and m is preferably 1 to 4, more preferably 1 to 3, and still more preferably 1 or 2.

In a case where m is an integer of 2 or more, (-$L_2$-X)'s which are present in plural number may be the same as or different from each other.

$R_1$ to $R_3$ each independently represent a hydrogen atom, a halogen atom, an alkyl group, a cycloalkyl group, a cyano group, or an alkoxycarbonyl group.

$R_1$ is preferably the hydrogen atom or the alkyl group, and more preferably the hydrogen atom or the methyl group.

$R_2$ and $R_3$ are each preferably the hydrogen atom.

Ar represents an aromatic ring group.

The aromatic ring group may be either a monocycle or a polycycle, and may or may not have a heteroatom.

Examples of the aromatic ring group include an aromatic hydrocarbon ring group having 6 to 18 carbon atoms, such as a benzene ring group, a naphthalene ring group, and an anthracene ring group, and a hetero-aromatic ring group such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group.

Among those, from the viewpoint that the LER performance of a pattern is more excellent, as Ar, the aromatic hydrocarbon ring group is preferable, the benzene ring group or the naphthalene ring group is more preferable, and the benzene ring group is still more preferable.

Furthermore, the aromatic ring group may have a substituent, and as the substituent, a halogen atom is preferable, and a fluorine atom is more preferable. For example, in a case where m is 1, Ar is also preferably a tetrafluorophenylene group.

$R_3$ and Ar may be bonded to each other to form a ring. In this case, Ar represents an (my+2)-valent aromatic ring group.

$L_1$ and $L_2$ each independently represent a single bond or a divalent linking group.

Examples of the divalent linking group include an ether group (—O—), a carbonyl group (—CO—), an ester group (—COO—), a thioether group (—S—), —$SO_2$—, —NR— (R represents a hydrogen atom or an alkyl group), an alkylene group, an alkenylene group (for example, —CH=CH—), an alkynylene group (for example, —C≡C—), and an arylene group, or a group formed by combination thereof.

Furthermore, the alkylene group may be linear or branched, and may have a cyclic structure.

In addition, the alkylene group may have a substituent, and as the substituent, a halogen atom is preferable, a fluorine atom or an iodine atom is more preferable, and the fluorine atom is still more preferable.

From the viewpoint that the LER performance of a pattern is more excellent and the pattern collapse is also further suppressed, $L_1$ is preferably the single bond or the ester group, and more preferably the single bond.

From the viewpoint that the LER performance of a pattern is more excellent and the pattern collapse is also further suppressed, $L_2$ is preferably the single bond, the carbonyl group, or the alkylene group, more preferably the single bond or the alkylene group, and still more preferably the single bond or the perfluoroalkylene group. Among those, the perfluoroalkylene group is preferably a perfluoroalkylene group having 1 to 3 carbon atoms, and more preferably —C(CF$_3$)$_2$—.

X represents the group represented by General Formula (1) and a preferred range thereof is also the same as described above.

The repeating unit having the group represented by General Formula (1) may be used singly or in combination of two or more kinds thereof.

The content of the repeating unit having the group represented by General Formula (1) (preferably the repeating unit represented by General Formula (2)) (a total content in a case where two or more kinds of the repeating units are present) is preferably 10% to 70% by mass, more preferably 10% to 60% by mass, and still more preferably 20% to 50% by mass, with respect to the total mass of the resin (A).

(Repeating Unit Having Fluorine Atom and Having No Acid-Decomposable Group)

From the viewpoint that the LER performance of a pattern is more excellent, it is preferable that the resin (A) further has a repeating unit having a fluorine atom and having no acid-decomposable group.

The repeating unit is not particularly limited as long as it has a fluorine atom and has no acid-decomposable group, and may be, for example, a repeating unit having a fluorine atom and having a lactone structure, a repeating unit having a fluorine atom and having a phenolic hydroxyl group, or a repeating unit having a fluorine atom and having an acid group.

Hereinafter, the repeating unit having a fluorine atom and having no acid-decomposable group will be described.

Repeating Unit Having Fluorine Atom and Having Lactone Structure

Examples of the repeating unit having a fluorine atom and having a lactone structure include a repeating unit represented by General Formula (AI).

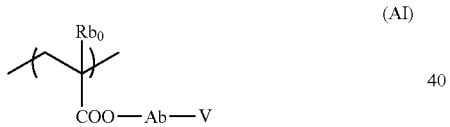

(AI)

In General Formula (AI), $Rb_0$ represents a hydrogen atom, a halogen atom, or an alkyl group having 1 to 4 carbon atoms.

The alkyl group of $Rb_0$ may have a substituent. Among those, $Rb_0$ is preferably a hydrogen atom or a methyl group.

In General Formula (AI), Ab represents a single bond, an alkylene group, a divalent linking group having a monocyclic or polycyclic alicyclic hydrocarbon structure, an ether group, an ester group, a carbonyl group, a carboxy group, or a divalent group formed by combination thereof. Among those, the single bond or a linking group represented by -$Ab_1$-COO— is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

V represents a group having a lactone structure with a substituent ($Rb_2$) having a fluorine atom, and is preferably a group formed by removing one hydrogen atom from a structure represented by any one of General Formula (LC1-1), . . . , or (LC1-17).

Among the lactone structures represented by General Formulae (LC1-1) to (LC1-17), the structure represented by General Formula (LC1-1), General Formula (LC1-4), General Formula (LC1-5), General Formula (LC1-6), General Formula (LC1-13), or General Formula (LC1-14) is more preferable.

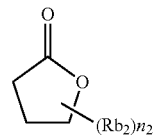

LC1-1

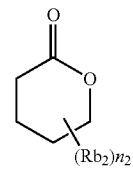

LC1-2

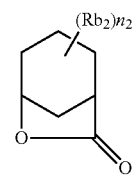

LC1-3

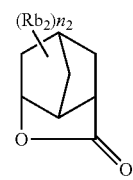

LC1-4

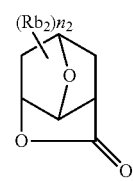

LC1-5

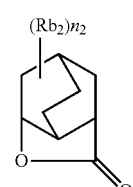

LC1-6

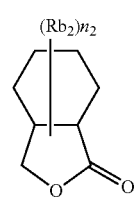

LC1-7

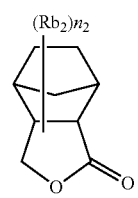

LC1-8

-continued

LC1-9 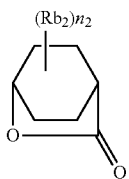

LC1-10 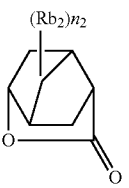

LC1-11 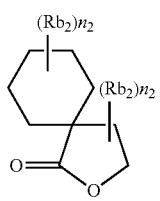

LC1-12 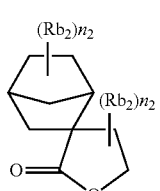

LC1-13 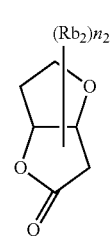

LC1-14 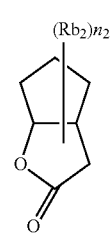

LC1-15 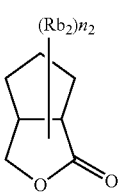

LC1-16 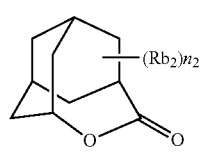

-continued

LC1-17 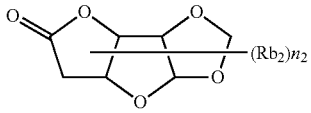

The lactone structure has a substituent ($Rb_2$) having a fluorine atom. Examples of the substituent ($Rb_2$) include a fluorinated alkyl group having 1 to 8 carbon atoms, a fluorinated cycloalkyl group having 4 to 7 carbon atoms, a fluorinated alkoxy group having 1 to 8 carbon atoms, and a fluorinated alkoxycarbonyl group having 2 to 8 carbon atoms.

Furthermore, in the present specification, the fluorinated cycloalkyl group refers to a cycloalkyl group in which one or more hydrogen atoms are substituted with fluorine atoms, the fluorinated alkoxy group refers to an alkoxy group in which one or more hydrogen atoms are substituted with fluorine atoms, and the fluorinated alkoxycarbonyl group refers to an alkoxycarbonyl group in which one or more hydrogen atoms are substituted with fluorine atoms.

Among those, the fluorinated alkoxycarbonyl group having 2 to 8 carbon atoms is preferable, a branched fluorinated alkoxycarbonyl group having 4 carbon atoms is more preferable, and a group represented by —COO—CH($CF_3$)$_2$ is still more preferable.

$n_2$ represents an integer of 1 to 4. In a case where $n_2$ is 2 or more, the substituents ($Rb_2$) which are present in plural number may be the same as or different from each. In addition, the substituents ($Rb_2$) which are present in plural number may be bonded to each other to form a ring.

Repeating Unit Having Fluorine Atom and Phenolic Hydroxyl Group

Examples of the repeating unit having a fluorine atom and a phenolic hydroxyl group include a repeating unit represented by General Formula (I).

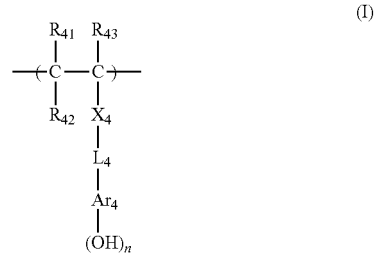

(I)

n represents an integer of 1 to 5.

$R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, is preferable, an alkyl group having 8 or less carbon atoms is more preferable, and an alkyl group having 3 or less carbon atoms is still more preferable.

The cycloalkyl group represented by each of $R_{41}$, $R_{42}$, and $R_{43}$ in General Formula (I) may be either a monocycle or a polycycle, and is preferably a monocyclic cycloalkyl group having 3 to 8 carbon atoms, such as a cyclopropyl group, a cyclopentyl group, and a cyclohexyl group.

As the halogen atom represented by each of $R_{41}$, $R_{42}$, and $R_{43}$ in General Formula (I), a fluorine atom is preferable.

As the alkyl group included in the alkoxycarbonyl group represented by each of $R_{41}$, $R_{42}$, and $R_{43}$ in General Formula (I), the same ones as the alkyl group in each of $R_{41}$, $R_{42}$, and $R_{43}$ are preferable.

$X_4$ represents a single bond, —COO—, or —$CONR_{64}$—, and $R_{64}$ represents a hydrogen atom or an alkyl group.

As $X_4$, the single bond, —COO—, or —CONH— is preferable, and the single bond or —COO— is more preferable.

For the purpose of increasing the polarity of the repeating unit represented by General Formula (I), it is preferable that n is an integer of 2 or more, or $X_4$ is —COO— or —$CONR_{64}$—.

As the alkyl group of $R_{64}$ in —$CONR_{64}$—, an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, and an alkyl group having 8 or less carbon atoms is more preferable.

$L_4$ represents a single bond or a divalent linking group.

As the divalent linking group as $L_4$, an alkylene group is preferable, and an alkylene group having 1 to 8 carbon atoms, such as a methylene group, an ethylene group, a propylene group, a butylene group, a hexylene group, and an octylene group, is more preferable.

$Ar_4$ represents an (n+1)-valent fluorinated aromatic hydrocarbon ring group and may be bonded to $R_{42}$ to form a ring, and in this case, $Ar_4$ represents an (n+2)-valent fluorinated aromatic hydrocarbon ring group.

Furthermore, in the present specification, the fluorinated aromatic hydrocarbon ring group refers to an aromatic hydrocarbon ring group in which one or more hydrogen atoms are substituted with fluorine atoms.

As the divalent fluorinated aromatic hydrocarbon ring group in a case where n is 1, a fluorinated arylene group having 6 to 18 carbon atoms, such as a fluorinated phenylene group, a fluorinated tolylene group, a fluorinated naphthylene group, and a fluorinated anthracenylene ring group, is preferable. Among those fluorinated phenylene groups, the tetrafluorophenylene group is more preferable.

Repeating Unit Having Fluorine Atom and Acid Group

The resin (A) may include a repeating unit having a fluorine atom and an acid group, in addition to the repeating unit having a fluorine atom and a phenolic hydroxyl group, represented by General Formula (I).

Examples of the acid group included in this repeating unit include a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

The repeating unit having a fluorine atom and an acid group preferably has an acid group having a fluorine atom, more preferably has a fluorinated alcohol group, and still more preferably has a hexafluoroisopropanol group.

The skeleton of the repeating unit is not particularly limited, but the repeating unit is preferably a (meth)acrylate-based repeating unit or a styrene-based repeating unit.

Specific examples of the repeating unit having a fluorine atom and an acid group are set forth below, but the present invention is not particularly limited to these specific examples. In the formulae, Rx represents a hydrogen atom, $CH_3$, $CF_3$, or $CH_2OH$.

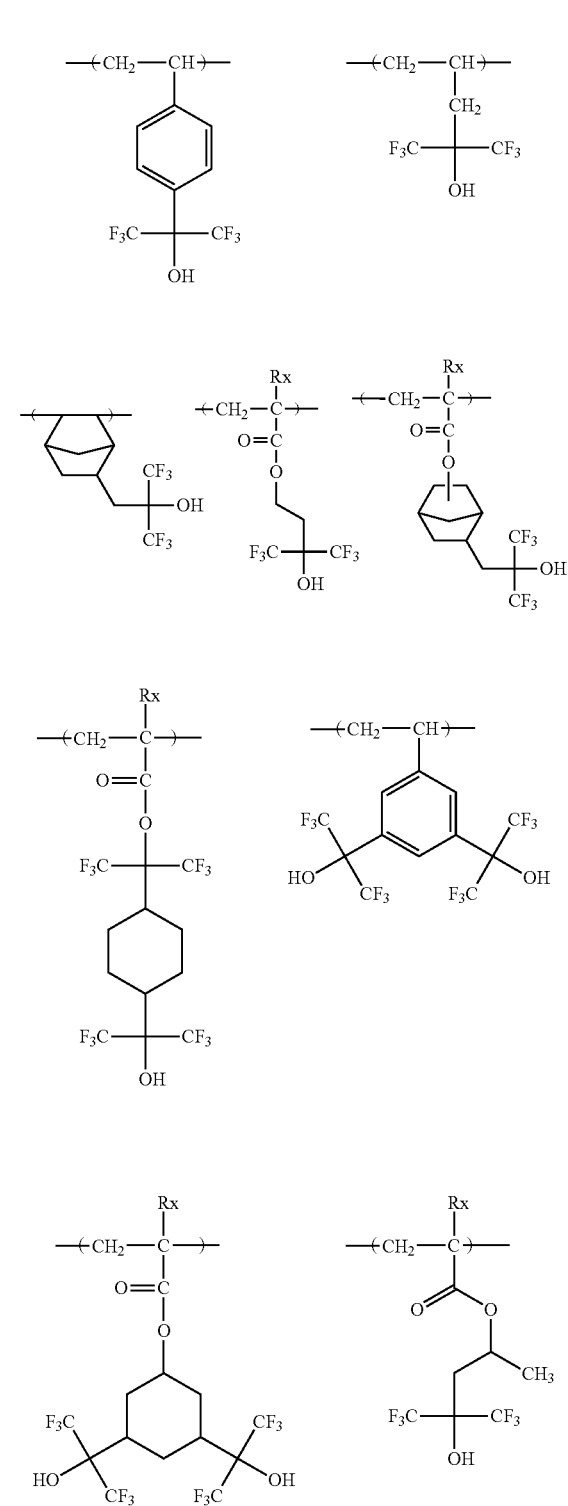

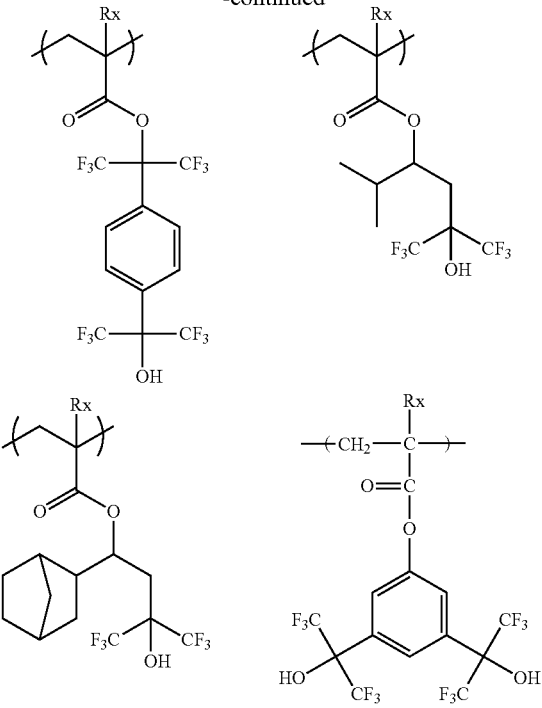

Other Repeating Units

The resin (A) may have a repeating unit having a fluorine atom and having no acid-decomposable group, which does not correspond to the above repeating units, and examples of the repeating unit include repeating units having a fluorinated alkyl group, a fluorinated cycloalkyl group, and/or a fluorinated aryl group. The fluorine atom may be included in the main chain or a side chain of the repeating unit.

Examples of such a repeating unit include repeating units as follows. In the formulae, Rx represents a hydrogen atom, $CH_3$, $CF_3$, or $CH_2OH$.

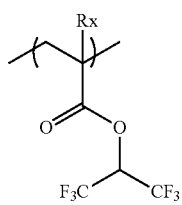

The repeating unit having a fluorine atom and having no acid-decomposable group may be used singly or in combination of two or more kinds thereof.

In a case where the resin (A) has a repeating unit having a fluorine atom and having no acid-decomposable group, the content of the repeating unit having a fluorine atom and having no acid-decomposable group (a total content in a case where two or more kinds of the repeating units are present) is preferably 5% to 80% by mass, more preferably 10% to 70% by mass, and still more preferably 20% to 70% by mass, with respect to the total mass of the resin (A).

(Repeating Unit Having Acid-Decomposable Group Other than Group Represented by General Formula (1))

From the viewpoint of taking a balance in the performance of a pattern, the resin (A) may further have a repeating unit having an acid-decomposable group other than the group represented by General Formula (1).

Such an acid-decomposable group preferably has a structure in which a polar group is protected with a group that decomposes by the action of an acid to leave (leaving group).

Examples of the polar group include an acidic group (a group that dissociates in a 2.38%-by-mass aqueous tetramethylammonium hydroxide solution) such as a carboxy group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Furthermore, the alcoholic hydroxyl group refers to a hydroxyl group bonded to a hydrocarbon group, which is a hydroxyl group other than a hydroxyl group directly bonded to an aromatic ring (phenolic hydroxyl group), from which an aliphatic alcohol having the ca-position substituted with an electron withdrawing group such as a fluorine atom (for example, a hexafluoroisopropanol group) is excluded as a hydroxyl group. The alcoholic hydroxyl group is preferably a hydroxyl group having an acid dissociation constant (pKa) from 12 to 20.

As the polar group, a carboxy group, a phenolic hydroxyl group, a fluorinated alcohol group (preferably a hexafluoroisopropanol group), or a sulfonic acid group is preferable.

A group which is preferable as the acid-decomposable group is a group in which a hydrogen atom of such the group is substituted with a group that leaves by the action of an acid (leaving group).

Above all, it is preferable that the leaving group is bonded by substituting the hydrogen atom of a carboxy group contained in a repeating unit having (meth)acrylate as the main chain or the hydrogen atom of a phenolic hydroxyl group contained in a repeating unit having hydroxystyrene as the main chain.

Examples of the leaving group include $-C(R_{36})(R_{37})(R_{38})$, $-C(=O)OC(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently an alkyl group, a cycloalkyl group, an aryl group, an aralkyl group, or an alkenyl group. $R_{36}$ and $R_{37}$ may be bonded to each other to form a ring. $R_{36}$ and $R_{39}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The group represented by each of $R_{36}$ to $R_{39}$, $R_{01}$, and $R_{02}$ may have a substituent, as allowed.

It should be noted that there is no case where a group formed by the bonding between the leaving group and the polar group corresponds to the above-mentioned group represented by General Formula (1), as described above.

As the repeating unit having an acid-decomposable group other than the group represented by General Formula (1), a repeating unit represented by General Formula (AI) is preferable.

General Formula (AI)

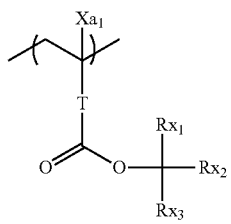

In General Formula (AI), $Xa_1$ represents a hydrogen atom, a halogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bond to each other to form a (monocyclic or polycyclic) cycloalkyl group.

Examples of the alkyl group which may have a substituent represented by $Xa_1$ include a methyl group or a group represented by $—CH_2—R_{11}$. $R_{11}$ represents a halogen atom (a fluorine atom or the like), a hydroxyl group, or a monovalent organic group, for example, an alkyl group having 5 or less carbon atoms and an acyl group having 5 or less carbon atoms; the alkyl group having 3 or less carbon atoms is preferable; and the methyl group is more preferable.

Examples of the halogen atom represented by $Xa_1$ include a fluorine atom, a chlorine atom, a bromine atom, and an iodine atom, and the fluorine atom or the iodine atom is preferable.

As $Xa_1$, a hydrogen atom, a fluorine atom, an iodine atom, a methyl group, a trifluoromethyl group, or a hydroxymethyl group is preferable.

Examples of the divalent linking group represented by T include an alkylene group, an arylene group, a —COO-Rt- group, and a —O-Rt- group. In the formulae, Rt represents an alkylene group or a cycloalkylene group.

T is preferably a single bond or a —COO-Rt- group. In a case where T represents a —COO-Rt-group, Rt is preferably an alkylene group having 1 to 5 carbon atoms, and more preferably a $—CH_2—$ group, a $—(CH_2)_2—$ group, or a $—(CH_2)_3—$ group.

As the alkyl group represented by each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group represented by each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxy group, and an alkoxycarbonyl group (having 2 to 6 carbon atoms). The number of carbon atoms in the substituent is preferably 8 or less.

As the repeating unit having an acid-decomposable group other than the group represented by General Formula (1), a repeating unit represented by General Formula (3) is also preferable.

General Formula (3)

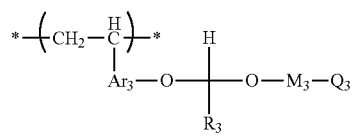

In General Formula (3), $Ar_3$ represents an aromatic ring group.

The aromatic ring group represented by $Ar_3$ is the same as Ar in a case where m is 1 in General Formula (2) as described above, and is preferably a phenylene group or a naphthylene group, and more preferably the phenylene group.

$R_3$ represents a hydrogen atom, an alkyl group, a cycloalkyl group, an aryl group, an aralkyl group, an alkoxy group, an acyl group, or a heterocyclic group.

$R_3$ is preferably a linear or branched alkyl group having 1 to 4 carbon atoms (more preferably a tert-butyl group).

$M_3$ represents a single bond or a divalent linking group. $M_3$ is preferably a single bond.

$Q_3$ represents an alkyl group, a cycloalkyl group, an aryl group, or a heterocyclic group.

$Q_3$ is preferably an alkyl group having 1 or 2 carbon atoms (more preferably a methyl group).

At least two of $Q_3$, $M_3$, or $R_3$ may be bonded to each other to form a ring.

Each of the groups may have a substituent, as allowed.

It should be noted that there is no case where the repeating unit represented by General Formula (3) has the above-mentioned group represented by General Formula (1), as described above.

Examples of the repeating unit having an acid-decomposable group other than the group represented by General Formula (1) are set forth below.

In the examples, Rx represents a hydrogen atom, a fluorine atom, an iodine atom, $CH_3$, $CF_3$, or $CH_2OH$. Rxa and Rxb each represent an alkyl group having 1 to 4 carbon atoms. Z represents a substituent including a polar group, and in a case where Z's are present in plural number, Z's are each independent. p represents 0 or a positive integer. Examples of the substituent including a polar group represented by Z include a linear or branched alkyl group or alicyclic group, which has a hydroxyl group, a cyano group, an amino group, an alkylamido group, or a sulfonamido group, and an alkyl group having a hydroxyl group is preferable. As the branched alkyl group, an isopropyl group is preferable.
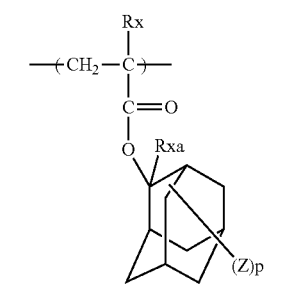
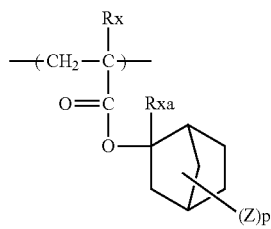
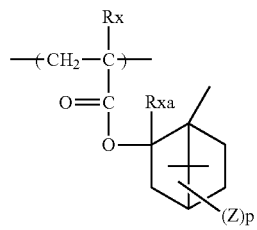
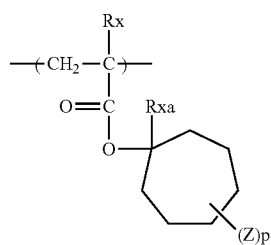
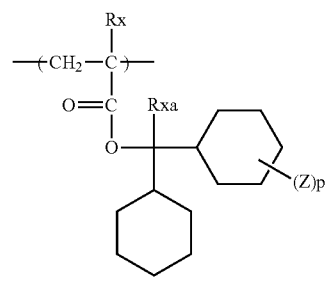
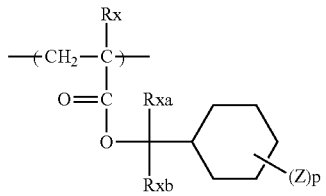
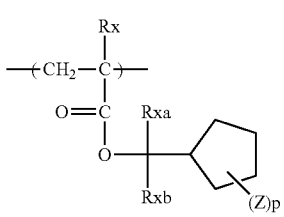

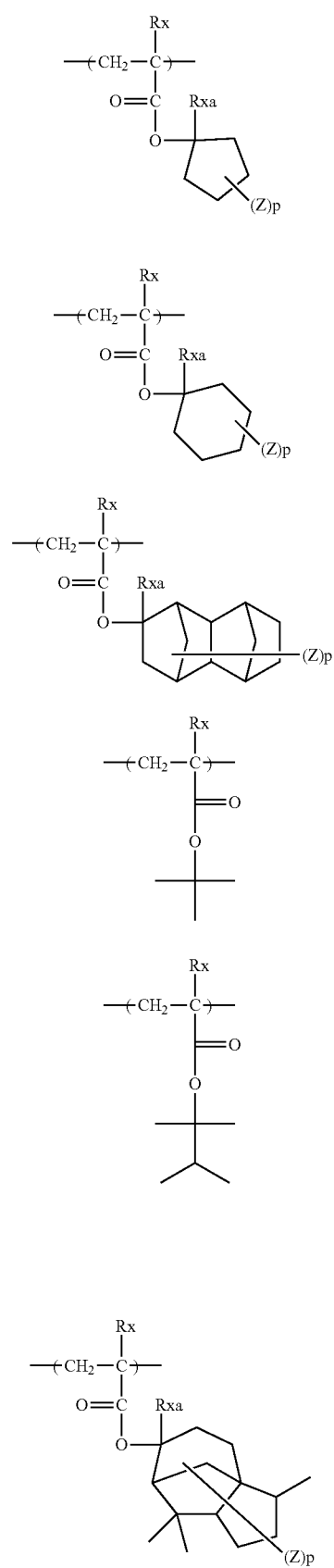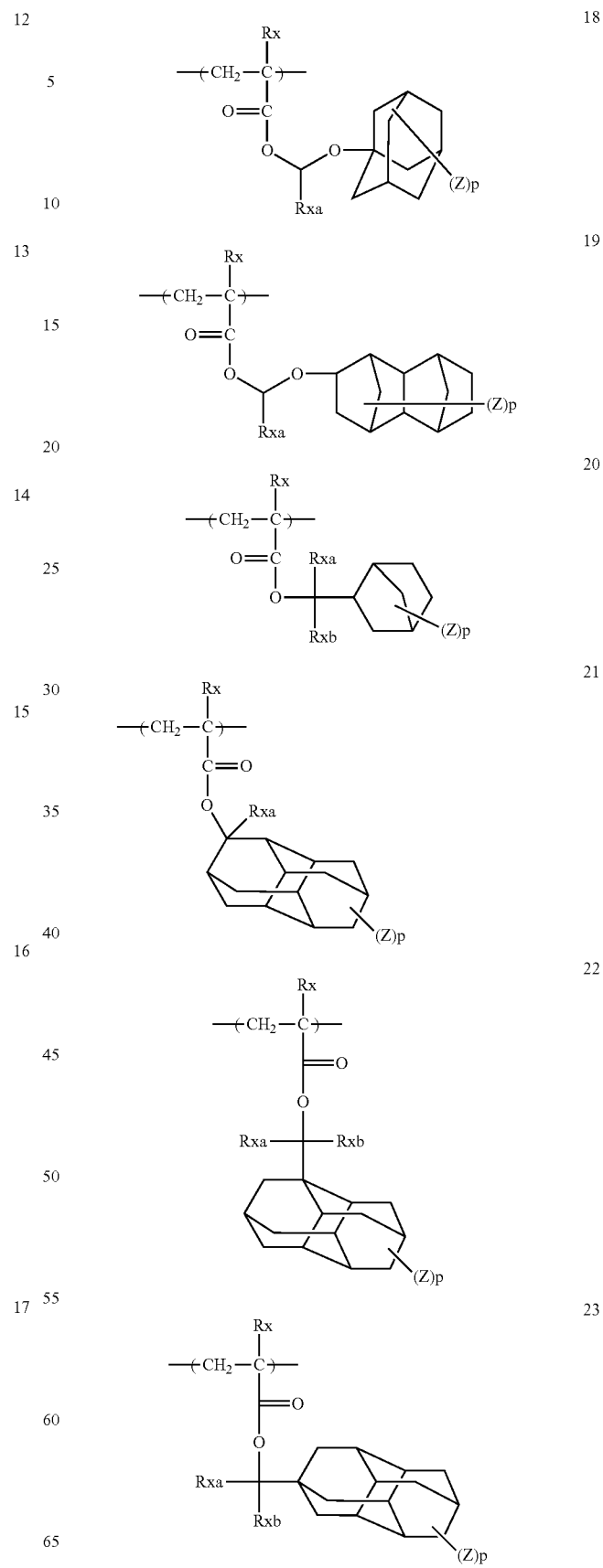

24
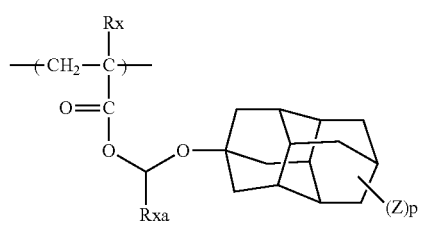
25
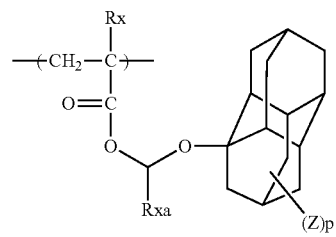
26
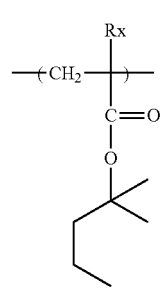
27
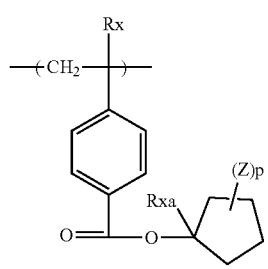
(VI-1)
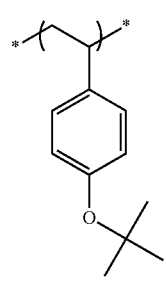
(VI-2)
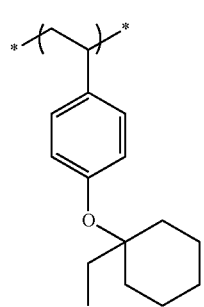
(VI-3)
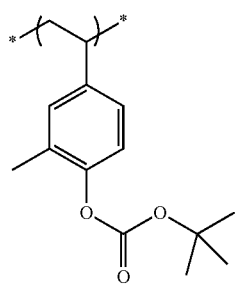
(VI-4)
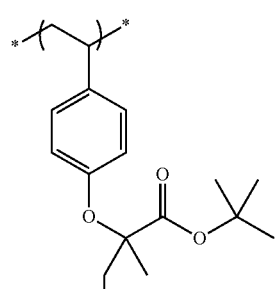
(VI-5)
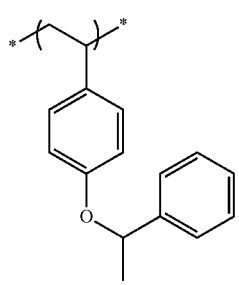
(VI-6)
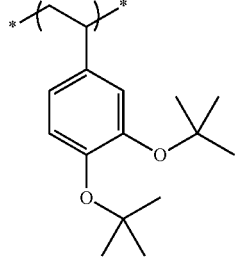
(VI-7)
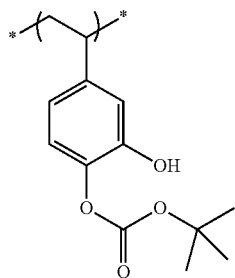

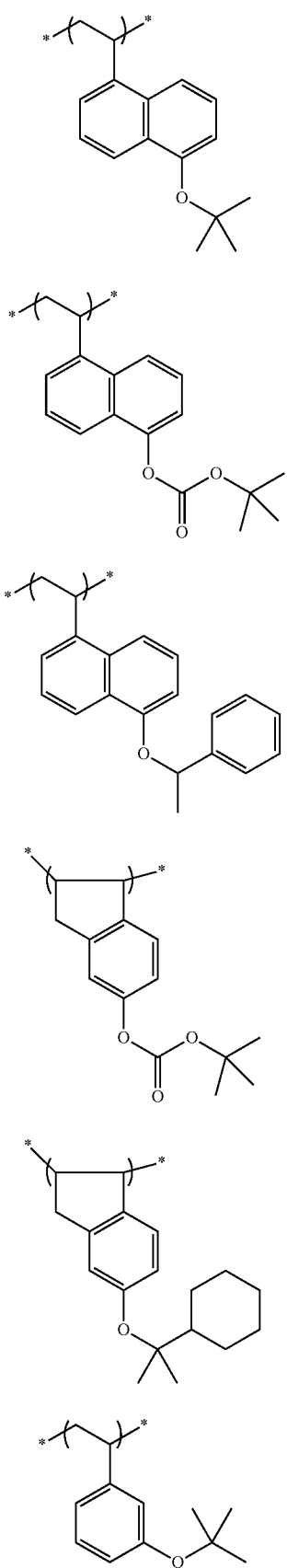
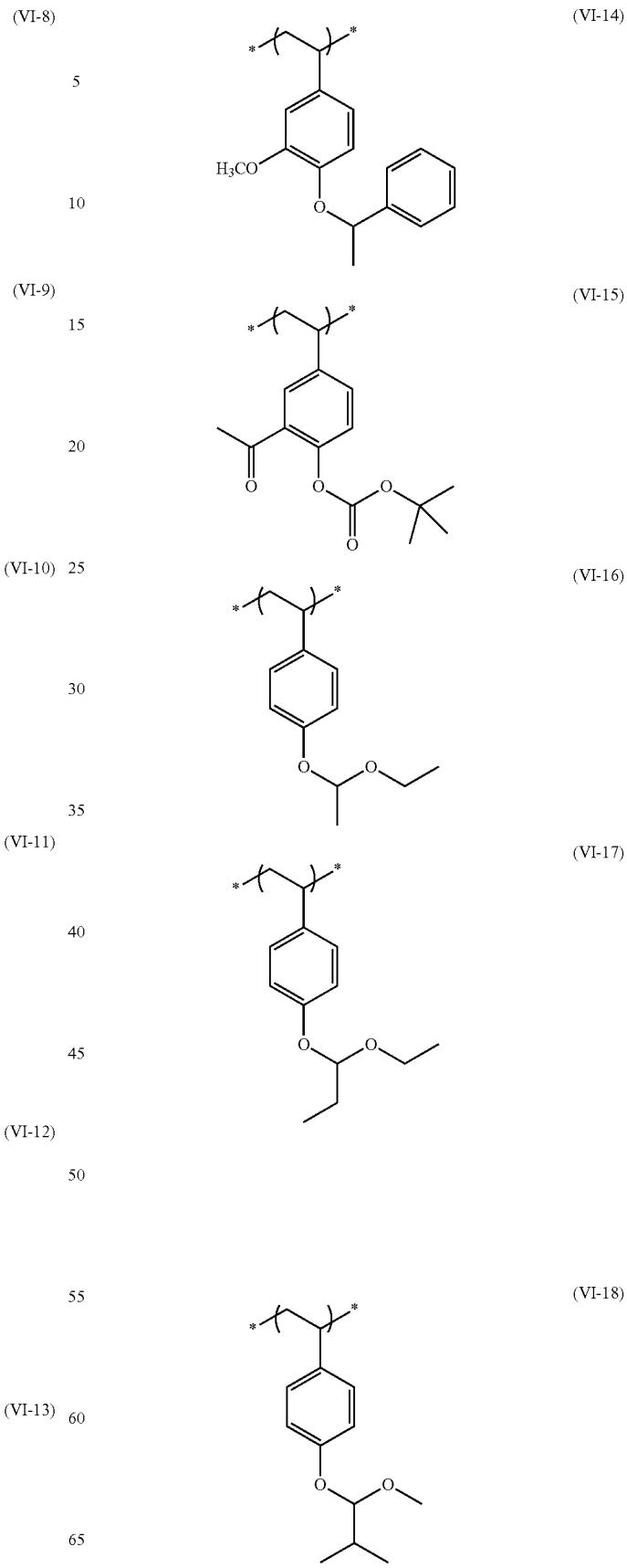

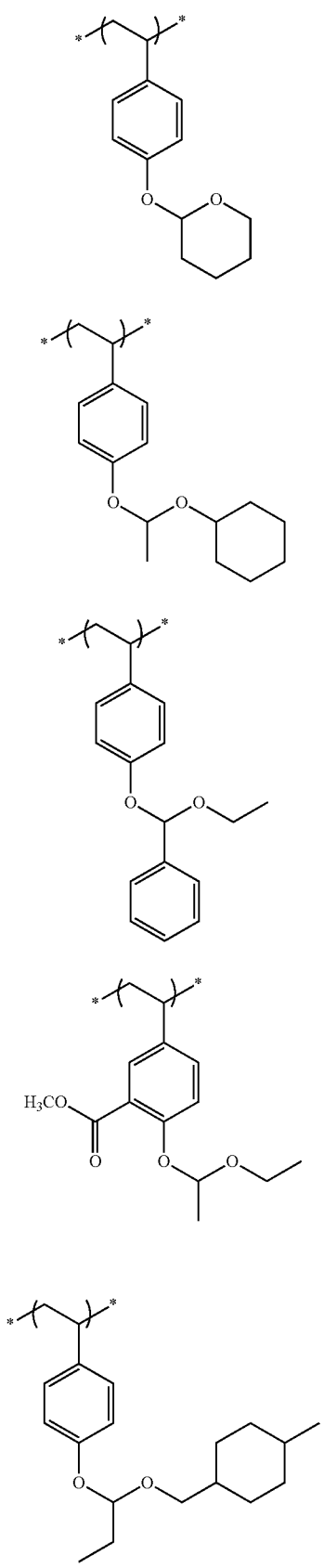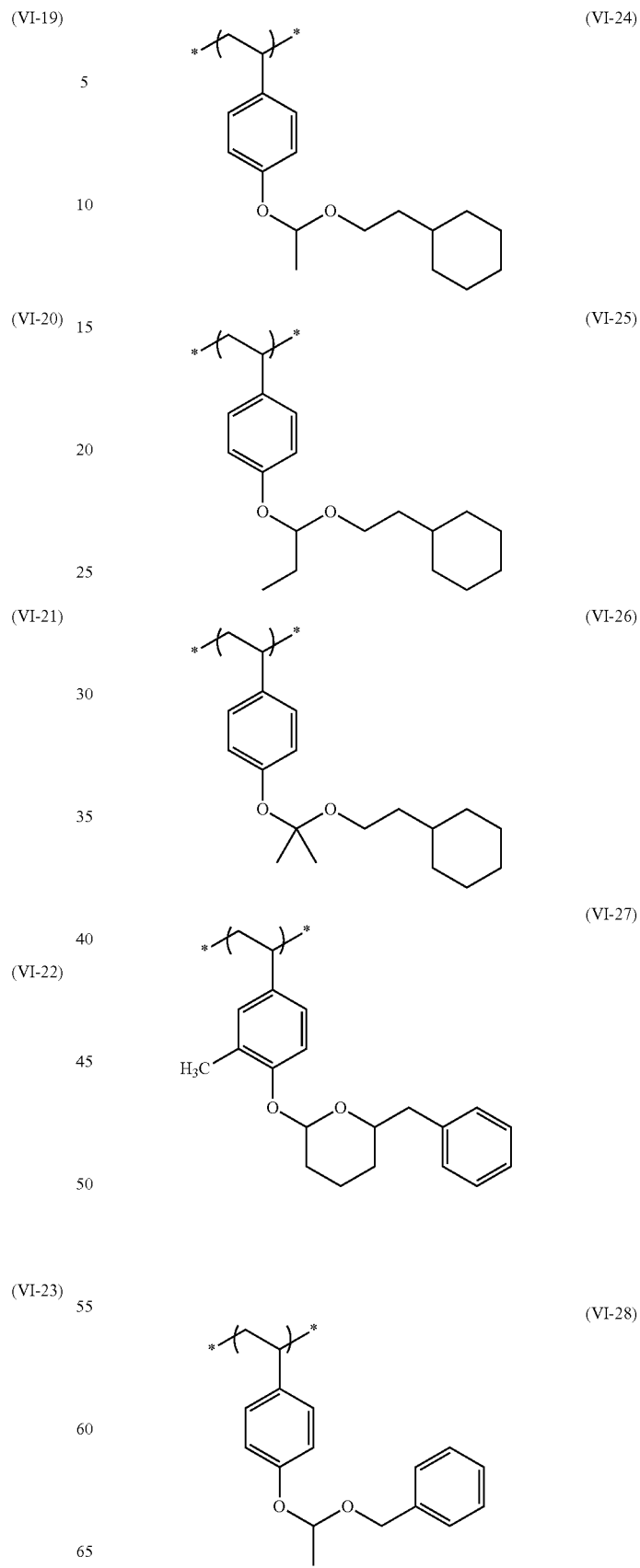

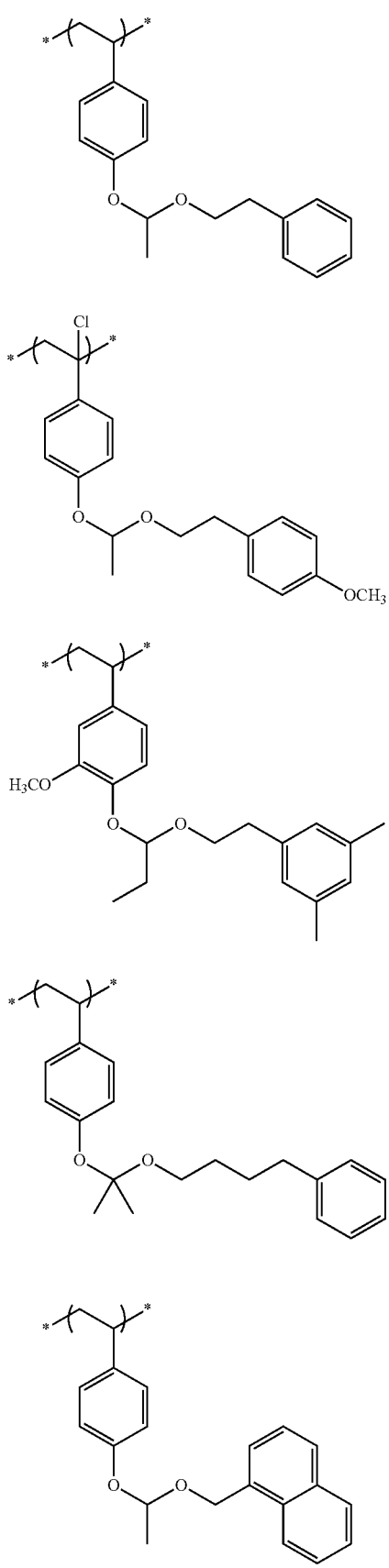
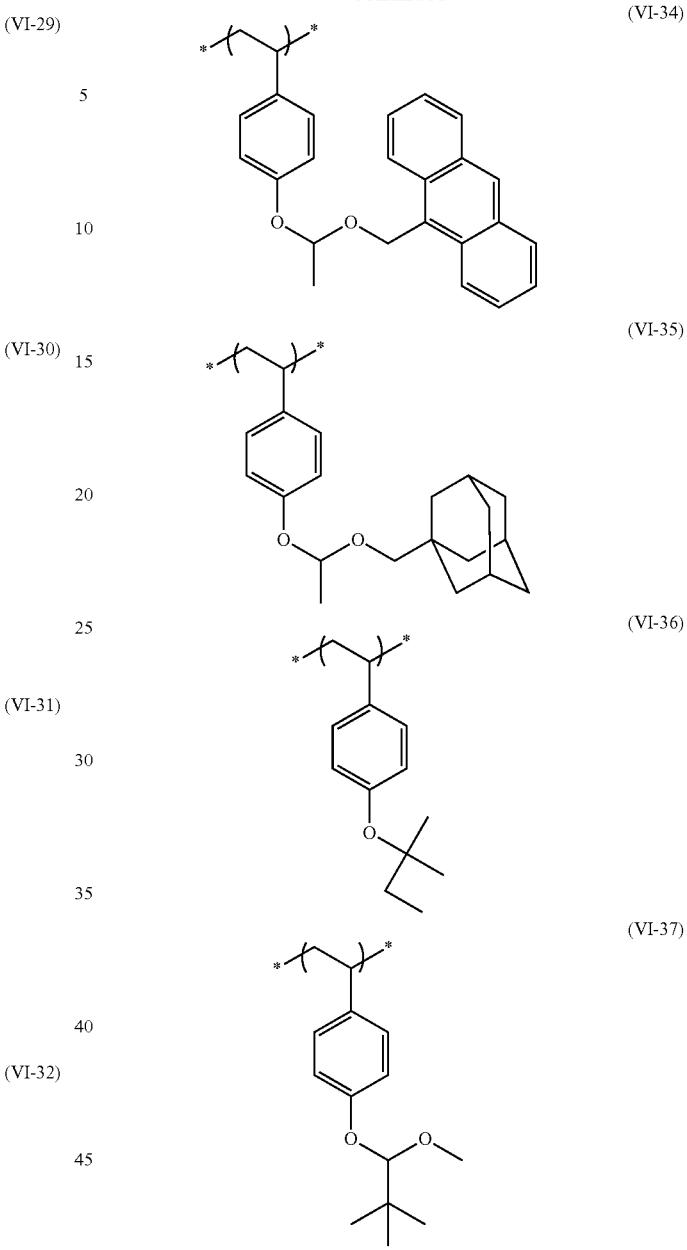

The repeating unit having an acid-decomposable group other than the group represented by General Formula (1) may be used singly or in combination of two or more kinds thereof.

In a case where the resin (A) has the repeating unit having an acid-decomposable group other than the group represented by General Formula (1), the content of the repeating unit having an acid-decomposable group other than the group represented by General Formula (1) (a total content in a case where two or more kinds of the repeating units are present) is, for example, preferably 5% to 40% by mass, more preferably 5% to 30% by mass, and still more preferably 5% to 20% by mass.

(Other Repeating Units Having No Fluorine Atom)

From the viewpoint of taking a balance in the performance of a pattern, the resin (A) may have other repeating units having no fluorine atom other than the above-mentioned repeating units. Hereinafter, examples of such other repeating units having no fluorine atom will be described.

Repeating Unit Having No Fluorine Atom and Having Lactone Structure

Examples of such other repeating units having no fluorine atom include a repeating unit having no fluorine atom and having a lactone structure.

Examples of such a repeating unit include the repeating units in which the substituent (Rb$_2$) contained in the lactone structure moiety is a substituent having no fluorine atom in General Formula (AI). In this case, as the substituent (Rb$_2$), an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxy group, a halogen atom (excluding a fluorine atom), a hydroxyl group, or a cyano group is preferable. In addition, the substituent (Rb$_2$) may not be contained. That is, n$_2$ in this case represents an integer of 0 to 4.

Furthermore, in this case, groups other than the substituent (Rb$_2$) do not have a fluorine atom. The other suitable conditions are the same as described above.

Examples of the repeating unit having no fluorine atom and having a lactone structure are set forth below. In the formulae, Rx represents a hydrogen atom, —CH$_3$ group, —CH$_2$CH$_3$ group, or —CF$_3$ group.

(in the formulae, Rx represents CH$_3$, CH$_2$OH or CF$_3$)

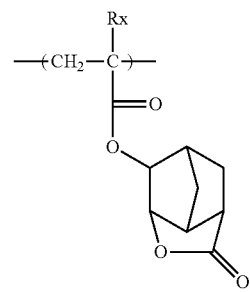
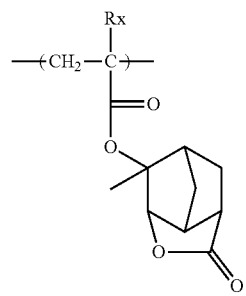
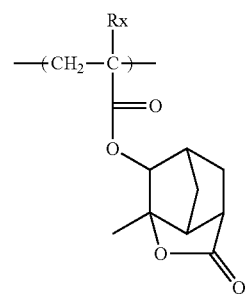
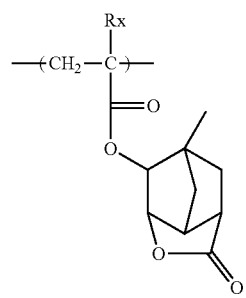
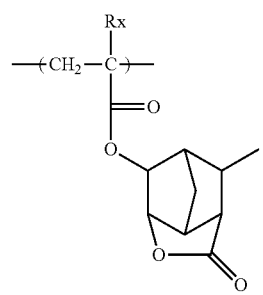
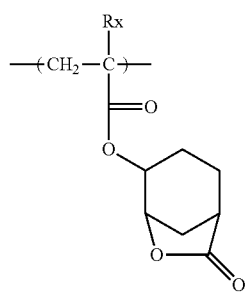

-continued

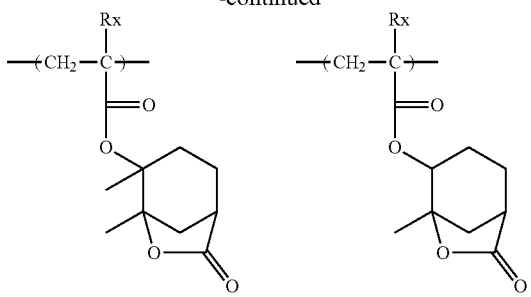
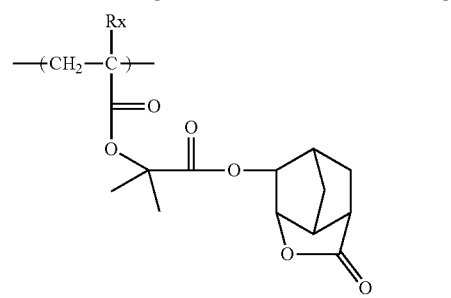
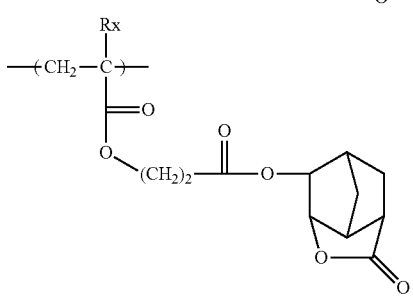
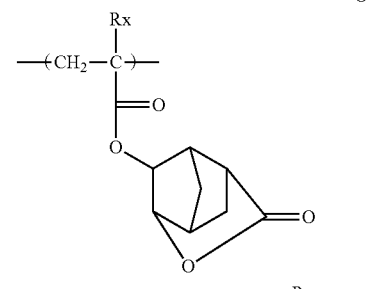
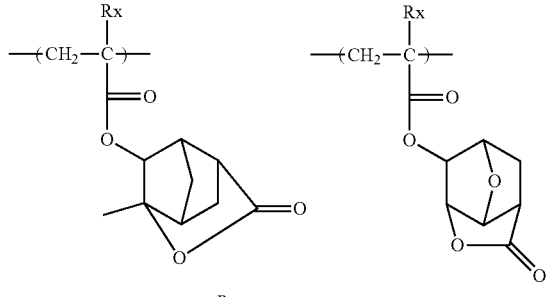
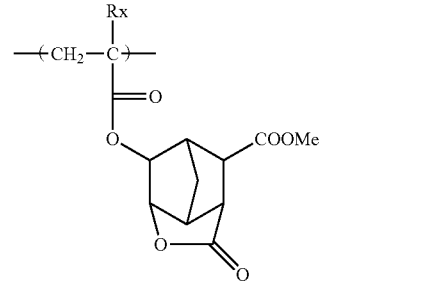

-continued

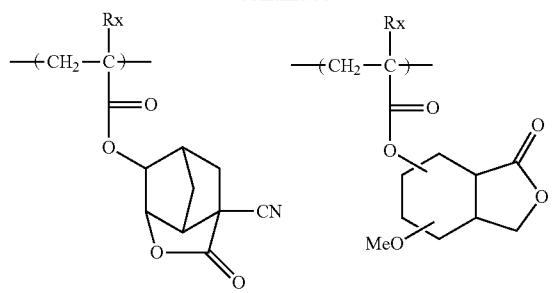

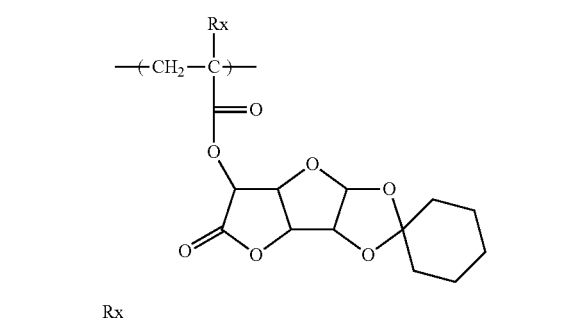

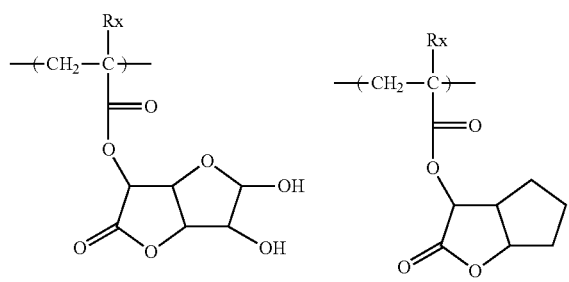

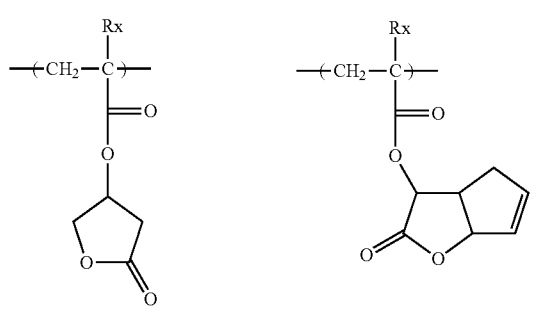

-continued

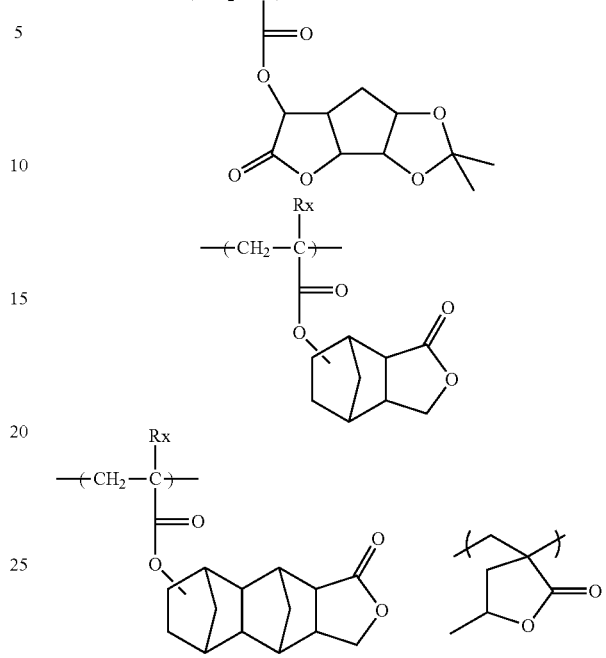

In a case where the resin (A) has a repeating unit having no fluorine atom and having a lactone structure, the content of the repeating unit having no fluorine atom and having a lactone structure is preferably 1% to 50% by mass, more preferably 5% to 45% by mass, and still more preferably 10% to 40% by mass, with respect to the total mass of the resin (A).

Repeating Unit Having No Fluorine Atom and Having Phenolic Hydroxyl Group

Examples of such other repeating units having no fluorine atom include a repeating unit having no fluorine atom and having a phenolic hydroxyl group.

As such a repeating unit, the repeating unit of General Formula (I), in which $Ar_4$ represents an (n+1)-valent aromatic ring group, and in a case where $Ar_4$ is bonded to $R_{42}$ to form a ring, $Ar_4$ represents an (n+2)-valent aromatic ring group, is preferable.

In this case, examples of the aromatic ring group include an aromatic hydrocarbon ring group having 6 to 18 carbon atoms, such as a benzene ring group, a naphthalene ring group, and an anthracene ring group, and a hetero aromatic ring group such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group.

These aromatic ring groups may further have a substituent.

Furthermore, the phenolic hydroxyl group mentioned herein is intended to encompass a hydroxyl group directly bonded to an aromatic group (aromatic hydroxyl group), in addition to a hydroxyl group directly bonded to a benzene ring group.

Examples of the repeating unit having no fluorine atom and having a phenolic hydroxyl group are set forth below. In the formulae, a represents an integer of 1 to 3.

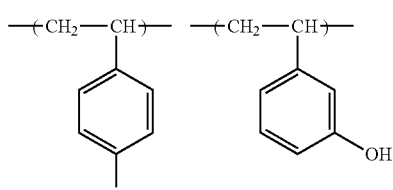
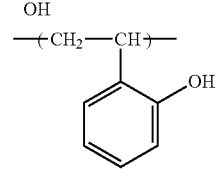
(B-1)
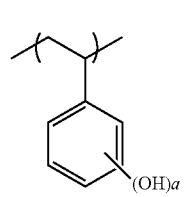
(B-2)
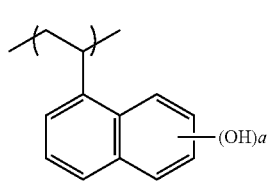
(B-3)
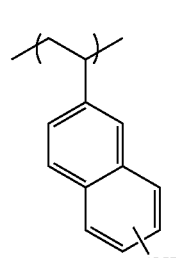
(B-4)
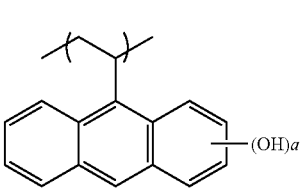
(B-5)
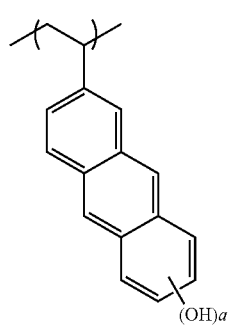
-continued
(B-6)
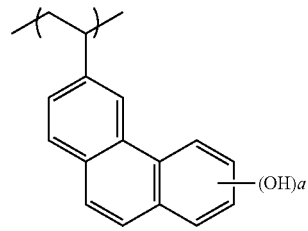
(B-7)
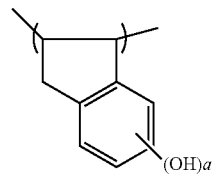
(B-8)
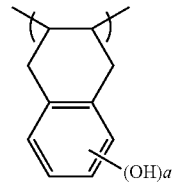
(B-9)
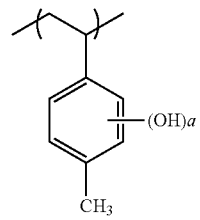
(B-10)
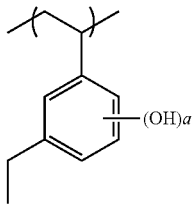
(B-11)
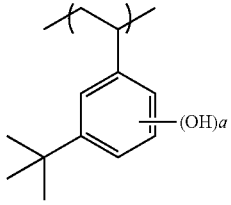
(B-12)
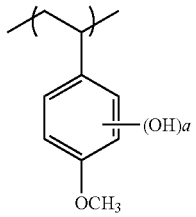

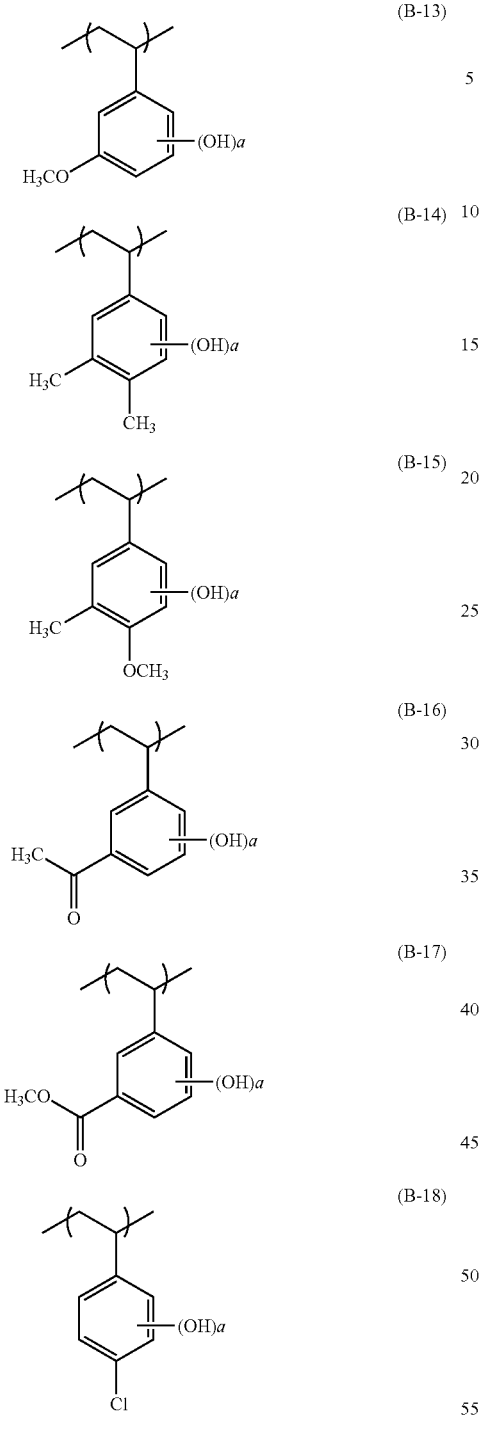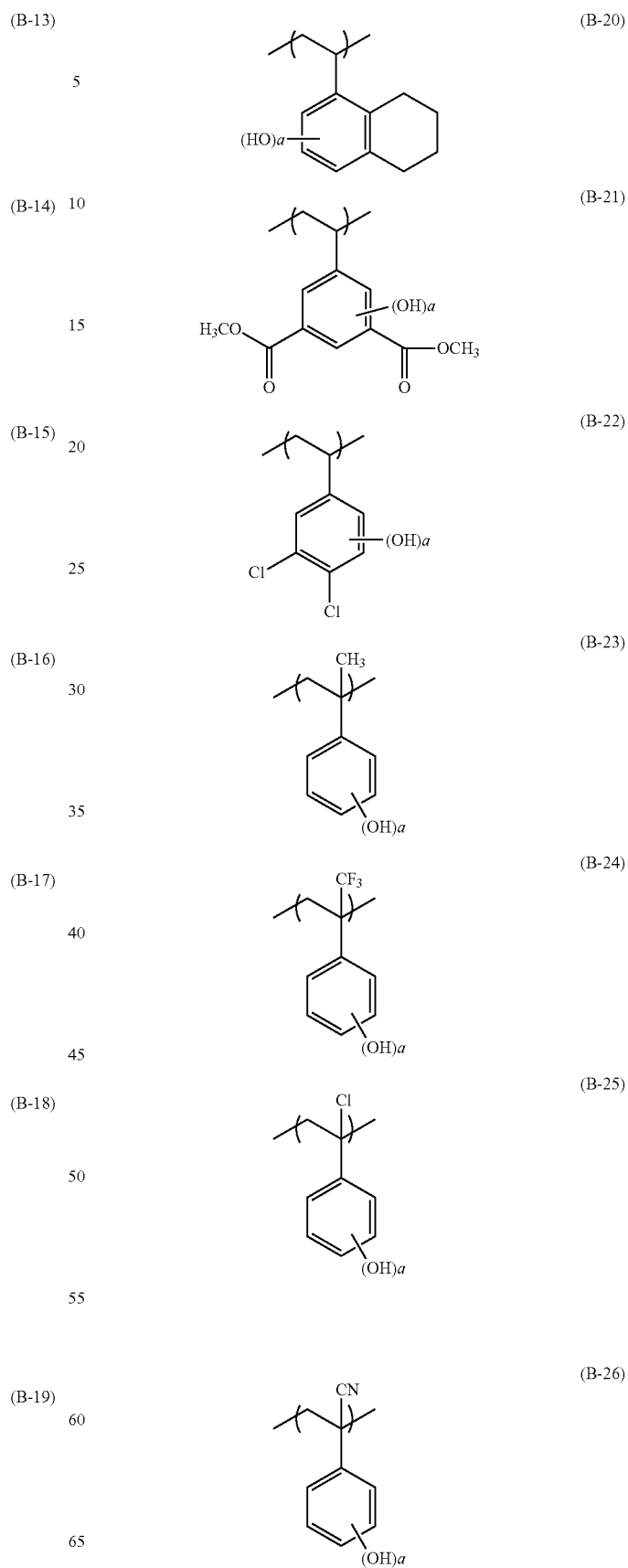

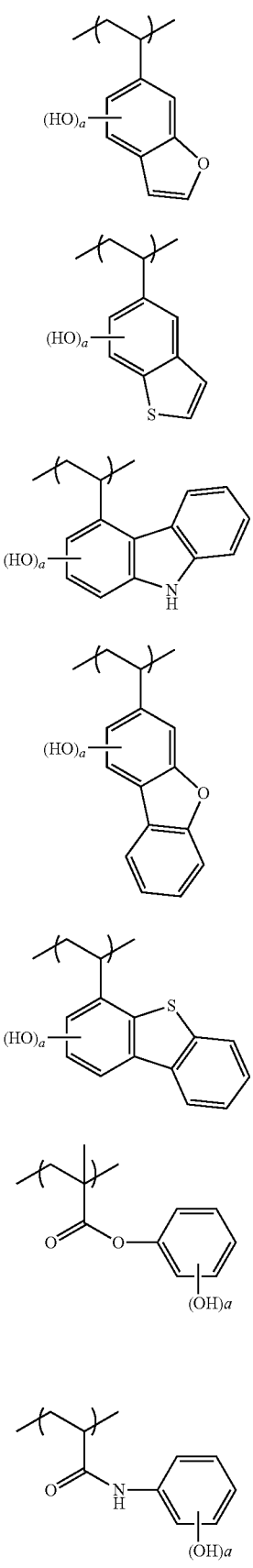
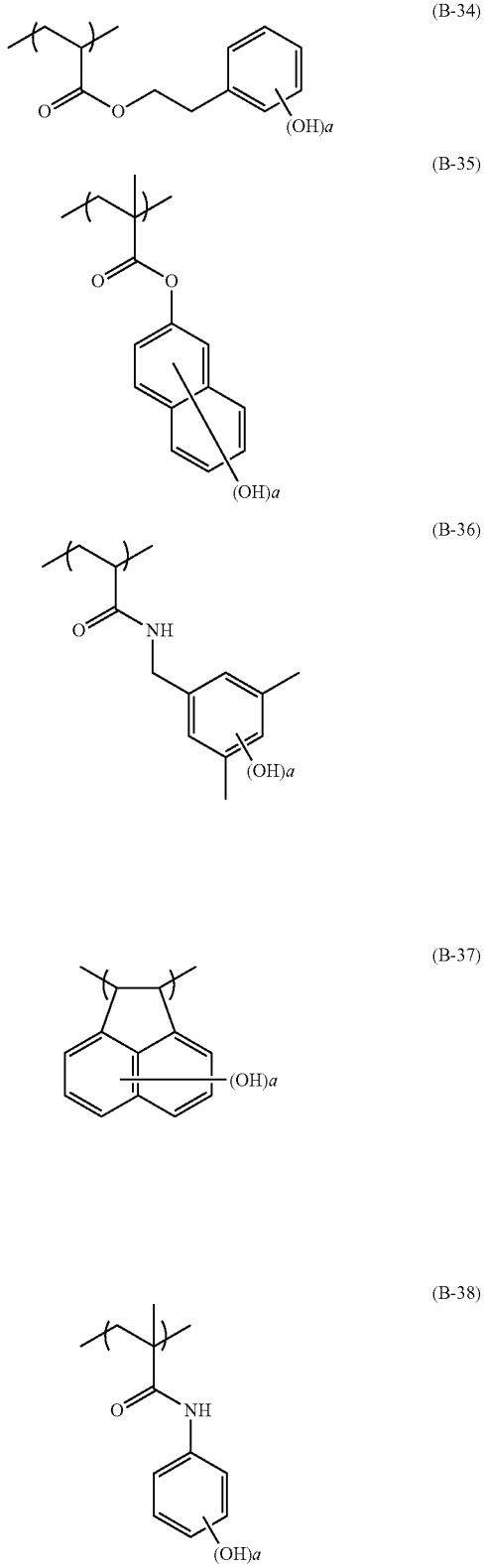
Moreover, among those repeating units, repeating units specifically described below are preferable. In the formulae, R represents a hydrogen atom or a methyl group, and a represents 2 or 3.

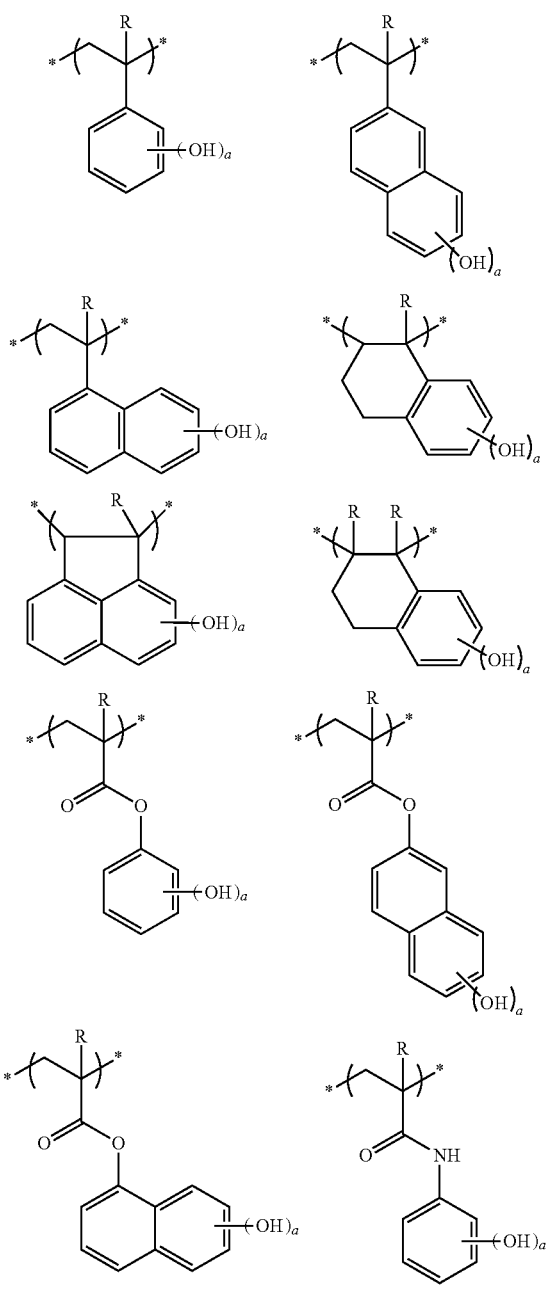

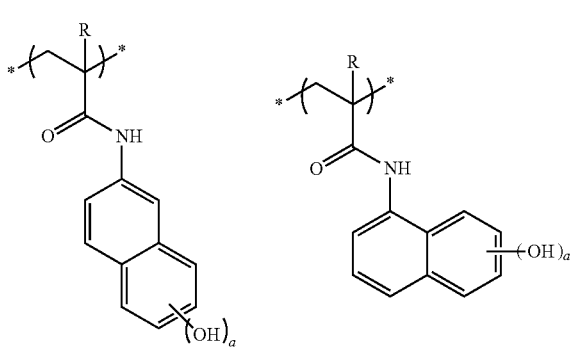

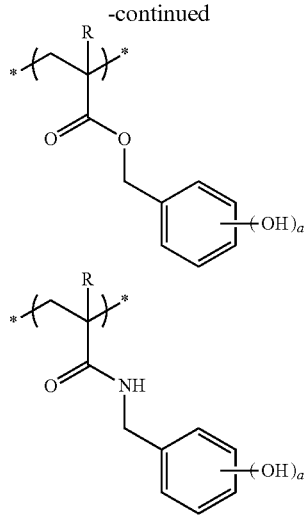

In a case where the resin (A) has a repeating unit having no fluorine atom and having a phenolic hydroxyl group, the content of the repeating unit having no fluorine atom and having a phenolic hydroxyl group is preferably 1% to 70% by mass, more preferably 5% to 70% by mass, and still more preferably 10% to 65% by mass, with respect to the total mass of the resin (A).

Repeating Unit Represented by General Formula (V-1) or General Formula (V-2)

Examples of such other repeating units having no fluorine atom include a repeating unit represented by General Formula (V-1) or General Formula (V-2).

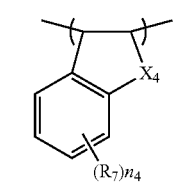

(V-1)

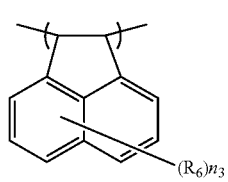

(V-2)

In the formulae, $R_6$ and $R_7$ each independently represent a hydrogen atom, a linear, branched, or cyclic alkyl group having 1 to 10 carbon atoms, an alkoxy group, an acyloxy group, a cyano group, nitro group, an amino group, a halogen atom (excluding a fluorine atom), an ester group (—COO—R: R is an alkyl group having 1 to 6 carbon atoms), or a carboxy group.

$n_3$ represents an integer of 0 to 6.

$n_4$ represents an integer of 0 to 4.

$X_4$ represents a methylene group, an oxygen atom, or a sulfur atom.

Specific examples of the repeating unit represented by General Formula (V-1) or (V-2) are set forth below, but are not particularly limited thereto.

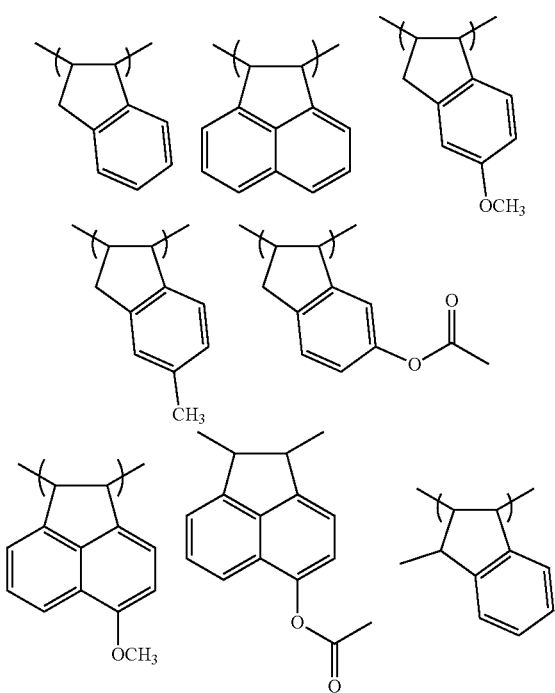

In a case where the resin (A) has the repeating unit represented by General Formula (V-1) or General Formula (V-2), the content of the repeating unit represented by General Formula (V-1) or General Formula (V-2) is preferably 1% to 40% by mass, more preferably 5% to 30% by mass, and still more preferably 5% to 20% by mass, with respect to the total mass of the resin (A).

Repeating Unit Derived from Maleimide or Maleimide Derivative

The resin (A) may have a repeating unit derived from maleimide or a maleimide derivative as such other repeating units having no fluorine atom.

Examples of the repeating unit derived from maleimide or a maleimide derivative include repeating units as follows.

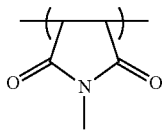

In a case where the resin (A) has a repeating unit derived from maleimide or a maleimide derivative, the content of the repeating unit derived from maleimide or a maleimide derivative is preferably 1% to 40% by mass, more preferably 5% to 30% by mass, and still more preferably 5% to 20% by mass, with respect to the total mass of the resin (A).

Such other repeating units having no fluorine atom may be used singly or in combination of two or more kinds thereof.

In a case where the resin (A) has other repeating unit having no fluorine atom, the content of such other repeating units having no fluorine atom (a total content in a case where two or more kinds of the repeating units are present) is, for example, preferably 5% to 80% by mass, more preferably 10% to 70% by mass, and still more preferably 15% to 70% by mass, with respect to the total mass of the resin (A).

The content of the halogen atom (preferably a fluorine atom) of the resin (A) is preferably 20% to 90% by mass, more preferably 20% to 80% by mass, and still more preferably 20% to 70% by mass, with respect to the total mass of the resin (A).

The resin (A) can be synthesized in accordance with an ordinary method (for example, radical polymerization).

The weight-average molecular weight (Mw) of the resin (A) as a value in terms of polystyrene by a GPC method is preferably 1,000 to 200,000, more preferably 3,000 to 20,000, and still more preferably 5,000 to 15,000.

The dispersity (Mw/Mn, molecular weight distribution) of the resin (A) is preferably 1 to 5, more preferably 1 to 3, still more preferably 1.2 to 3.0, and particularly preferably 1.2 to 2.0. In a case where the dispersity is small, the resolution of a pattern is excellent, the side wall of the pattern is smooth, and thus, the roughness is excellent.

The content of the resin (A) in the composition of the embodiment of the present invention preferably 50% to 99.9% by mass, and more preferably 60% to 99.0% by mass.

Furthermore, the resin (A) may be used singly or in combination of a plurality of kinds thereof.

<Compound that Generates Acid Upon Irradiation with Actinic Rays or Radiation>

The composition of the embodiment of the present invention includes a compound that generates an acid upon irradiation with actinic rays or radiation (hereinafter also referred to as a "photoacid generator").

The photoacid generator may be in a form of a low molecular compound or a form incorporated into a part of a polymer. Further, a combination of the form of a low molecular compound and the form incorporated into a part of a polymer may also be used.

In a case where the photoacid generator is in the form of the low molecular compound, the molecular weight is preferably 3,000 or less, more preferably 2,000 or less, and still more preferably 1,000 or less.

In a case where the photoacid generator is included in a part of a polymer, it may be included in a part of the resin (A) or in a resin other than the resin (A).

Among those, the photoacid generator is preferably in the form of the low molecular compound.

The photoacid generator is not particularly limited as long as it is a known photoacid generator, but is preferably a compound that generates an organic acid upon irradiation with actinic rays or radiation (preferably electron beams or extreme ultraviolet rays).

As the organic acid, for example, at least one of sulfonic acid, bis(alkylsulfonyl)imide, or tris(alkylsulfonyl)methide is preferable.

As the photoacid generator, a compound represented by General Formula (ZI), General Formula (ZII), or General Formula (ZIII) is preferable.

(ZI)

(ZII)

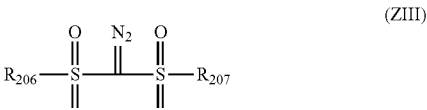

(ZIII)

In General Formula (ZI), $R_{201}$, $R_{202}$, and $R_{203}$ each independently represent an organic group.

The number of carbon atoms in the organic group as each of $R_{201}$, $R_{202}$, and $R_{203}$ is generally 1 to 30, and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group).

$Z^-$ represents a non-nucleophilic anion (anion having an extremely low ability to cause a nucleophilic reaction).

Examples of the organic group of each of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, or $R_{203}$ represent an aryl group. As the aryl group, not only a phenyl group, a naphthyl group, or the like but also a heteroaryl group such as an indole residue and a pyrrole residue can also be used.

As the alkyl group of each of $R_{201}$ to $R_{203}$, a linear or branched alkyl group having 1 to 10 carbon atoms is preferable, and a methyl group, an ethyl group, an n-propyl group, an isopropyl group, an n-butyl group, or the like is more preferable.

As the cycloalkyl group of each of $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of the substituent which may be contained in these groups include a nitro group, a halogen atom such as a fluorine atom, a carboxy group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Examples of the non-nucleophilic anion include a sulfonate anion (an aliphatic sulfonate anion, an aromatic sulfonate anion, a camphor sulfonate anion, and the like); a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be either an alkyl group or a cycloalkyl group, and is preferably a linear or branched alkyl group having 1 to 30 carbon atoms or a cycloalkyl group having 3 to 30 carbon atoms.

As the aryl group in the aromatic sulfonate anion and the aromatic carboxylate anion, an aryl group having 6 to 14 carbon atoms is preferable, and examples thereof include a phenyl group, a tolyl group, and a naphthyl group.

The alkyl group, the cycloalkyl group, and the aryl group exemplified above may have a substituent. The substituent is not particularly limited, but specific examples of the substituent include a nitro group, a halogen atom such as fluorine atom, a carboxy group, a hydroxyl group, an amino group, a cyano group, an alkoxy group (preferably having 1 to 15 carbon atoms), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), and an aryloxysulfonyl group (preferably having 6 to 20 carbon atoms).

As the aralkyl group in the aralkyl carboxylate anion, an aralkyl group having 7 to 14 carbon atoms is preferable, and examples thereof include a benzyl group, a phenethyl group, a naphthylmethyl group, a naphthylethyl group, and a naphthylbutyl group.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of the substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and the fluorine atom or the alkyl group substituted with a fluorine atom is preferable.

In addition, the alkyl groups in the bis(alkylsulfonyl) imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom is preferable. Among those, a perfluoroaliphatic sulfonate anion (more preferably having 4 to 8 carbon atoms) or a fluorine atom-containing benzenesulfonate anion is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of the acid strength, it is preferable that the pKa of the acid generated is −1 or less so as to improve the sensitivity.

Moreover, as the non-nucleophilic anion, an anion represented by General Formula (AN1) is also preferable.

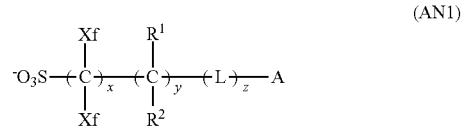

(AN1)

In the formula, Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are each present in plural number, $R^1$'s and $R^2$'s may be the same as or different from each other.

L represents a divalent linking group, and in a case where L's are present in plural number, L's may be the same as or different from each other.

A represents a cyclic organic group.

x represents an integer of 1 to 20, y represents an integer of 0 to 10, and z represents an integer of 0 to 10.

General Formula (AN1) will be described in more detail.

In an alkyl group substituted with a fluorine atom in Xf, the number of carbon atoms of the alkyl group is preferably 1 to 10, and more preferably 1 to 4. Further, as the alkyl group substituted with a fluorine atom of Xf, a perfluoroalkyl group is preferable.

As Xf, a fluorine atom or a perfluoroalkyl group having 1 to 4 carbon atoms is preferable. Examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom or $CF_3$ is preferable. In particular, it is preferable that both Xf's are fluorine atoms.

The alkyl group of each of $R^1$ and $R^2$ may contain a substituent (preferably a fluorine atom), and the number of carbon atoms is preferably 1 to 4. Among those, a perfluoroalkyl group having 1 to 4 carbon atoms is more preferable. In a case where $R^1$ and $R^2$ are each an alkyl group containing a substituent, examples thereof include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

As $R^1$ and $R^2$, the fluorine atom or $CF_3$ is preferable.

x is preferably 1 to 10, and more preferably 1 to 5.

y is preferably 0 to 4, and more preferably 0.

z is preferably 0 to 5, and more preferably 0 to 3.

The divalent linking group of L is not particularly limited and examples thereof include —COO—, —OCO—, —CO—, —O—, —S—, —SO—, —$SO_2$—, an alkylene group, a cycloalkylene group, an alkenylene group, and a linking group formed by combination of a plurality of these groups, and a linking group having a total number of carbon atoms of 12 or less is preferable. Among those, —COO—, —OCO—, —CO—, or —O— is preferable, and —COO— or —OCO— is more preferable.

The cyclic organic group of A is not particularly limited as long as it has a cyclic structure, and examples thereof include an alicyclic group, an aryl group, and a heterocyclic group (including not only those having aromaticity but also those having no aromaticity).

The alicyclic group may be monocyclic or polycyclic and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable in view that the diffusibility of the photoacid generator in the film in a heating step after exposure can be suppressed and mask error enhancement factor (MEEF) is further improved.

Examples of the aromatic ring group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among those, heterocyclic groups derived from a furan ring, a thiophene ring and a pyridine ring are preferable.

Moreover, examples of the cyclic organic group include a lactone structure, and specific examples thereof include lactone structures represented by General Formulae (LC1-1) to (LC1-17).

The cyclic organic group may have a substituent. Examples of the substituent include an alkyl group (which may be in any one of linear, branched, and cyclic forms, and preferably has 1 to 12 carbon atoms), a cycloalkyl group (which may be either a monocycle or a polycycle, and in a case of the polycycle, may be a spiro ring, and which preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

In General Formula (ZII) and General Formula (ZIII), $R_{204}$ to $R_{207}$ each independently represent an aryl group, an alkyl group, or a cycloalkyl group.

The aryl group, the alkyl group, and the cycloalkyl group of each of $R_{204}$ to $R_{207}$ are the same as the groups described as the aryl group, the alkyl group, and the cycloalkyl group of each of $R_{201}$ to $R_{203}$, respectively, in General Formula (ZI).

The substituents which may be contained in the aryl group, the alkyl group, and the cycloalkyl group of each of $R_{204}$ to $R_{207}$ are the same as a substituents which may be contained in the aryl group, the alkyl group, and the cycloalkyl group of each of $R_{201}$ to $R_{203}$ in General Formula (ZI), and suitable aspects thereof are also the same.

$Z^-$ represents a non-nucleophilic anion and has the same definition as $Z^-$ in General Formula (ZI), and suitable aspects thereof are also the same.

Moreover, from the viewpoint that the diffusion of an acid generated upon exposure to the unexposed area is suppressed to improve a resolution, the photoacid generator is preferably a compound that generates an acid (more preferably sulfonic acid) having a volume of 130 $Å^3$ or more upon irradiation with electron beams or extreme ultraviolet rays. Among those, the photoacid generator is more preferably a compound that generates an acid (more preferably sulfonic acid) having a volume of 190 $Å^3$ or more, still more preferably a compound that generates an acid (more preferably sulfonic acid) having a volume of 270 $Å^3$ or more, and particularly preferably a compound that generates an acid (more preferably sulfonic acid) having a volume of 400 $Å^3$ or more. Meanwhile, from the viewpoint of the sensitivity or the solubility of a coating solvent, the volume is preferably 2,000 $Å^3$ or less, and more preferably 1,500 $Å^3$ or less. In addition, a value of the volume is obtained using "WinMOPAC" manufactured by FUJITSU.

In the calculation of a value of the volume, first, the chemical structure of an acid according to each example is input, the most stable steric conformation of each acid is then determined through a molecular field calculation using a molecular mechanics (MM) 3 method with the input chemical structure as an initial structure, and then, molecular orbital calculation is carried out on the most stable steric conformation using a PM3 method, whereby an "accessible volume" of each acid can be calculated.

Specific examples of an acid (an acid in which a proton is bonded to an anion moiety) generated by the photoacid generator and a volume thereof are set forth below, but the present invention is not limited thereto. In addition, the volumes shown in the following examples are computed values (unit: Å$^3$). In addition, 1 Å is $1\times10^{-10}$ m.
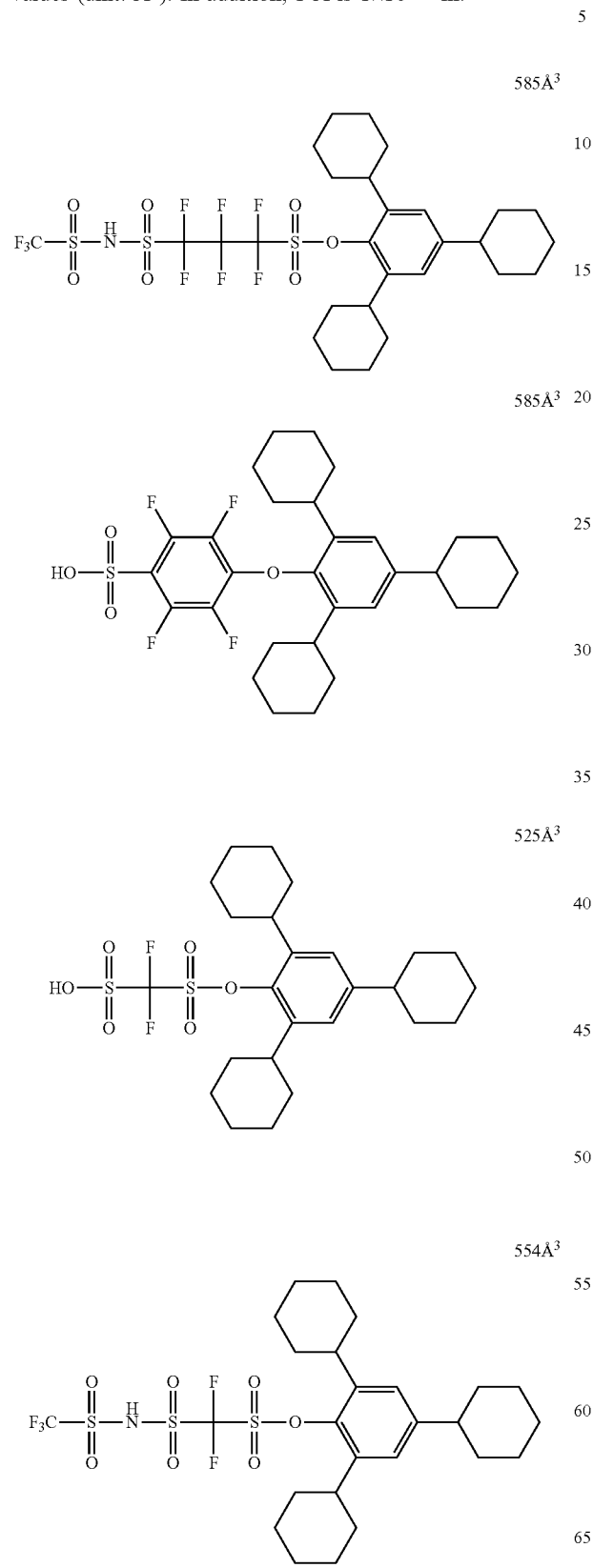
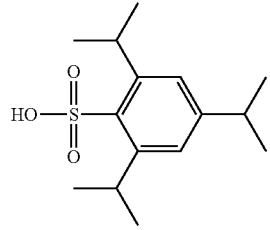
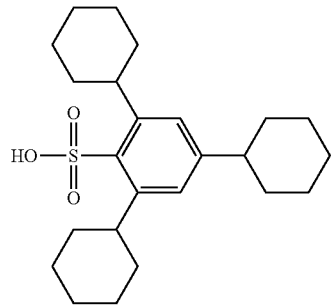
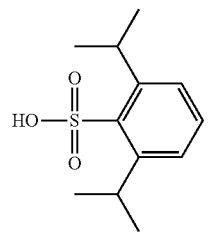
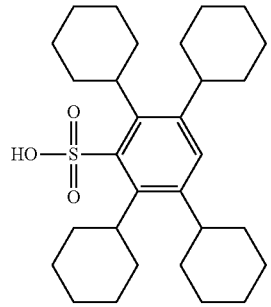
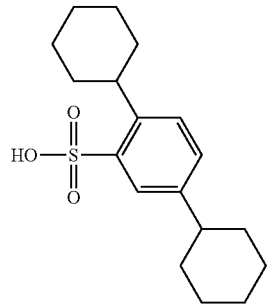
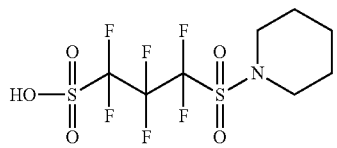

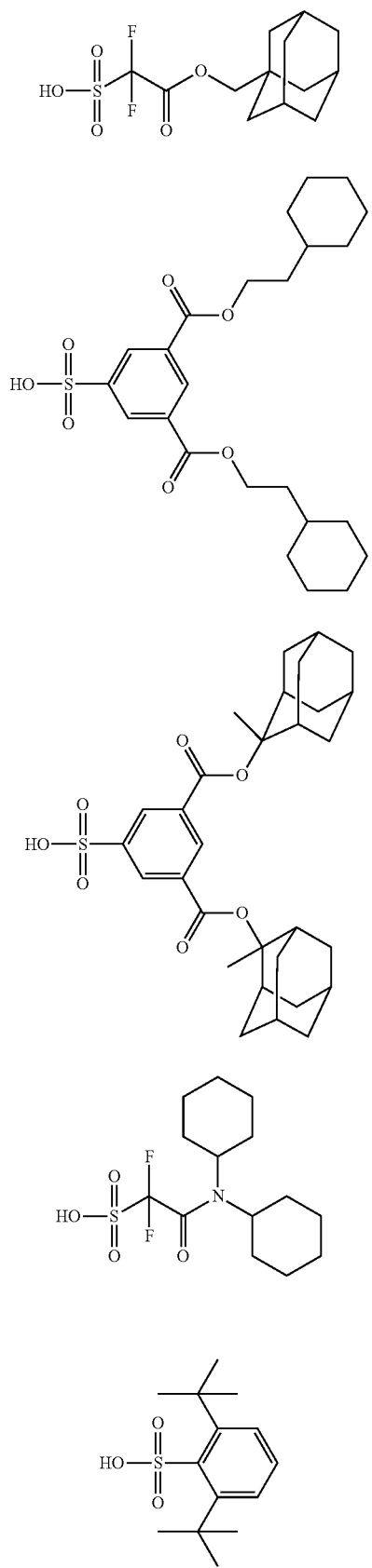
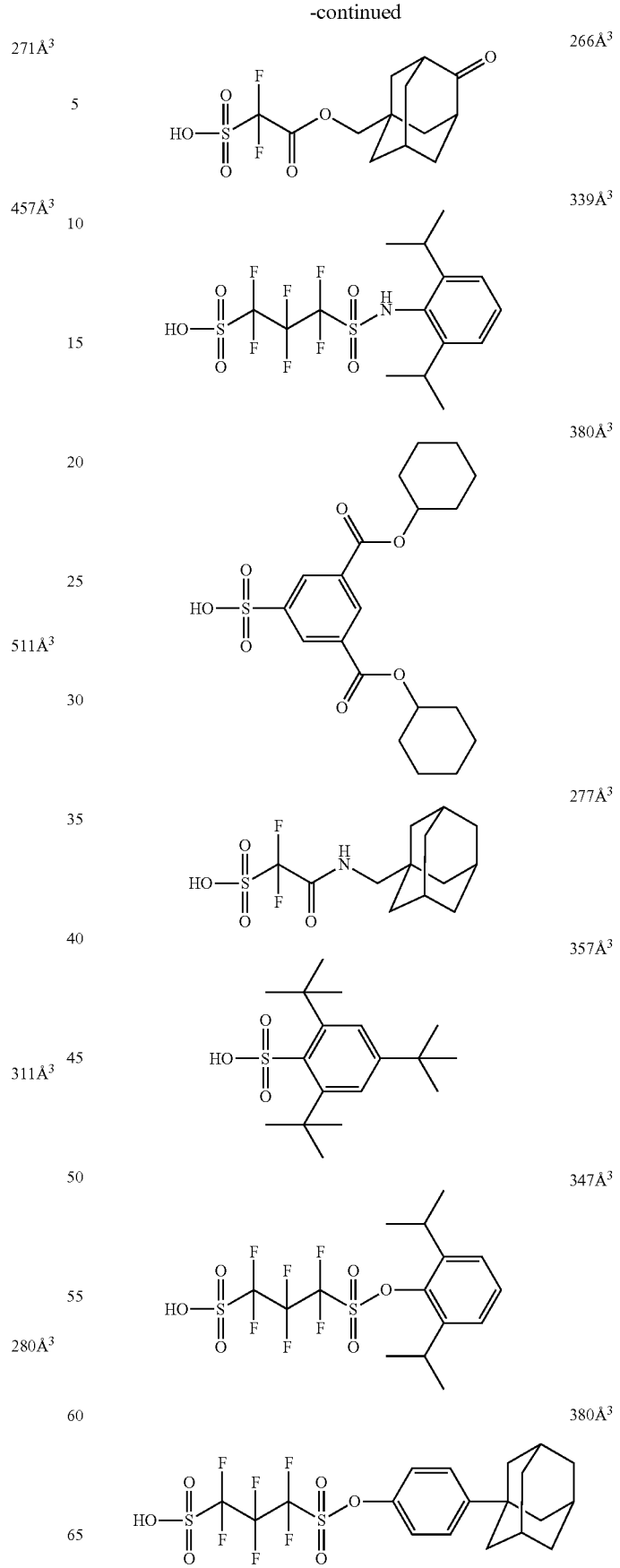

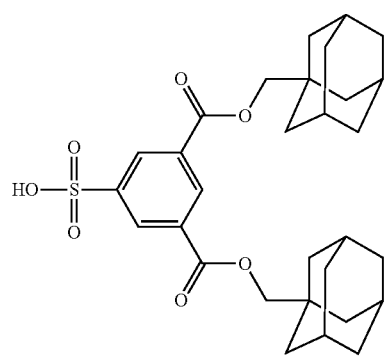 519Å³
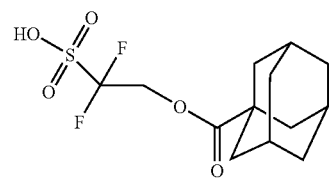 270Å³
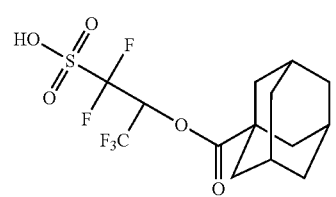 291Å³
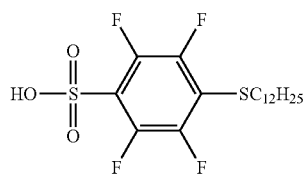 393Å³
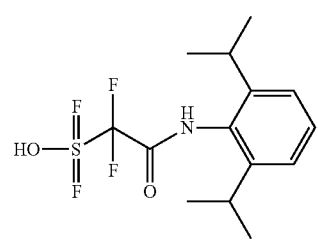 297Å³
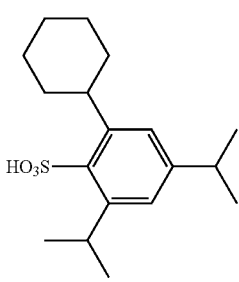 350Å³
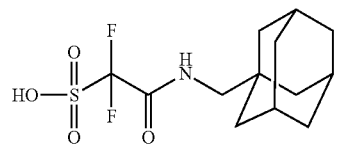 277Å³
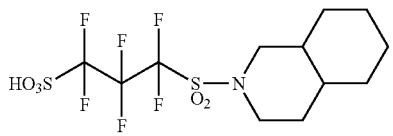 311Å³
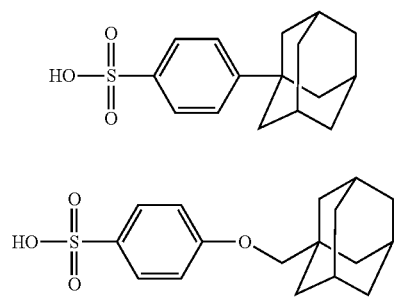 281Å³
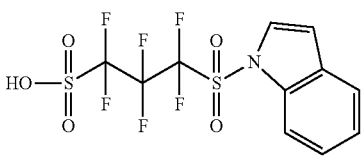 250Å³
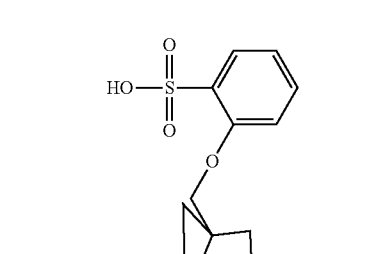 310Å³
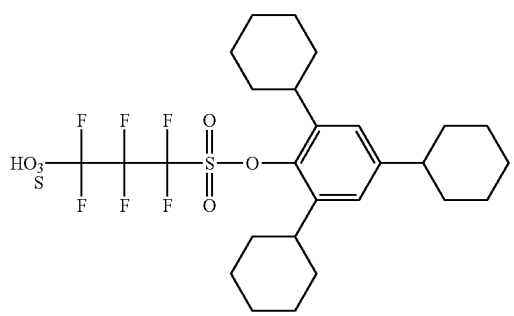 535Å³
 309Å³
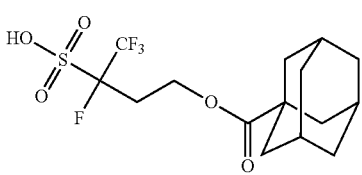 290Å³

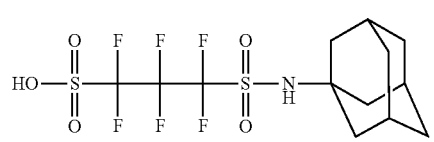
315Å³
With regard to the photoacid generator, reference can be made to paragraphs <0368> to <0377> of JP2014-041328A and paragraphs <0240> to <0262> of JP2013-228681A (corresponding to paragraph <0339> of US2015/0004533A), the contents of which are incorporated herein by reference. In addition, specific preferred examples of the photoacid generator include the following compounds, but are not limited thereto.
(z1)
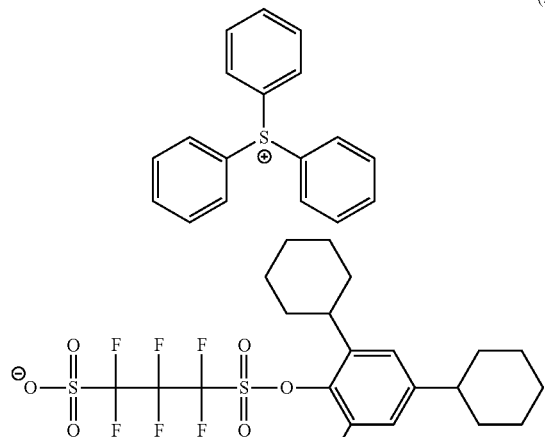
(z2)
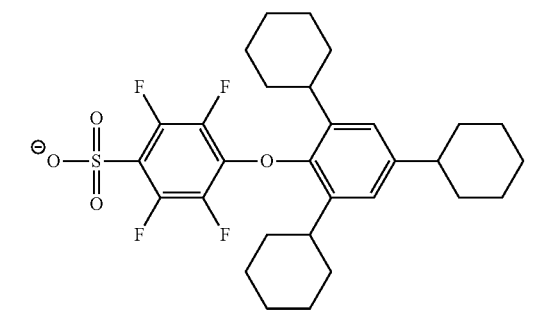
(z3)
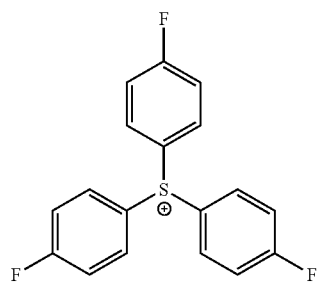
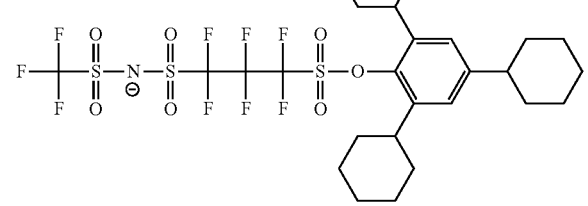
(z4)
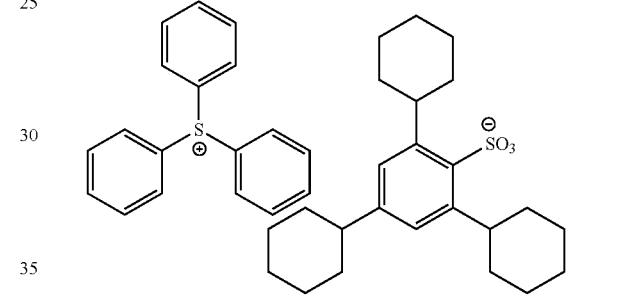
(z5)
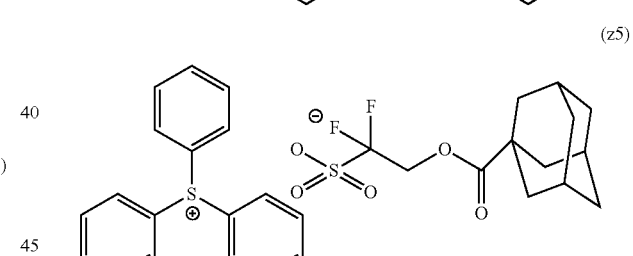
(z6)
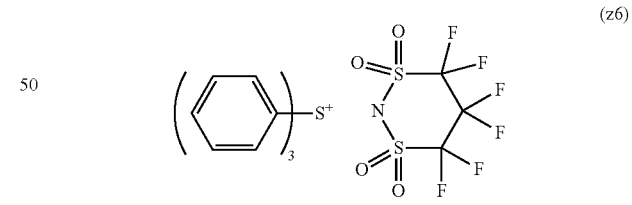
(z7)
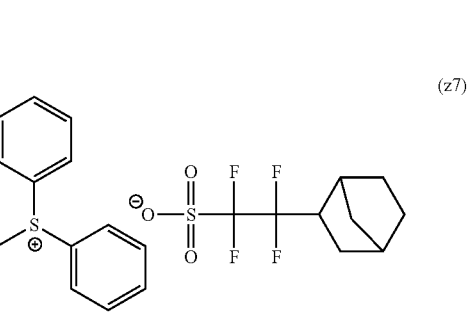

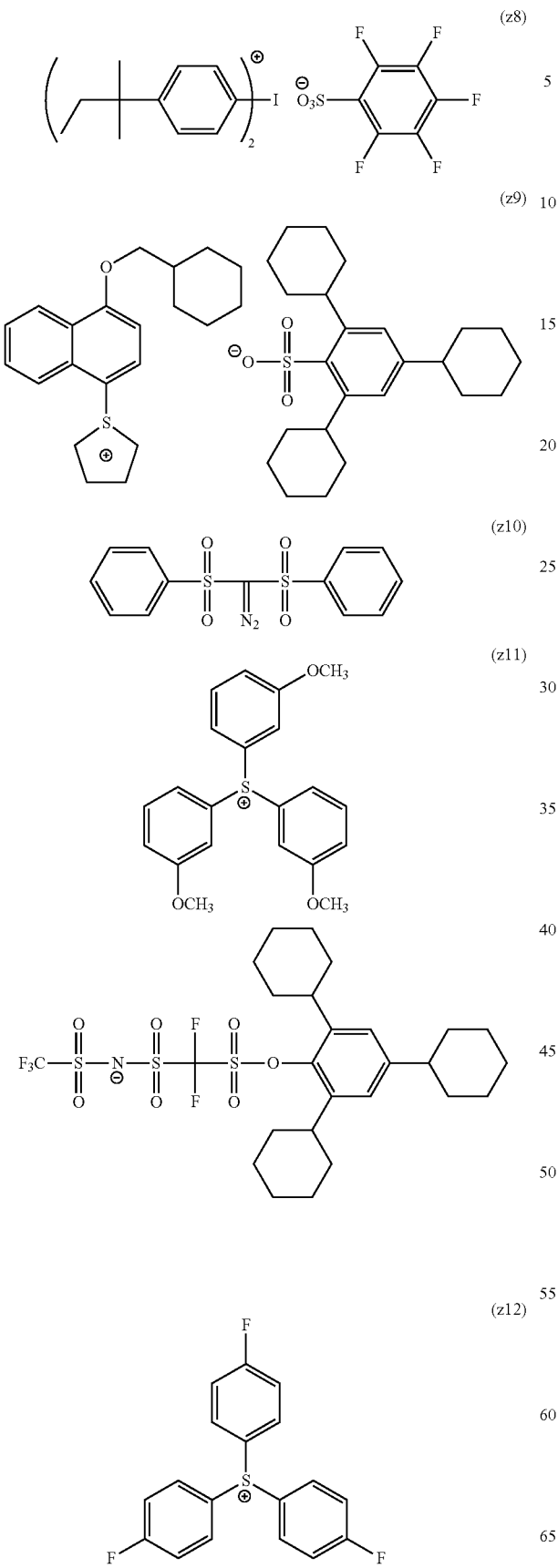
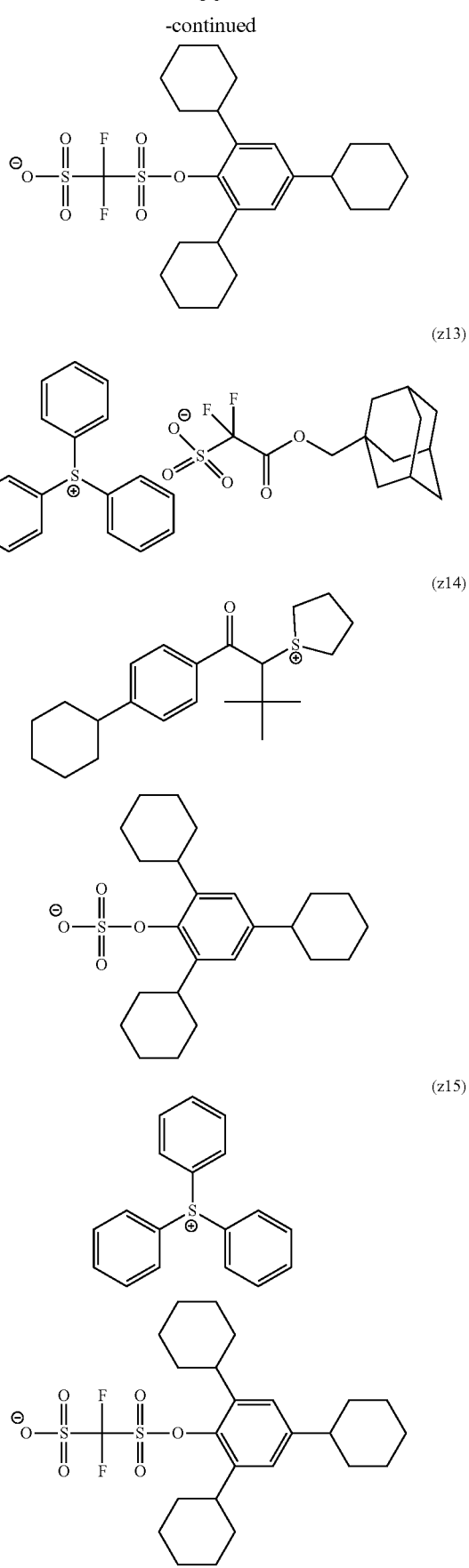

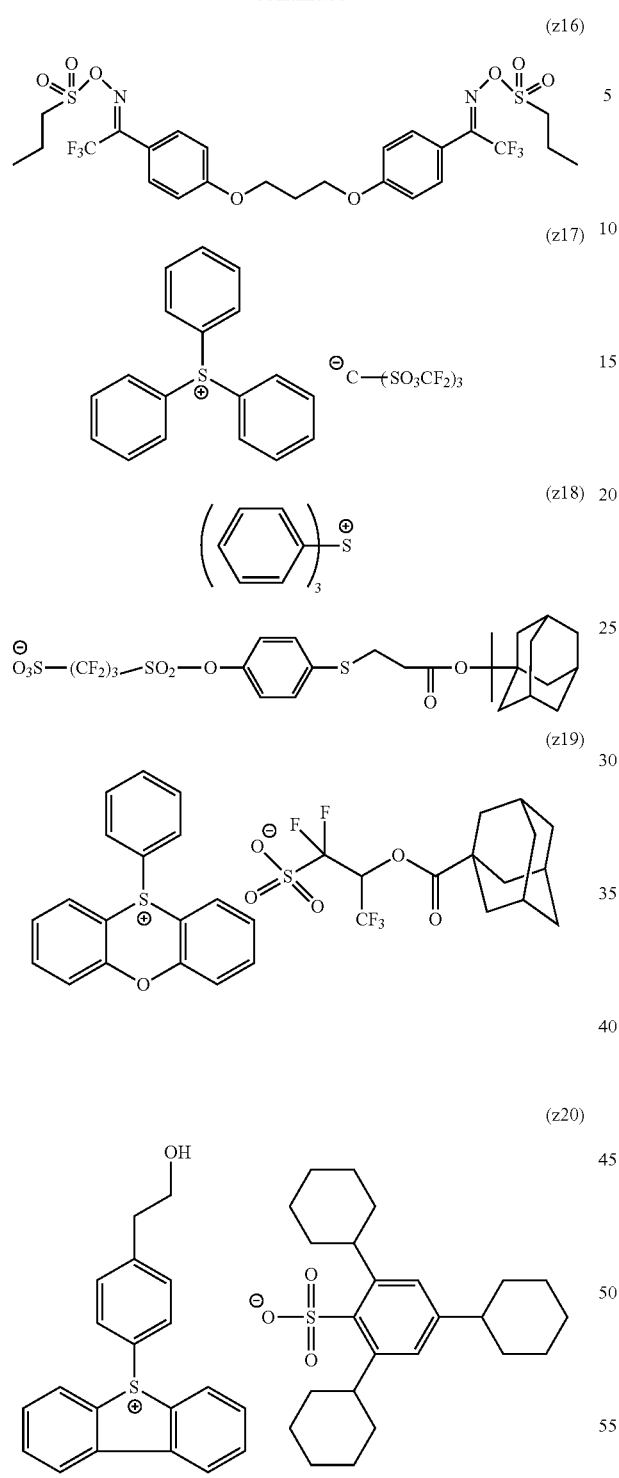
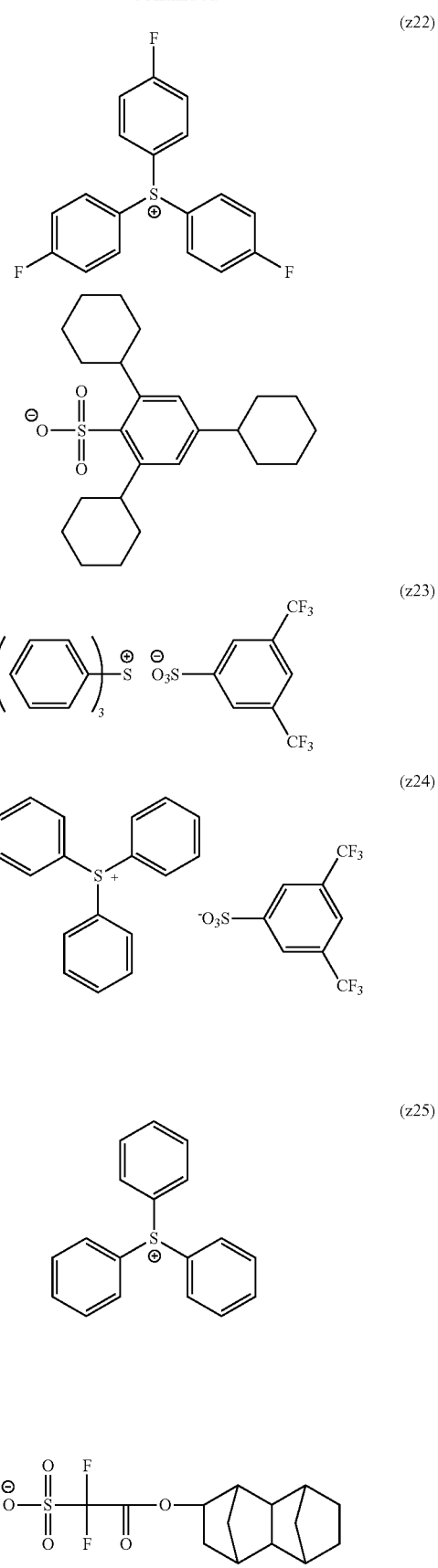

(z26)
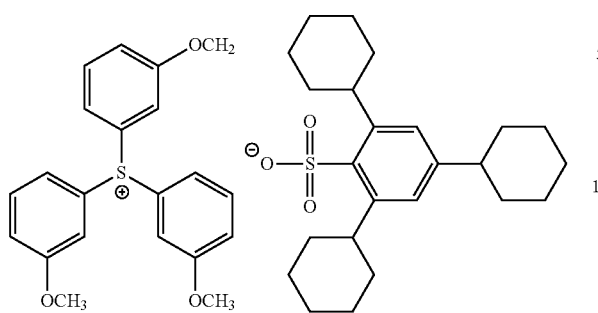
(z27)
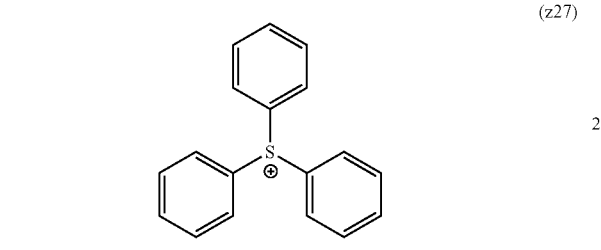
(z28)
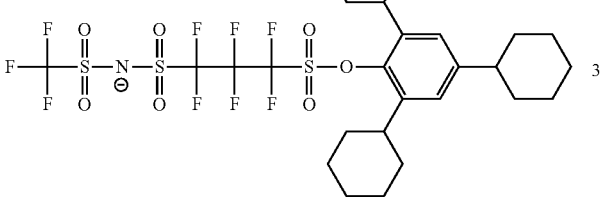
(z29)
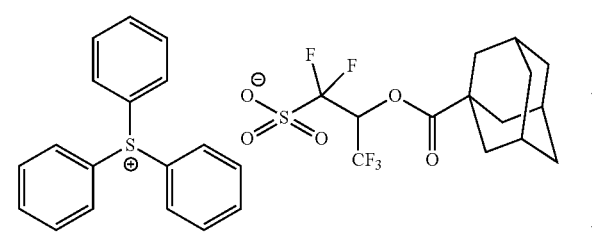
(z30)
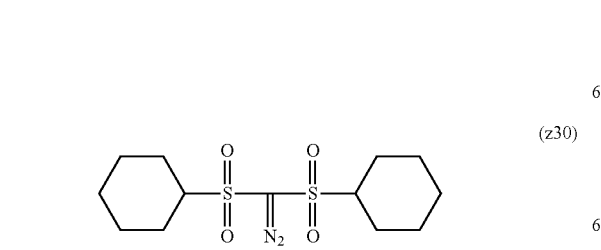
(z31)
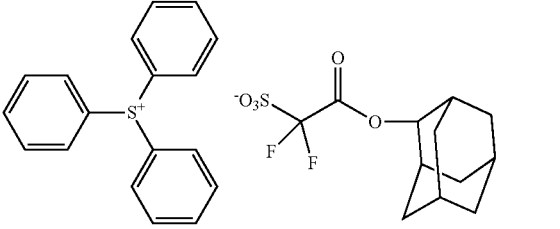
(z32)
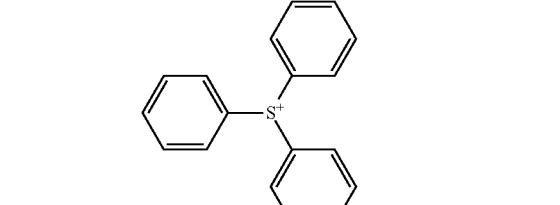
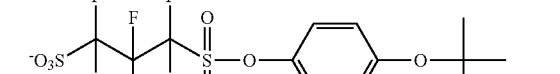
(z33)
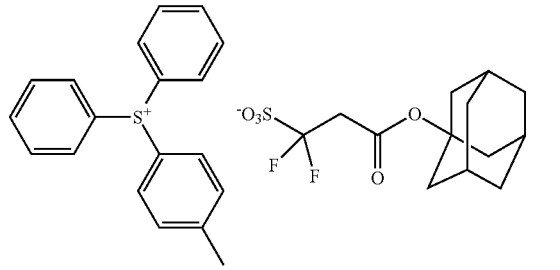
(z34)
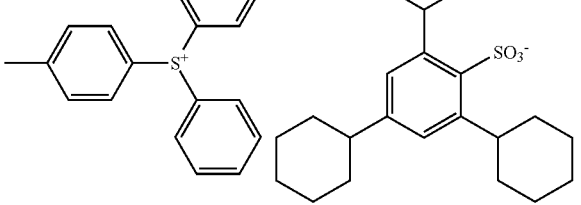
(z35)
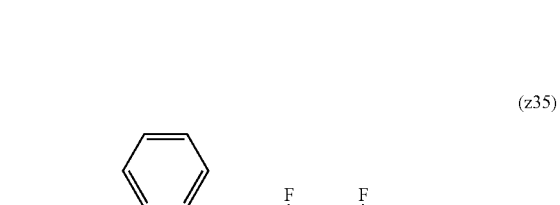

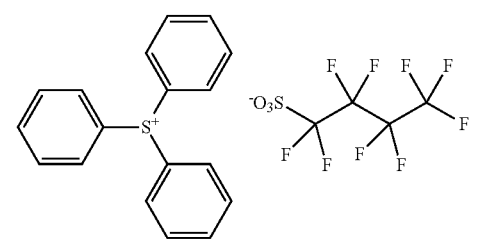
The photoacid generator may be used singly or in combination of two or more kinds thereof.
The content of the photoacid generator (a total content in a case where the photoacid generators are present in plural kinds) in the composition of the embodiment of the present invention is preferably 0.1% to 50% by mass, more preferably 5% to 40% by mass, and still more preferably 5% to 30% by mass, with respect to the total solid content of the composition.

<Acid Diffusion Control Agent>

The composition of the embodiment of the present invention preferably includes an acid diffusion control agent. The acid diffusion control agent acts as a quencher that inhibits a reaction of the acid-decomposable resin in the unexposed area by excessive generated acids by trapping the acids generated from a photoacid generator or the like upon exposure. For example, a basic compound (DA), a compound (DB) whose basicity is reduced or lost upon irradiation with actinic rays or radiation, or the like can be used as the acid diffusion control agent.

As the basic compound (DA), compounds having structures represented by Formulae (A) to (E) are preferable.

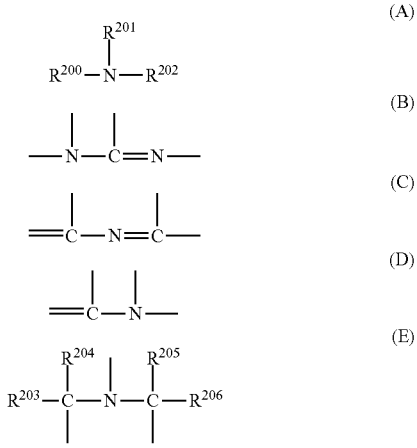

In General Formulae (A) and (E), $R^{200}$, $R^{201}$, and $R^{202}$ each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

In General Formula (E), $R^{203}$, $R^{204}$, $R^{205}$, and $R^{206}$ each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

Examples of the compound having an imidazole structure include imidazole, 2,4,5-triphenylimidazole, and benzimidazole.

Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene.

Examples of the compound having an onium hydroxide structure include triarylsulfonium hydroxide, phenacylsulfonium hydroxide, and sulfonium hydroxide having a 2-oxoalkyl group (specifically triphenylsulfonium hydroxide, tris(t-butylphenyl)sulfonium hydroxide, bis(t-butylphenyl) iodonium hydroxide, phenacylthiophenium hydroxide, and 2-oxopropylthiophenium hydroxide).

The compound having an onium carboxylate structure is a compound formed by carboxylation of an anionic moiety of a compound having an onium hydroxide structure, and examples thereof include acetate, adamantane-1-carboxylate, and perfluoroalkyl carboxylate.

Examples of the compound having a trialkylamine structure include tri(n-butyl)amine and tri(n-octyl)amine.

Examples of the compound having an aniline structure or a pyridine structure include 2,6-diisopropylaniline, N,N-dimethylaniline, N,N-dibutylaniline, and N,N-dihexylaniline.

Examples of the alkylamine derivative having a hydroxyl group and/or an ether bond include ethanolamine, diethanolamine, triethanolamine, and tris(methoxyethoxyethyl) amine.

Examples of the aniline derivative having a hydroxyl group and/or an ether bond include N,N-bis(hydroxyethyl) aniline.

Moreover, a superorganic base can also be used as the basic compound (DA).

Examples of the superorganic base include guanidine bases (including guanidine and guanidine derivatives such as substituted forms thereof and polyguanides), amidine-based and guanidine-based polynitrogen polyheterocyclic compounds and polymer-supported strong bases thereof, typified by diazabicyclononene (DBN), diazabicycloundecene (DBU), triazabicyclodecene (TBD), N-methyltriazabicyclodecene (MTBD), and the like, phosphazene-based (Schweisinger) bases, and proazaphosphatran (Verkade) bases.

Moreover, as the basic compound (DA), an amine compound and an ammonium salt compound can also be used.

Examples of the amine compound include primary, secondary, and tertiary amine compounds, and the amine compound is preferably an amine compound in which at least one or more alkyl groups (preferably having 1 to 20 carbon atoms) are bonded to nitrogen atoms, and more preferably the tertiary amine compound among those.

Furthermore, in a case where the amine compound is the secondary or tertiary amine compound, examples of a group bonded to the nitrogen atom in the amine compound include, in addition to the above-mentioned alkyl groups, a cycloalkyl group (preferably having 3 to 20 carbon atoms) and an aryl group (preferably having 6 to 12 carbon atoms).

In addition, the amine compound preferably includes an oxyalkylene group. The number of the oxyalkylene groups contained in the amine compounds within the molecule is preferably 1 or more, more preferably 3 to 9, and still more preferably 4 to 6. Among those oxyalkylene groups, an oxyethylene group (—$CH_2CH_2O$—) or an oxypropylene group (—$CH(CH_3)CH_2O$— or —$CH_2CH_2CH_2O$—) is preferable, and the oxyethylene group is more preferable.

Examples of the ammonium salt compound include primary, secondary, tertiary, and quaternary ammonium salt compounds, and an ammonium salt compound in which one or more alkyl groups are bonded to a nitrogen atom is preferable.

Furthermore, in a case where the ammonium salt compound is a secondary, tertiary, or quaternary ammonium salt compound, examples of a group which is bonded to a nitrogen atom in the ammonium salt compound include, in addition to the above-mentioned alkyl groups, a cycloalkyl group (preferably having 3 to 20 carbon atoms) and an aryl group (preferably having 6 to 12 carbon atoms).

In addition, the ammonium salt compound preferably includes an oxyalkylene group. The number of the oxyalkylene groups is preferably 1 or more, more preferably 3 to 9, and still more preferably 4 to 6 within the molecule. Among those oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and the oxyethylene group is more preferable.

Examples of the anion of the ammonium salt compound include a halogen atom, a sulfonate, a borate, and a phosphate, and among these, the halogen atom or the sulfonate is preferable.

As the halogen atom, a chlorine atom, a bromine atom, or an iodine atom is preferable.

As the sulfonate, an organic sulfonate having 1 to 20 carbon atoms is preferable, and preferred specific examples thereof include alkyl sulfonate and aryl sulfonate, having 1 to 20 carbon atoms. The alkyl group of the alkyl sulfonate may have a substituent, and examples of the substituent include a fluorine atom, a chlorine atom, a bromine atom, an alkoxy group, an acyl group, and an aromatic ring group. Examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate. In addition, examples of the aryl group of the aryl sulfonate include a benzene ring group, a naphthalene ring group, and an anthracene ring group. As the substituent which can be contained in the benzene ring group, the naphthalene ring group, and the anthracene ring group, a linear or branched alkyl group having 1 to 6 carbon atoms (which may be linear or branched) or a cycloalkyl group having 3 to 6 carbon atoms is preferable. Specific examples of the alkyl group and the cycloalkyl group include a methyl group, an ethyl group, an n-propyl group, an isopropyl group, an n-butyl group, an isobutyl group, a t-butyl group, an n-hexyl group, and a cyclohexyl group.

The alkyl group and the cycloalkyl group may further have another substituent, and examples of such another substituent include an alkoxy group having 1 to 6 carbon atoms, a halogen atom, a cyano group, a nitro group, an acyl group, and an acyloxy group.

Moreover, as the basic compound (DA), an amine compound having a phenoxy group and an ammonium salt compound having a phenoxy group can also be used.

The amine compound having a phenoxy group and the ammonium salt compound having a phenoxy group are each a compound having a phenoxy group at the terminal on the opposite side to the nitrogen atom of the alkyl group which is contained in the amine compound or the ammonium salt compound.

Examples of a substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group. The substitution position of the substituent may be any of 2- to 6-positions. The number of the substituents may be any one of 1 to 5.

The amine compound having a phenoxy group and the ammonium salt compound having a phenoxy group each preferably have at least one oxyalkylene group between the phenoxy group and the nitrogen atom. The number of the oxyalkylene groups within the molecule is preferably 1 or more, more preferably 3 to 9, and still more preferably 4 to 6. Among oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and the oxyethylene group is more preferable.

The amine compound having a phenoxy group can be obtained by heating a mixture of a primary or secondary amine having a phenoxy group and a haloalkyl ether to perform a reaction, then adding an aqueous solution of a strong base (for example, sodium hydroxide, potassium hydroxide, and tetraalkylammonium) to a reaction system, and extracting the reaction product with an organic solvent (for example, ethyl acetate and chloroform). Alternatively, the amine compound having a phenoxy group can also be obtained by heating a mixture of a primary or secondary amine and a haloalkyl ether having a phenoxy group at the terminal to perform a reaction, then adding an aqueous solution of a strong base to the reaction system, and extracting the reaction product with an organic solvent.

The compound (DB) whose basicity is reduced or lost upon irradiation with actinic rays or radiation (hereinafter also referred to as a "compound (DB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following general formula.

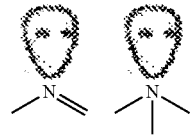

 Unshared electron pair

Preferred examples of the partial structure of the proton-accepting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

With regard to specific examples of the compound (DB), reference can be made to those described in paragraphs <0421> to <0428> of JP2014-041328A or paragraphs <0108> to <0116> of JP2014-134686A, the contents of which are incorporated herein by reference.

Specific examples of the basic compound (DA) and the compound (DB) are set forth below, but the present invention is not limited.

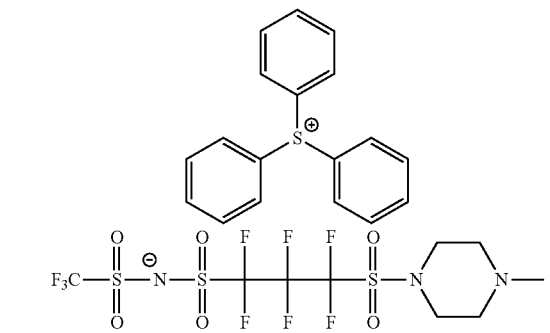
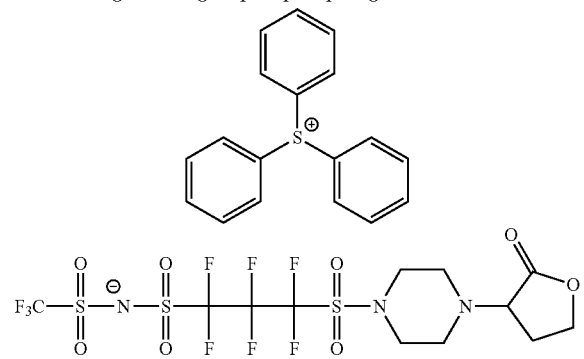
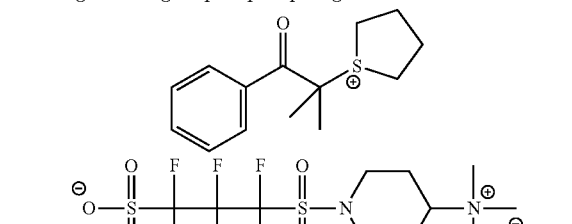
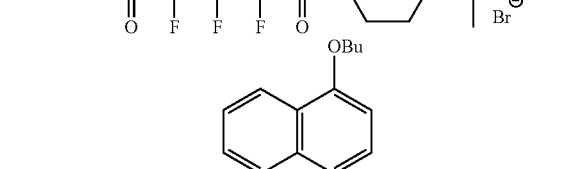
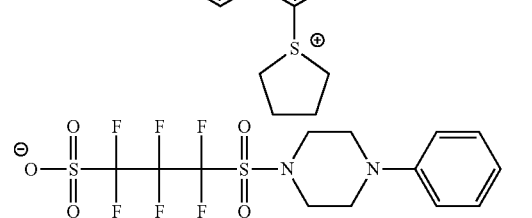

-continued

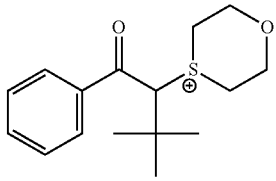
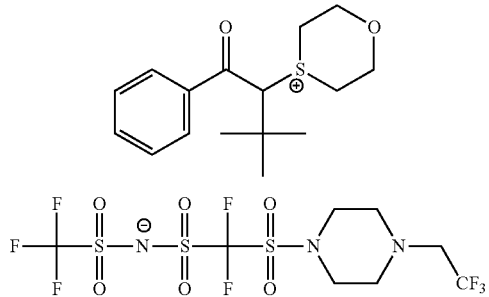
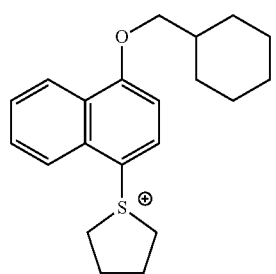
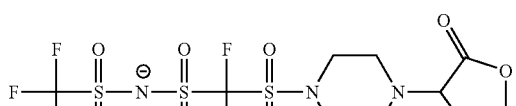
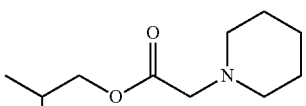
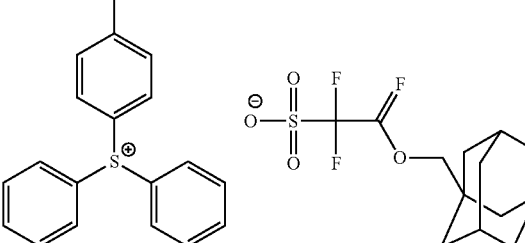
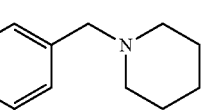
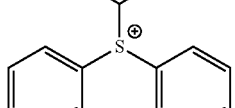
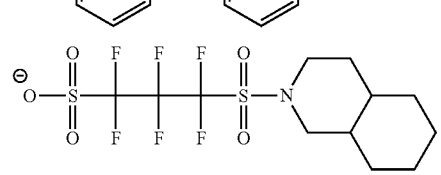
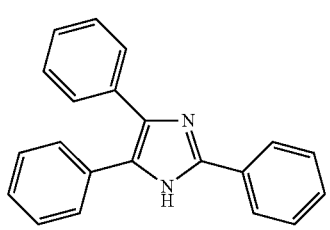

-continued

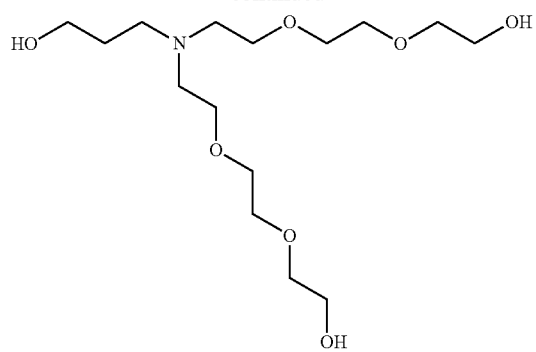

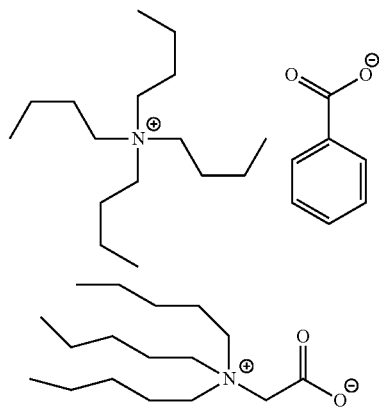

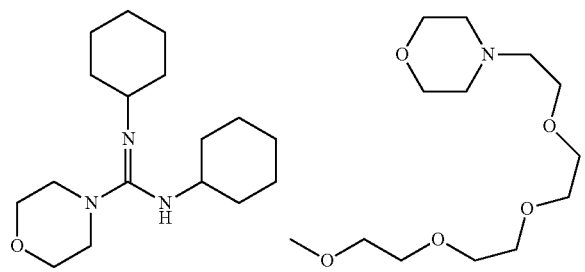

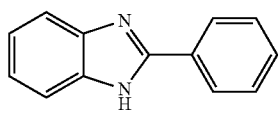

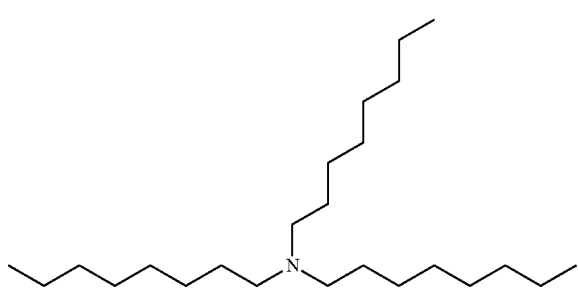

-continued

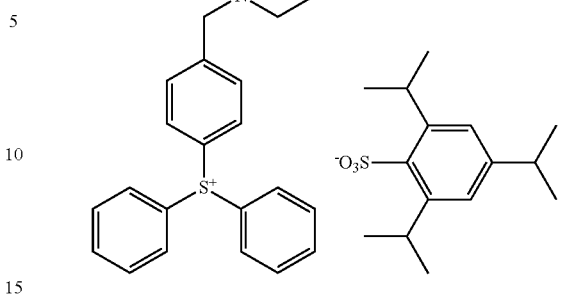

The acid diffusion control agents may be used singly or in combination of two or more kinds thereof.

The content of the acid diffusion control agent (a total content in a case where the acid diffusion control agents are present in plural kinds) in the composition of the embodiment of the present invention is preferably 0.001% to 10% by mass, and more preferably 0.01% to 7% by mass, with respect to the total solid content of the composition.

Moreover, as the acid diffusion control agent, for example, the compounds (amine compounds, amido group-containing compounds, urea compounds, nitrogen-containing heterocyclic compounds, and the like) described in paragraphs <0140> to <0144> of JP2013-011833A can also be used.

<Hydrophobic Resin>

The composition of the embodiment of the present invention may include a hydrophobic resin which is different from the resin (A), in addition to the resin (A).

Although it is preferable that the hydrophobic resin is designed to be unevenly distributed on a surface of the resist film, it does not necessarily need to have a hydrophilic group in its molecule as different from the surfactant, and does not need to contribute to uniform mixing of polar materials and nonpolar materials.

Examples of the effect of addition of the hydrophobic resin include control of static and dynamic contact angles of a surface of the resist film with respect to water and suppression of out gas.

The hydrophobic resin preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds. Incidentally, the hydrophobic resin preferably has a hydrocarbon group having 5 or more carbon atoms. These groups may be contained in the main chain of the resin or may be substituted in the side chain.

In a case where hydrophobic resin includes a fluorine atom and/or a silicon atom, the fluorine atom and/or the silicon atom in the hydrophobic resin may be included in the main chain or the side chain of the resin.

In a case where the hydrophobic resin includes a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom, and may further have a substituent other than a fluorine atom.

Examples of the repeating unit having a fluorine atom or a silicon atom include the repeating units exemplified in paragraph <0519> of US2012/0251948A1.

Moreover, it is also preferable that the hydrophobic resin includes a CH$_3$ partial structure in the side chain moiety, as described above.

Here, the CH$_3$ partial structure contained in a side chain moiety in the hydrophobic resin includes a CH$_3$ partial structure contained in an ethyl group, a propyl group, a butyl group, or the like.

On the other hand, a methyl group bonded directly to the main chain of the hydrophobic resin (for example, an α-methyl group in the repeating unit having a methacrylic acid structure) makes only a small contribution to uneven distribution on the surface of the hydrophobic resin due to the effect of the main chain, and it is therefore not included in the CH$_3$ partial structure as mentioned herein.

Examples of a form in which a CH$_3$ partial structure in a side chain moiety is not directly bonded to the main chain include an aspect in which the bond is formed via a divalent linking group other than an alkylene group between a CH$_3$ partial structure in a side chain moiety and the main chain. Examples of the divalent linking group other than an alkylene group include an ester group and an arylene group (preferably a phenylene group).

With regard to the hydrophobic resin, reference can be made to the description in paragraphs <0348> to <0415> of JP2014-010245A, the contents of which are incorporated herein by reference.

Furthermore, the resins described in JP2011-248019A, JP2010-175859A, and JP2012-032544A can also be preferably used, in addition to the resins described above, as the hydrophobic resin.

The weight-average molecular weight of the hydrophobic resin in terms of standard polystyrene is preferably 1,000 to 100,000, and more preferably 1,000 to 50,000.

The total content of residual monomers and/or oligomer components included in the hydrophobic resin is preferably 0.01% to 5% by mass, and more preferably 0.01% to 3% by mass. Further, the dispersity (Mw/Mn) is preferably in the range of 1 to 5, and more preferably in the range of 1 to 3.

Examples of a monomer corresponding to the repeating unit constituting the hydrophobic resin are set forth below.

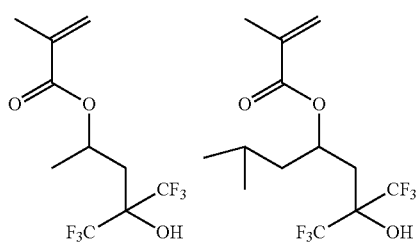

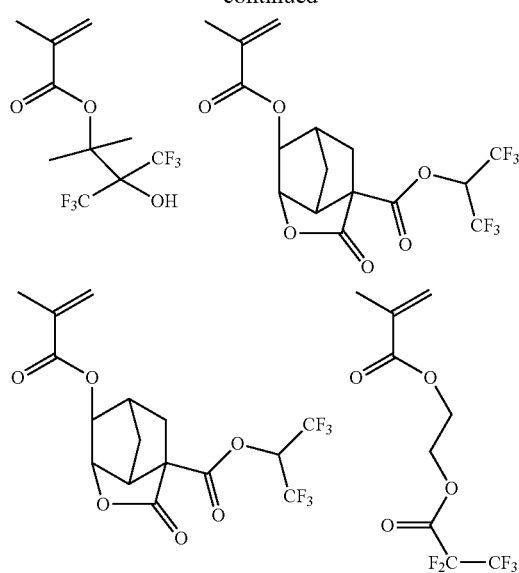

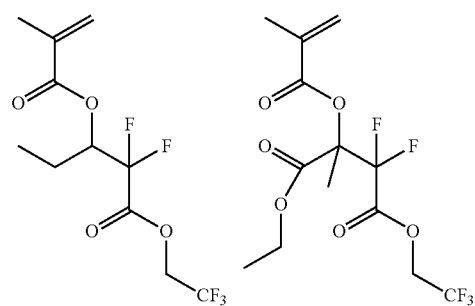

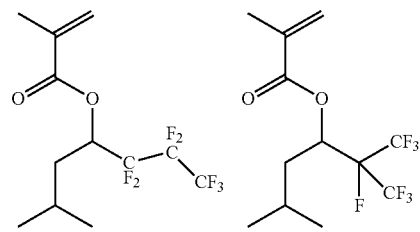

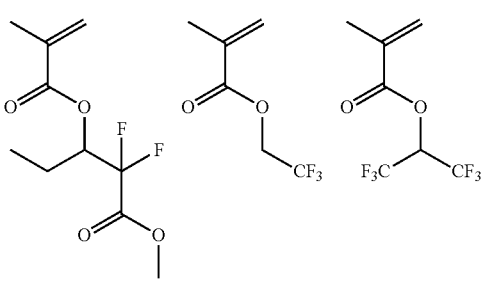

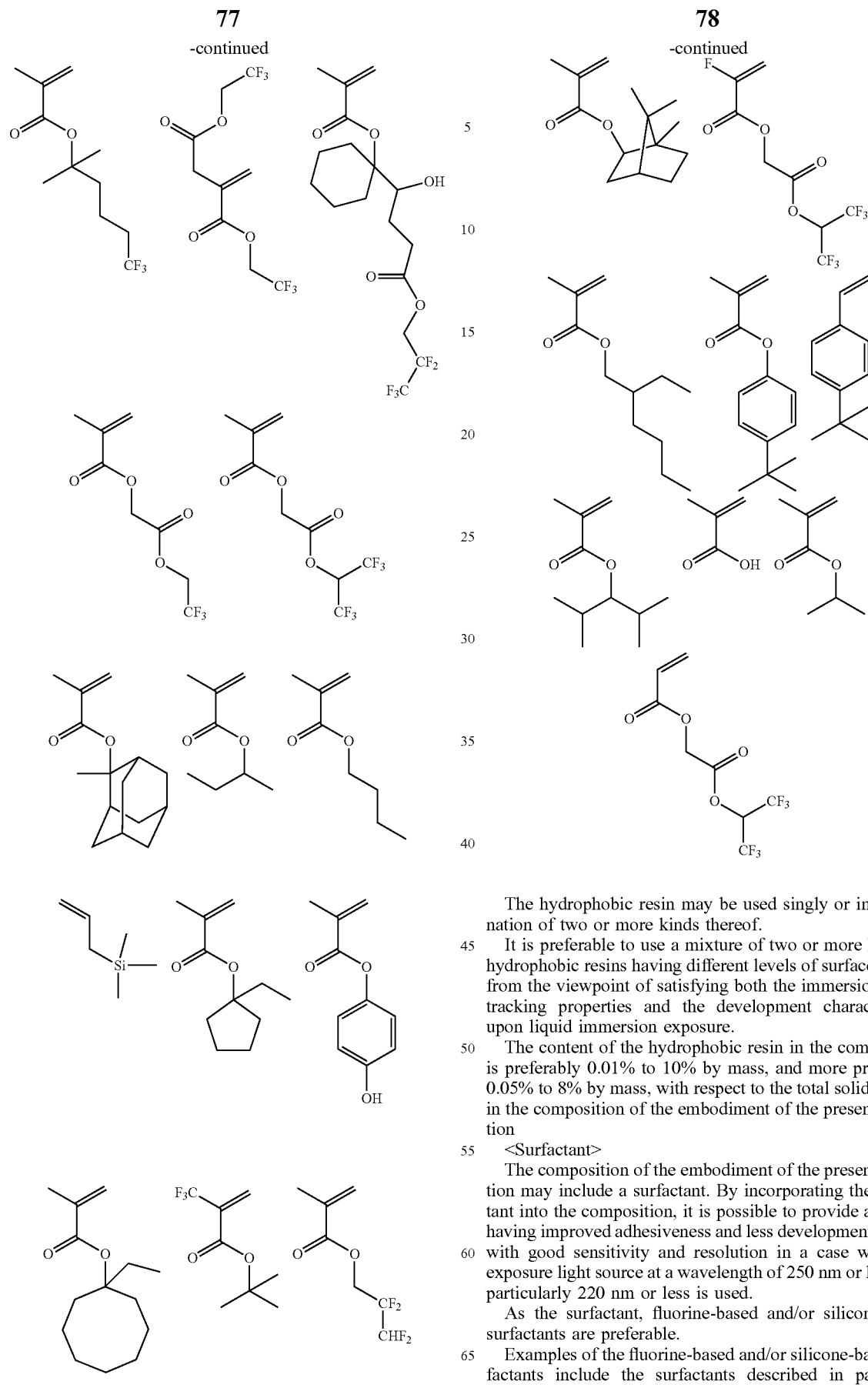

The hydrophobic resin may be used singly or in combination of two or more kinds thereof.

It is preferable to use a mixture of two or more kinds of hydrophobic resins having different levels of surface energy from the viewpoint of satisfying both the immersion liquid tracking properties and the development characteristics upon liquid immersion exposure.

The content of the hydrophobic resin in the composition is preferably 0.01% to 10% by mass, and more preferably 0.05% to 8% by mass, with respect to the total solid content in the composition of the embodiment of the present invention <Surfactant>

The composition of the embodiment of the present invention may include a surfactant. By incorporating the surfactant into the composition, it is possible to provide a pattern having improved adhesiveness and less development defects with good sensitivity and resolution in a case where an exposure light source at a wavelength of 250 nm or less, and particularly 220 nm or less is used.

As the surfactant, fluorine-based and/or silicone-based surfactants are preferable.

Examples of the fluorine-based and/or silicone-based surfactants include the surfactants described in paragraph <0276> in US2008/0248425A. In addition, EFTOP EF301 and EF303 (manufactured by Shin-Akita Chemical Co., Ltd.); FLUORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.), TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); KH-20 (manufactured by Asahi Kasei Co., Ltd.); or FTX-204Q 208Q 218Q 230Q 204D, 208D, 212D, 218D, and 222D (manufactured by NEOS Co., Ltd.) may be used. In addition, a polysiloxane polymer KP-341 (manufactured by Shin-Etsu Chemical Co., Ltd.) can also be used as the silicone-based surfactant.

Moreover, in addition to the known surfactants as shown above, a surfactant may be synthesized using a fluoro aliphatic compound manufactured using a telomerization method (also referred to as a telomer method) or an oligomerization method (also referred to as an oligomer method). Specifically, a polymer including a fluoro aliphatic-group derived from fluoro aliphatic compound may be used as the surfactant. This fluoro aliphatic compound can be synthesized, for example, by the method described in JP2002-090991A.

In addition, a surfactant other than the fluorine-based surfactant and/or the silicone-based surfactants described in <0280> of US2008/0248425A may be used.

These surfactants may be used singly or in combination of two or more kinds thereof.

The content of the surfactant in the composition of the embodiment of the present invention is 0.0001% to 2% by mass, and more preferably 0.0005% to 1% by mass, with respect to the total solid content of the composition.

<Solvent>

The composition of the embodiment of the present invention may include a solvent.

The solvent preferably includes at least any one of the following component (M1) or the following component (M2), and among these, the solvent more preferably includes the following component (M1).

In a case where the solvent includes the following component (M1), it is preferable that the solvent is substantially formed of the component (M1) or is a mixed solvent including at least the component (M1) and the component (M2).

Hereinafter, the component (M1) and the component (M2) will be shown.

Component (M1): Propylene glycol monoalkyl ether carboxylate

Component (M2): A solvent selected from the following component (M2-1) or a solvent selected from the following component (M2-1)

Component (M2-1): Propylene glycol monoalkyl ether, lactic acid ester, acetic acid ester, butyl butyrate, alkoxypropionic acid ester, chained ketone, cyclic ketone, lactone, or alkylene carbonate Component (M2-2): Another solvent having a flash point of 37° C. or higher.

In case where the solvent and the above-mentioned resin (A) are used in combination, the coatability of the composition is improved and a pattern having a less number of development defects is obtained. Although a reason therefor is not necessarily clear, it is considered that the solvent has a good balance among the solubility, the boiling point, and the viscosity of the above-mentioned resin (A), and therefore, unevenness in the film thickness of a resist film, generation of precipitates during spin coating, and the like can be suppressed.

As the component (M1), at least one selected from the group consisting of propylene glycol monomethyl ether acetate (PGMEA), propylene glycol monomethyl ether propionate, and propylene glycol monoethyl ether acetate is preferable, and the propylene glycol monomethyl ether acetate (PGMEA) is more preferable.

As the component (M2-1), the following ones are preferable.

As the propylene glycol monoalkyl ether, propylene glycol monomethyl ether (PGME) or propylene glycol monoethyl ether is preferable.

As the lactic acid ester, ethyl lactate, butyl lactate, or propyl lactate is preferable.

As the acetic acid ester, methyl acetate, ethyl acetate, butyl acetate, isobutyl acetate, propyl acetate, isoamyl acetate, methyl formate, ethyl formate, butyl formate, propyl formate, or 3-methoxybutyl formate is preferable.

As the alkoxy propionic acid ester, methyl 3-methoxypropionate (MMP), or ethyl 3-ethoxypropionate (EEP) is preferable.

As the chained ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the lactone, γ-butyrolactone is preferable.

As the alkylene carbonate, propylene carbonate is preferable.

As the component (M2-1), propylene glycol monomethyl ether (PGME), ethyl lactate, ethyl 3-ethoxypropionate, methyl amyl ketone, cyclohexanone, butyl acetate, pentyl acetate, γ-butyrolactone, or propylene carbonate is more preferable.

Specific examples of the component (M2-2) include methyl 2-hydroxyisobutyrate (flash point: 45° C.).

In addition, the "flash point" as mentioned herein means the value described in a reagent catalog of Tokyo Chemical Industry Co., Ltd. or Sigma-Aldrich Co. LLC.

The mixing ratio (mass ratio: M1/M2) of the component (M1) to the component (M2) is preferably 100/0 to 15/85, more preferably 100/0 to 40/60, and still more preferably 100/0 to 60/40, from the viewpoint that the number of development defects is further decreased.

Moreover, the solvent may include components other than the component (M1) and the component (M2). In this case, the content of the components other than the components (M1) and (M2) is preferably 5% to 30% by mass with respect to the total mass of the solvent.

Examples of such other solvents include ester-based solvents having 7 or more carbon atoms (preferably 7 to 14 carbon atoms, more preferably 7 to 12 carbon atoms, and still more preferably 7 to 10 carbon atoms) and 2 or less heteroatoms. Furthermore, the ester-based solvents having 7 or more carbon atoms and 2 or less heteroatoms do not include solvents corresponding to the above-mentioned component (M2).

As the ester-based solvents having 7 or more carbon atoms and 2 or less heteroatoms, amyl acetate, 2-methylbutyl acetate, 1-methylbutyl acetate, hexyl acetate, pentyl propionate, hexyl propionate, butyl propionate, isobutyl isobutyrate, heptyl propionate, butyl butanoate, or the like is preferable, and isoamyl acetate is more preferable.

<Other Additives>

The composition of the embodiment of the present invention may further include a dissolution inhibiting compound (a compound whose solubility in an organic developer decreases through decomposition by the action of an acid, with a molecular weight thereof being preferably 3,000 or less), a dye, a plasticizer, a light sensitizer, a light absorber, and/or a compound that accelerates dissolution in a developer (for example, a phenol compound having a molecular weight of 1,000 or less, or an alicyclic or aliphatic compound including a carboxy group).

<Preparation Method>

The concentration of the solid content in the composition of the embodiment of the present invention is preferably 0.5% to 30% by mass, and more preferably 1% to 20% by mass, from the viewpoint that the coatability is more excellent. The concentration of the solid content is a mass percentage of other resist components excluding the solvent with respect to the total mass of the composition.

The composition of the embodiment of the present invention is used by dissolving the components in a predetermined organic solvent (preferably the mixed solvent), and preferably the mixed solvent, and filtering the solution through a filter and applying it onto a predetermined support (substrate). The pore size of a filter for use in filtration through the filter is preferably pore size of 0.1 µm or less, more preferably 0.05 µm or less, and still more preferably 0.03 µm or less. The filter is preferably a polytetrafluoroethylene-made, polyethylene-made, or nylon-made filter. In the filtration through a filter, circulating filtration may be performed or the filtration may be performed by connecting plural kinds of filters in series or in parallel, for example, as disclosed in JP2002-062667A. In addition, the composition may be filtered in plural times. Furthermore, the composition may be subjected to a deaeration treatment or the like before or after filtration through a filter.

<Applications>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

[Pattern Forming Method]

The present invention also relates to a pattern forming method using the actinic ray-sensitive or radiation-sensitive resin composition. Hereinafter, the pattern forming method of the embodiment of the present invention will be described. In addition, the resist film of the embodiment of the present invention will also be described, together with the pattern forming method.

The procedure of the pattern forming method is not particularly limited, but preferably includes the following steps:

Step 1: A step of forming a resist film (actinic ray-sensitive or radiation-sensitive film) on a substrate with an actinic ray-sensitive or radiation-sensitive resin composition (the composition of the embodiment of the present invention)

Step 2: A step of exposing the resist film (irradiating actinic rays or radiation)

Step 3: A step of developing the exposed resist film with a developer

Hereinafter, the procedure of each of the steps will be described in detail.

<Step 1: Resist Film Forming Step>

The step 1 is a step of forming a resist film on a substrate with the composition of the embodiment of the present invention.

The definition of the composition of the embodiment of the present invention is as described above.

Examples of a method in which a resist film is formed on a substrate with the composition of the embodiment of the present invention include a method in which the composition of the embodiment of the present invention is applied onto a substrate.

In addition, it is preferable that the composition of the embodiment of the present invention before the application is filtered through a filter, as desired. The pore size of the filter is preferably 0.1 µm or less, more preferably 0.05 µm or less, and still more preferably 0.03 µm or less. Further, the filter is preferably a polytetrafluoroethylene-made, polyethylene-made, or nylon-made filter.

The composition of the embodiment of the present invention is applied onto a substrate (for example, a silicon- or silicon dioxide-coated substrate) as used for the manufacture of an integrated circuit element, by an appropriate application method such as a method using a spinner, a coater, or the like. The spin application using a spinner is preferable as the coating method. The rotation speed upon the spin application using a spinner is preferably 1,000 to 3,000 rpm.

After the application of the composition of the embodiment of the present invention, the substrate may be dried to form a resist film. In addition, various base films (an inorganic film, an organic film, an antireflection film, and the like) may be formed below the resist film, as desired.

Examples of the drying method include a method of performing drying by heating. The heating can usually be performed using a means comprised in a typical exposure and/or developing machine, and may be performed using a hot plate or the like. The heating temperature is preferably 80° C. to 150° C., more preferably 80° C. to 140° C., and still more preferably 80° C. to 130° C. The heating time is preferably 30 to 1,000 seconds, more preferably 60 to 800 seconds, and still more preferably 60 to 600 seconds.

The film thickness of the resist film is not particularly limited, but from the viewpoint that a more accurate fine pattern can be formed, the film thickness is preferably 10 to 65 nm, and more preferably 15 to 50 nm.

Moreover, a topcoat may be formed on the upper layer of the resist film using a topcoat composition.

It is preferable that the topcoat composition is not mixed with the resist film and can be uniformly applied onto the upper layer of the resist film.

In addition, it is preferable that the resist film is dried before forming the topcoat. Subsequently, a topcoat composition can be applied onto the obtained resist film by the same means as for the method for forming the resist film, and further dried to form a topcoat.

The film thickness of the topcoat is preferably 10 to 200 nm, more preferably 20 to 100 nm, and still more preferably 40 to 80 nm.

The topcoat is not particularly limited, a topcoat known in the related art can be formed by the methods known in the related art, and a topcoat can be formed in accordance with, for example, the description in paragraphs <0072> to <0082> of JP2014-059543A.

It is preferable that a topcoat including a basic compound as described in JP2013-061648A, for example, is formed on a resist film. Specific examples of the basic compound which can be included in the topcoat include the basic compounds which may be included in the composition of the embodiment of the present invention.

In addition, the topcoat preferably includes a compound including at least one of a group or bond selected from the group consisting of an ether bond, a thioether bond, a hydroxyl group, a thiol group, a carbonyl bond, and an ester bond.

<Step 2: Exposing Step>

The step 2 is a step of exposing the resist film.

Examples of the exposing method include a method in which the resist film thus formed is irradiated with light through a predetermined mask.

The light source wavelength used in the exposing step is not particularly limited, and examples thereof include infrared rays, visible light, ultraviolet rays, far ultraviolet rays, extreme ultraviolet rays (EUV), X-rays, and electron beams. Among those, far ultraviolet rays are preferable, whose wavelength is preferably 250 nm or less, more preferably 220 nm or less, and still more preferably 1 to 200 nm. Specific examples thereof include a KrF excimer laser (248 nm), an ArF excimer laser (193 nm), an $F_2$ excimer laser (157 nm), X-rays, EUV (13 nm), and electron beams, and the KrF excimer laser, the ArF excimer laser, EUV, or the electron beams are preferable.

After exposure, it is preferable to perform baking (heating) before performing development. The reaction of the exposure area is accelerated by baking, and the sensitivity and the pattern shape become better.

The heating temperature is preferably 80° C. to 150° C., more preferably 80° C. to 140° C., and still more preferably 80° C. to 130° C.

The heating time is preferably 10 to 1,000 seconds, more preferably 10 to 180 seconds, and still more preferably 30 to 120 seconds.

Heating may be performed using a means comprised in an exposure device and/or a development device, or may also be performed using a hot plate or the like.

This step is also referred to as post-exposure baking (PEB).

<Step 3: Developing Step>

The step 3 is a step of developing the exposed resist film using an alkali developer to form a pattern.

Examples of the developing method include a method in which a substrate is dipped in a tank filled with a developer for a certain period of time (a dip method), a method in which a developer is heaped up to the surface of a substrate by surface tension and developed by maintaining for a certain period of time (a puddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In addition, a step of stopping development while replacing the solvent with another solvent may be performed after the step of performing development.

The developing time is not particularly limited as long as it is a period of time where the resin in the unexposed area is sufficiently dissolved, and the developing time is preferably 10 to 300 seconds, and more preferably 20 to 120 seconds.

The temperature of the developer is preferably 0° C. to 50° C., and more preferably 15° C. to 35° C.

The developer used in the developing step may be either an alkali developer or a developer containing an organic solvent (hereinafter also referred to as an organic developer), and is preferably the alkali developer.

As the alkali developer, an aqueous alkali solution including an alkali is preferably used. The type of the aqueous alkali solution is not particularly limited, but examples of the aqueous alkali solution include aqueous alkali solutions of quaternary ammonium salts typified by tetramethylammonium hydroxide, an inorganic alkali, primary amines, secondary amines, tertiary amines, alcohol amines, cyclic amines, or the like. Among those, the aqueous solutions of the quaternary ammonium salts typified by tetramethylammonium hydroxide (TMAH) are preferable as the alkali developer. To the alkali developer may be added an appropriate amount of alcohols, a surfactant, or the like. The alkali concentration of the alkali developer is usually 0.1% to 20% by mass. In addition, the pH of the alkali developer is usually 10.0 to 15.0.

As the organic developer, a developer including at least one organic solvent selected from the group consisting of a ketone-based solvent, an ester-based solvent, an alcohol-based solvent, an amide-based solvent, an ether-based solvent, and hydrocarbon-based solvents is preferable.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs <0715> to <0718> of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass, with respect to the total amount of the developer.

The developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include the above-mentioned acid diffusion control agent.

A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

The pattern forming method preferably includes a step of performing washing using a rinsing liquid after the step 3.

Examples of the rinsing liquid used in the rinsing step after the step of performing development with an alkali developer include pure water. In addition, an appropriate amount of a surfactant may be added to pure water.

An appropriate amount of the surfactant may be added to the rinsing liquid.

The rinsing liquid used in the rinsing step after the step of performing development using a developer including an organic solvent is not particularly limited as long as the rinsing liquid is a rinsing liquid not dissolving the resist pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the amide-based solvent, and the ether-based solvent include the same solvents as those described for the developer including an organic solvent.

As the rinsing liquid used in the rinsing step in this case, a rinsing liquid including a monohydric alcohol is more preferable.

Examples of the monohydric alcohol used in the rinsing step include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in plural number may be mixed or the components may be used in admixture with an organic solvent other than the above solvents.

The moisture content in the rinsing liquid in a case where a solution including an organic solvent is used as the rinsing liquid is preferably 10% by mass or less, more preferably 5% by mass or less, and still more preferably 3% by mass or less. By setting the moisture content to 10% by mass or less, good development characteristics are obtained.

The rinsing liquid in a case where a solution including an organic solvent is used as the rinsing liquid may include an appropriate amount of a surfactant.

A method for the rinsing step is not particularly limited, but examples thereof include a method in which a rinsing liquid is continuously discharged on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method).

Furthermore, the pattern forming method of the embodiment of the present invention may include a heating step (post-baking) after the rinsing step. By the present step, the developer and the rinsing liquid that remain between the patterns and inside the pattern are removed by baking. Furthermore, an effect that the resist pattern is annealed to improve the surface roughness of a pattern is obtained by the present step. The heating step after the rinsing step is usually performed at a heating temperature of 40° C. to 250° C. (preferably 90° C. to 200° C.), usually for 10 seconds to 3 minutes (preferably for 30 seconds to 120 seconds).

Moreover, an etching treatment of a substrate may be carried out using the formed pattern as a mask. That is, the substrate (or the underlayer film and the substrate) may be processed using the pattern formed in the step 3 as a mask, thereby forming a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern formed in the step 3 as a mask is preferable.

The dry etching may be either one-stage etching or multi-stage etching. In a case where the etching is etching including a plurality of stages, the etchings at the respective stages may be the same treatment or different treatments.

For etching, any of known methods can be used, and various conditions and the like are appropriately determined according to the type of a substrate, usage, and the like. Etching can be carried out, for example, in accordance with The International Society for Optical Engineering (Proc. of SPIE), Vol. 6924, 692420 (2008), JP2009-267112A, and the like. In addition, etching can also be carried out in accordance with "Chapter 4 Etching" in "Semiconductor Process Text Book, $4^{th}$ Ed., published in 2007, publisher: SEMI Japan".

Among those, as the dry etching, oxygen plasma etching is preferable.

It is preferable that various materials (for example, a solvent, a developer, a rinsing liquid, a composition for forming an antireflection film, and a composition for forming a topcoat) used in the composition of the embodiment of the present invention and the pattern forming method of the embodiment of the present invention do not include impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Pb, Ti, V, W, and Zn.

Examples of a method for removing impurities such as metals from the various materials include filtration using a filter. As for the filter pore diameter, the pore size is preferably less than 100 nm, more preferably 10 nm or less, and still more preferably 5 nm or less. As the filter, a polytetrafluoroethylene-made, polyethylene-made, or nylon-made filter is preferable. The filter may be constituted with a composite material formed by combining the filter material with an ion exchange medium. As the filter, a filter which had been washed with an organic solvent in advance may be used. In the step of filtration using a filter, a plurality of kinds of filters may be connected in series or in parallel, and used. In a case of using the plurality of kinds of filters, a combination of filters having different pore diameters and/or materials may be used. In addition, various materials may be filtered plural times, and the step of filtering plural times may be a circulatory filtration step.

In the production of the composition of the embodiment of the present invention, it is preferable that after dissolving a resin and the respective components such as a photoacid generator in a solvent, circulatory filtration is performed using a plurality of filters with different materials. For example, it is preferable to connect a polyethylene-made filter with a pore diameter of 50 nm, a nylon-made filter with a pore diameter of 10 nm, and a polyethylene-made filter with a pore diameter of 3 nm in permuted connection, and then perform circulatory filtration ten times or more. A smaller pressure difference among the filters is preferable, and the pressure difference is generally 0.1 MPa or less, preferably 0.05 MPa or less, and more preferably 0.01 MPa or less. A smaller pressure difference between the filter and the charging nozzle is also preferable, and the pressure difference is generally 0.5 MPa or less, preferably 0.2 MPa or less, and more preferably 0.1 MPa or less.

It is preferable to subject the inside of a device for producing the composition of the embodiment of the present invention to gas replacement with inert gas such as nitrogen. In this manner, it is possible to suppress active gas such as oxygen from being dissolved in the composition.

After being filtered by a filter, the composition of the embodiment of the present invention is charged into a clean container. It is preferable that the composition of the embodiment of the present invention charged in the container is subjected to cold storage. In this manner, performance degradation over time is suppressed. A shorter period of time between completion of the charge of the composition into the container and initiation of refrigeration storage is preferable, and it is generally up to 24 hours, preferably up to 16 hours, more preferably up to 12 hours, and still more preferably up to 10 hours. The storage temperature is preferably 0° C. to 15° C., more preferably 0° C. to 10° C., and still more preferably 0° C. to 5° C.

Moreover, examples of the method for reducing the impurities such as a metal included in various materials include a method of selecting raw materials having a low content of metals as raw materials constituting various materials, a method of subjecting raw materials constituting various materials to filtration using a filter, and a method of performing distillation under the condition with the contamination suppressed as much as possible by, for example, lining the inside of a device with TEFLON (registered trademark).

In addition to filtration using a filter, removal of impurities by an adsorbing material may be performed, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used. It is necessary to prevent the incorporation of metal impurities in the production process in order to reduce the impurities such as metals included in the various materials. Sufficient removal of metal impurities from a production device can be checked by measuring the content of metal components included in a washing liquid used to wash the production device. The content of the metal components included in the washing liquid after the use is preferably 100 parts per trillion (ppt) by mass or less, more preferably 10 ppt by mass or less, and still more preferably 1 ppt by mass or less.

An electrically conductive compound may be added to an organic treatment liquid such as a rinsing liquid in order to prevent failure of chemical liquid pipe and various parts (a filter, an O-ring, a tube, or the like) due to electrostatic charge, and subsequently generated electrostatic discharge. The electrically conductive compound is not particularly limited and examples thereof include methanol. The addition amount is not particularly limited, but from the viewpoint that preferred development characteristics or rinsing characteristics are maintained, the addition amount is preferably 10% by mass or less, and more preferably 5% by mass or less.

For the chemical liquid pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or a fluorine resin (a polytetrafluoroethylene or perfluoroalkoxy resin, or the like) that has been subjected to an antistatic treatment can be used.

A method for improving the surface roughness of a pattern may be applied to a pattern formed by the method of the present invention. Examples of the method for improving the surface roughness of the pattern include the method of treating a pattern by plasma of a hydrogen-containing gas disclosed in WO2014/002808A1. Additional examples of the method include known methods as described in JP2004-235468A, US2010/0020297A, JP2008-083384A, and Proc. of SPIE Vol. 8328 83280N-1 "EUV Resist Curing Technique for LWR Reduction and Etch Selectivity Enhancement".

In a case where a pattern formed is in the form of a line, an aspect ratio determined by dividing a height of the pattern with a line width is preferably 2.5 or less, more preferably 2.1 or less, and still more preferably 1.7 or less.

In a case where a pattern formed is in the form of a trench (groove) pattern or a contact hole pattern, an aspect ratio determined by dividing a height of the pattern with the trench width or the hole diameter is preferably 4.0 or less, more preferably 3.5 or less, and still more preferably 3.0 or less.

The pattern forming method of the embodiment of the present invention can also be used for guide pattern formation in a directed self-assembly (DSA) (see, for example, ACS Nano Vol. 4, No. 8, Pages 4815-4823).

In addition, a pattern formed by the method can be used as a core material (core) of the spacer process disclosed in, for example, JP1991-270227A (JP-H03-270227A) and JP2013-164509A.

[Method for Manufacturing Electronic Device]

Moreover, the present invention further relates to a method for manufacturing an electronic device, the method including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention should not be construed as being limited to the Examples shown below.

[Actinic Ray-Sensitive or Radiation-Sensitive Resin Composition]

The components used in the production of the actinic ray-sensitive or radiation-sensitive resin compositions tested in Examples and Comparative Examples will be described below.

<Resin (A)>

The repeating units contained in the resin (resin (A)) included in the actinic ray-sensitive or radiation-sensitive resin compositions tested in Examples and Comparative Examples will be set forth below.

(Repeating Unit Having Acid-Decomposable Group Represented by General Formula (1))

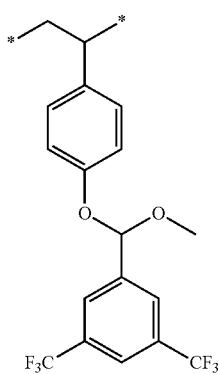
(a-1)

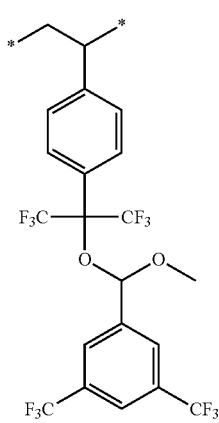
(a-2)

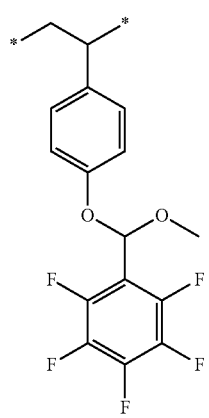
(a-3)

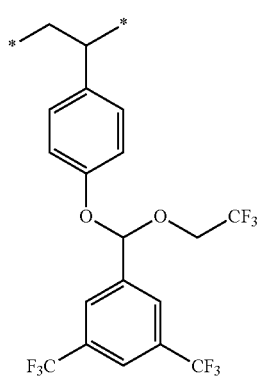
(a-4)

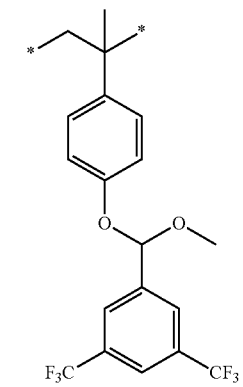
(a-5)

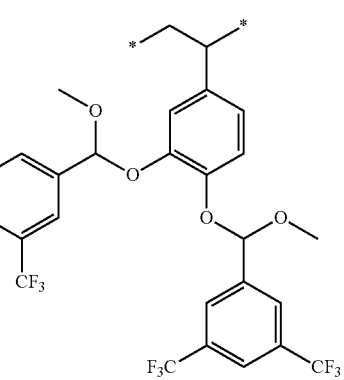
(a-6)

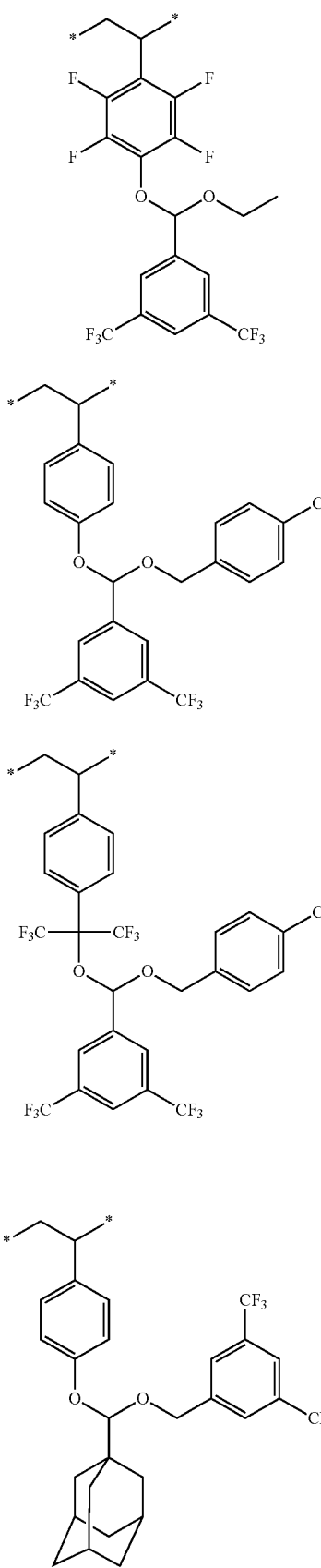
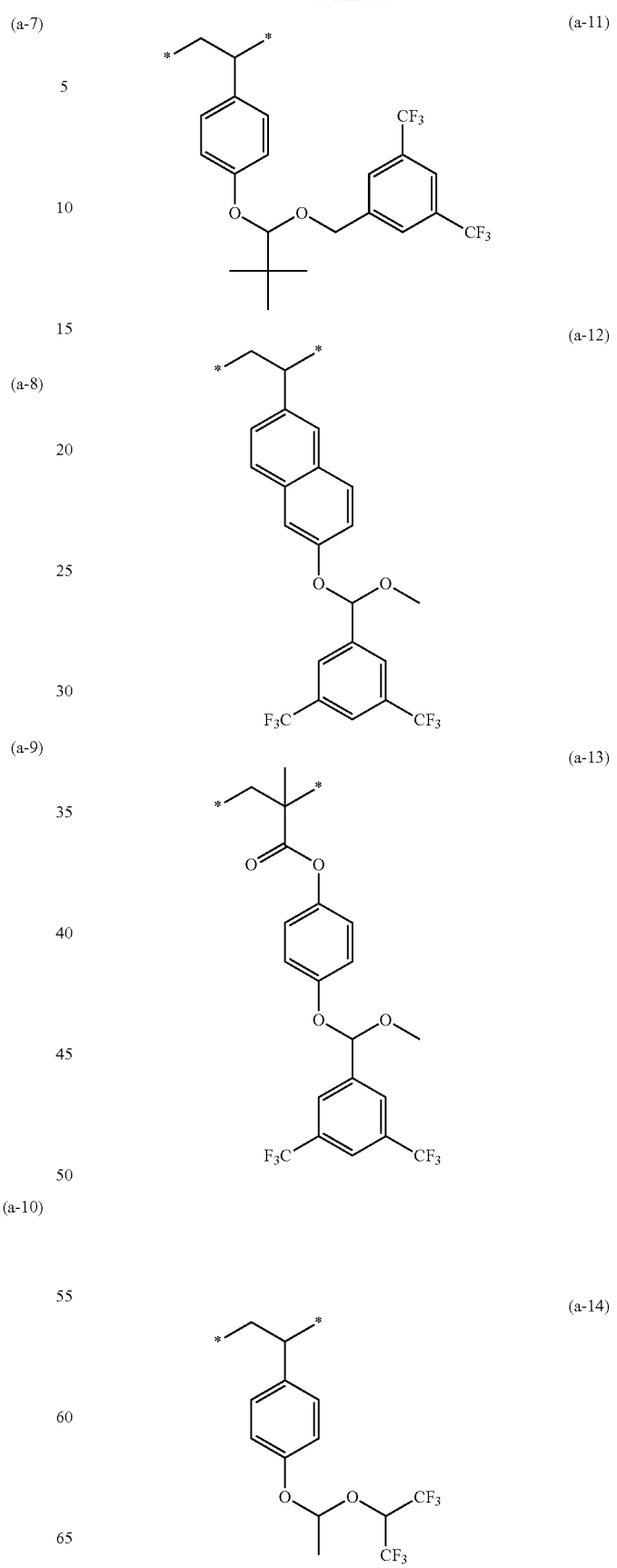

(a-15)
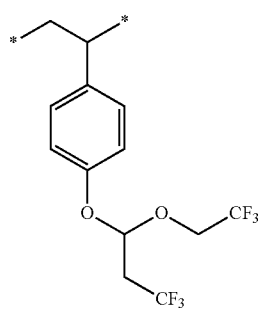
(a-16)
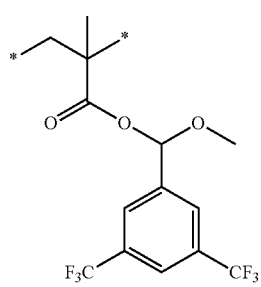
(a-17)
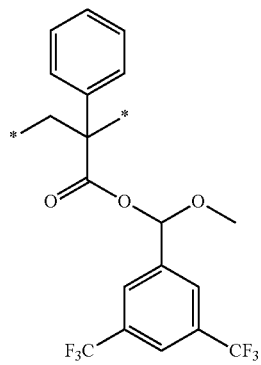
(a-18)
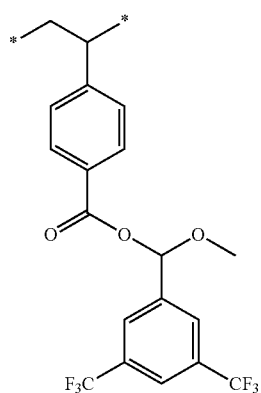
(a-19)
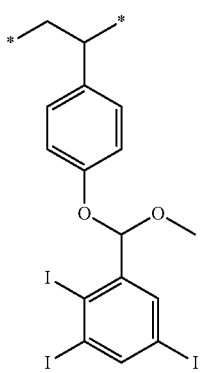
(Repeating Unit Having Acid Decomposable Group Other than Group Represented by General Formula (1))
(ra-1)
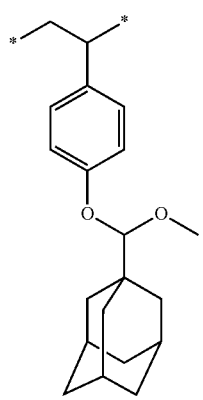
(ra-2)
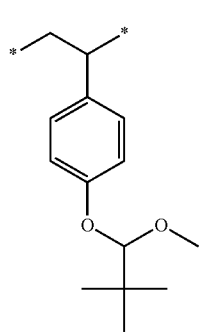
(ra-3)
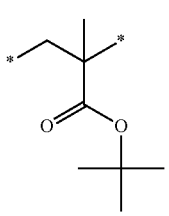

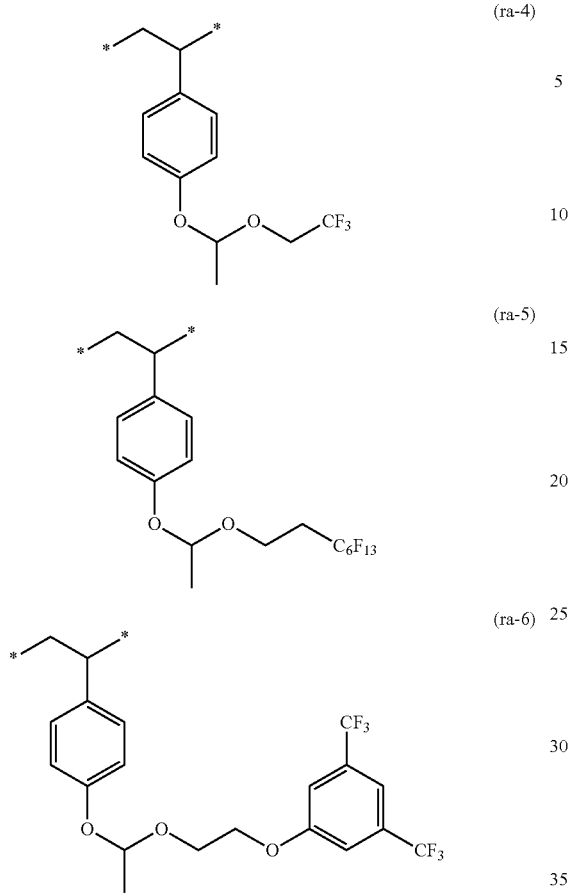
(Repeating Unit Having Fluorine Atom and Having No Acid-Decomposable Group)
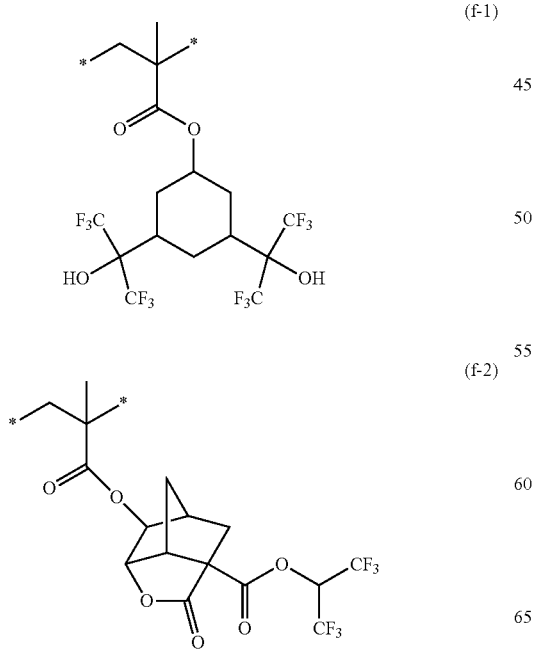
(Other Repeating Units Having No Fluorine Atom)
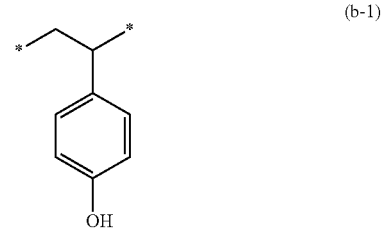

(b-2)
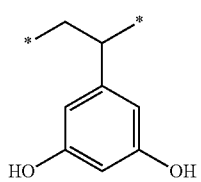
(b-3)
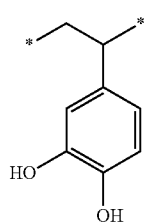
(b-4)
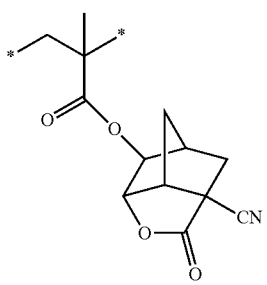
(b-5)
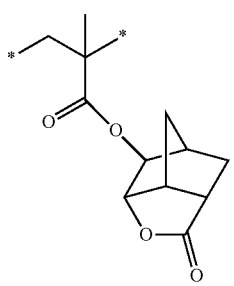
(b-6)
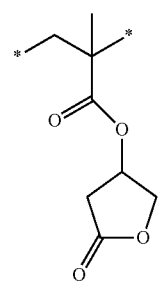
(b-7)
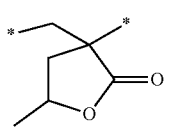
(b-8)
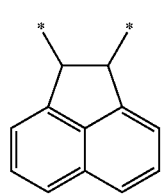
(b-9)
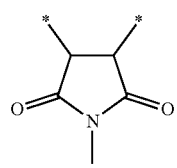
Synthesis Examples: Synthesis Example for Resin (A-1)
A resin (A-1) was synthesized according to the following scheme.
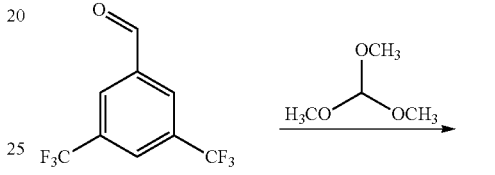
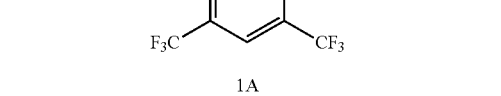
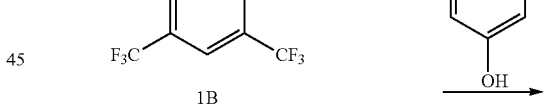
(a-1)

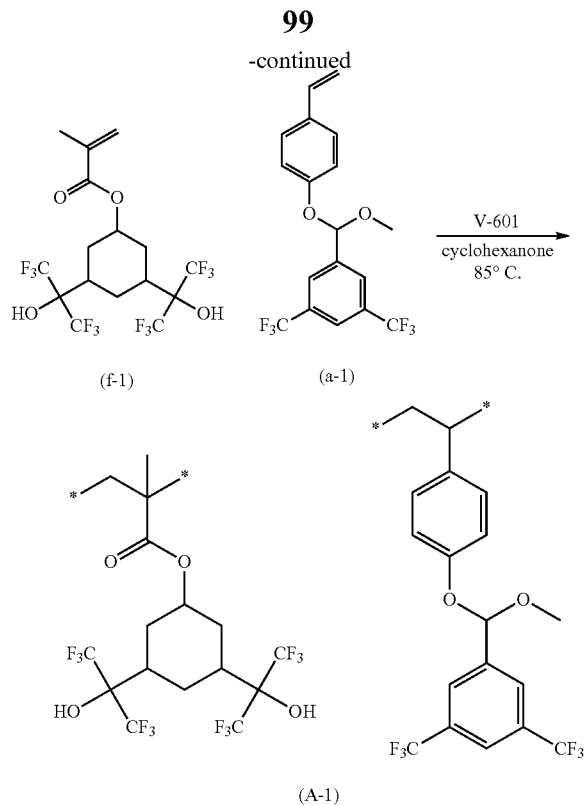

(f-1)  (a-1)

(A-1)

Synthesis of Intermediate (1B)

Trimethyl orthoformate (26.3 g, 248 mmol) and (±)-10-camphorsulfonic acid (0.104 g, 0.45 mmol) were mixed to obtain a mixed liquid. While the obtained mixed liquid was ice-cooled, 3,5-ditrifluoromethyl benzaldehyde (60 g, 248 mmol) was added to the mixed liquid. The mixed liquid was returned to room temperature (23° C.) and left to stand overnight to obtain a mixed liquid including an intermediate (1A). The mixed liquid including an intermediate (1A) was used for the next reaction without purification.

The obtained mixed liquid including an intermediate (1A) was heated to 50° C. and then acetyl chloride (17.5 g, 223 mmol) was added dropwise to the mixed liquid. Zinc bromide (50 mg) was further added to the mixed liquid, and then the mixed liquid was heated and stirred at 50° C. for 8 hours. The mixed liquid was cooled to room temperature (23° C.) and then low-boiling point components in the mixed liquid were evaporated under reduced pressure to obtain 54 g (yield: 74%) of an intermediate (1B).

Synthesis of Monomer (a-1)

A mixed liquid formed by mixing p-hydroxystyrene (4.9 g, 41 mmol), triethylamine (61 mmol), and acetonitrile (23 g) was obtained. While the obtained mixed liquid was ice-cooled, the intermediate (1B) (12 g, 41 mmol) obtained above was added to the mixed liquid. The mixed liquid was returned to room temperature and stirred for 3 hours, and then ethyl acetate (40 g) and distilled water (40 g) were added to the mixed liquid to perform a liquid separation operation. The organic phase was washed three times with distilled water and then the obtained organic phase was dehydrated over sodium sulfate. The organic phase was filtered and then the solvent in the organic phase was evaporated under reduced pressure. The obtained residue was purified by silica gel column chromatography (eluent: ethyl acetate/n-hexane=1/99 (volume ratio)) to obtain 12 g of a monomer (a-1) (yield: 78%).

The results from the measurement of the obtained monomer (a-1) by means of $^1$H-nuclear magnetic resonance (NMR) were found as follows.

$^1$H-NMR (Acetone-d6: ppm) δ: 8.20 (s, 2H), 8.10 (s, 1H), 7.43 (d, 2H), 7.14 (d, 2H), 6.70 (dd, 1H), 6.50 (s, 1H), 5.70 (d, 1H), 5.15 (d, 1H), 3.46 (s, 3H)

Synthesis of Resin (A-1)

A monomer (f-1) (9.9 g), a monomer (a-1) (6.6 g), and a polymerization initiator V-601 (0.39 g, manufactured by Wako Pure Chemical Industries, Co., Ltd.) were dissolved in cyclohexanone (23.7 g) to obtain a mixed liquid. Cyclohexanone (10.7 g) was added into a reaction container and the mixed liquid was added dropwise to the system at 85° C. for 4 hours under a nitrogen gas atmosphere. After completion of the dropwise addition, this reaction solution was further heated and stirred for 2 hours, and then the reaction solution was left to be cooled to room temperature (23° C.). Cyclohexanone (51 g) was added to the reaction solution, then this reaction solution was added dropwise to a mixed solution of methanol and water (methanol/water=6/4 (mass ratio)) (1,017 g) to precipitate a polymer in the mixed solution, and the polymer was collected by filtration. The obtained polymer was washed with a mixed solution of methanol and water (methanol/water=6/4 (mass ratio)) (305 g) and then dried under reduced pressure to obtain a resin (A-1) (7.4 g).

The weight-average molecular weight (Mw) obtained by the measurement of the resin (A-1) by means of GPC was 14,000. The molecular weight dispersity (Mw/Mn) was 1.6.

The results from the measurement of the obtained resin (A-1) by means of $^1$H-nuclear magnetic resonance (NMR) were found as follows.

$^1$H-NMR (DMSO-d6: ppm) δ: 8.28-7.61, 7.14-6.09, 4.75-4.05, 3.31-3.20, 2.58-0.83 (peaks were all broad)

While monomers to be used were changed as appropriate, the resins (A-1) to (A-71) and the resins (R-1) to (R-7) shown in Table 1 were synthesized in the same manner as in Synthesis Examples.

In addition, the weight-average molecular weight (Mw) and the dispersity (Mw/Mn) in Table 1 are values in terms of polystyrene as determined by a GPC method, and the compositional ratios were values calculated from $^1$H-NMR, $^{13}$C-NMR, or $^{19}$F-NMR.

In Table 1, the section of "Unit having acid-decomposable group" shows repeating units having an acid-decomposable group.

In Table 1, the section of "General Formula (1)" shows repeating units having an acid-decomposable group represented by General Formula (1), contained in the resin.

In Table 1, the section of "Other than General Formula (1)" shows repeating units having an acid-decomposable group other than the group represented by General Formula (1), contained in the resin.

In Table 1, the section of "Non-Acid-Decomposable Unit Having Fluorine Atom" shows repeating units having a fluorine atom and having no acid-decomposable group, contained in the resin.

In Table 1, the section of "Other Units" shown other repeating units having no fluorine atom, contained in the resin.

TABLE 1

| | Unit having acid-decomposable group | | Non-acid-decomposable unit having fluorine atom | | Other units | | | | |
|---|---|---|---|---|---|---|---|---|---|
| | General Formula (1) | Others than General Formula (1) | 1 | 2 | 1 | 2 | Compositional ratio (mass ratio) | Mw | Mw/Mn |
| A-1 | a-1 | | f-1 | | | | a-1/f-1 = 35/65 | 14,000 | 1.6 |
| A-2 | a-1 | | f-1 | | | | a-1/f-1 = 35/65 | 7,000 | 1.6 |
| A-3 | a-1 | | f-1 | | | | a-1/f-1 = 50/50 | 6,000 | 1.6 |
| A-4 | a-1 | | | | b-1 | | a-1/b-1 = 35/65 | 5,000 | 1.5 |
| A-5 | a-1 | | f-1 | | b-4 | | a-1/f-1/b-4 = 30/40/30 | 6,000 | 1.5 |
| A-6 | a-1 | | f-1 | | b-4 | | a-1/f-1/b-4 = 30/50/20 | 6,000 | 1.5 |
| A-7 | a-1 | ra-2 | f-1 | | b-4 | | a-1/ra-2/f-1/b-4 = 20/10/40/30 | 6,000 | 1.7 |
| A-8 | a-1 | ra-3 | f-1 | | b-4 | | a-1/ra-3/f-1/b-4 = 25/15/40/20 | 6,000 | 1.7 |
| A-9 | a-1 | | f-1 | | b-5 | | a-1/f-1/b-5 = 30/50/20 | 7,000 | 1.6 |
| A-10 | a-1 | | f-1 | | b-5 | | a-1/f-1/b-5 = 40/40/20 | 6,000 | 1.6 |
| A-11 | a-1/a-14 | | f-1 | | b-5 | | a-1/a-14/f-1/b-5 = 20/10/40/30 | 5,000 | 1.6 |
| A-12 | a-1 | | f-1 | f-2 | | | a-1/f-1/f-2 = 40/40/20 | 6,000 | 1.4 |
| A-13 | a-1 | | f-1 | | b-6 | | a-1/f-1/b-6 = 40/40/20 | 6,000 | 1.6 |
| A-14 | a-1 | | f-1 | | b-7 | | a-1/f-1/b-7 = 40/40/20 | 7,000 | 1.6 |
| A-15 | a-1 | | f-1 | f-7 | b-5 | | a-1/f-1/f-7/b-5 = 30/40/10/20 | 6,000 | 1.6 |
| A-16 | a-1 | | f-1 | | b-4 | b-8 | a-1/f-1/b-4/b-8 = 30/40/20/10 | 6,000 | 1.6 |
| A-17 | a-1 | | f-1 | | b-4 | b-9 | a-1/f-1/b-4/b-9 = 30/40/20/10 | 5,000 | 1.5 |
| A-18 | a-1 | | f-4 | | | | a-1/f-4 = 35/65 | 6,000 | 1.6 |
| A-19 | a-1 | | f-5 | | | | a-1/f-5 = 35/65 | 7,000 | 1.6 |
| A-20 | a-1 | | f-6 | | b-4 | | a-1/f-6/b-4 = 30/40/30 | 6,000 | 1.6 |
| A-21 | a-1 | | f-4 | | b-1 | b-5 | a-1/f-4/b-1 = b-5 = 30/30/20/20 | 6,000 | 1.6 |
| A-22 | a-1 | | f-1 | | b-3 | b-5 | a-1/f-1/b-3/b-5 = 30/30/20/20 | 5,000 | 1.5 |
| A-23 | a-1 | | f-7 | | b-2 | | a-1/f-7/b-2 = 40/40/20 | 7,000 | 1.6 |
| A-24 | a-1 | | f-3 | | b-5 | | a-1/f-3/b-5 = 40/30/30 | 6,000 | 1.5 |
| A-25 | a-2 | | f-4 | | | | a-2/f-4 = 35/65 | 6,000 | 1.6 |
| A-26 | a-2 | | f-4 | | | | a-2/f-4 = 50/50 | 5,000 | 1.5 |
| A-27 | a-2 | | f-4 | | b-5 | | a-2/f-4/b-5 = 30/50/20 | 6,000 | 1.5 |
| A-28 | a-2 | | f-1 | | b-4 | | a-2/f-1/b-4 = 30/50/20 | 6,000 | 1.6 |
| A-29 | a-3 | | f-1 | | b-4 | | a-3/f-1/b-4 = 30/40/30 | 7,000 | 1.6 |
| A-30 | a-3 | | f-1 | | b-4 | b-9 | a-3/f-1/b-4/b-9 = 30/40/20/10 | 8,000 | 1.7 |
| A-31 | a-3 | | f-3 | | b-5 | | a-3/f-3/b-5 = 40/30/30 | 7,000 | 1.6 |
| A-32 | a-4 | | f-1 | | | | a-4/f-1 = 35/65 | 7,000 | 1.6 |
| A-33 | a-4 | | f-1 | | b-6 | | a-4/f-1/b-6 = 50/30/20 | 6,000 | 1.6 |
| A-34 | a-5 | | f-1 | | b-4 | | a-5/f-1/b-4 = 30/40/30 | 6,000 | 1.5 |
| A-35 | a-5 | | f-1 | f-2 | | | a-5/f-1/f-2 = 40/40/20 | 6,000 | 1.6 |
| A-36 | a-6 | | f-1 | | b-4 | | a-6/f-1/b-4 = 20/50/30 | 7,000 | 1.6 |
| A-37 | a-6 | | | | b-3 | b-5 | a-6/b-3/b-5 = 30/40/30 | 5,000 | 1.5 |
| A-38 | a-6 | | f-1 | f-7 | b-5 | | a-6/f-1/f-7/b-5 = 30/40/10/20 | 9,000 | 1.6 |
| A-39 | a-7 | | f-3 | | | | a-7/f-3 = 50/50 | 7,000 | 1.6 |
| A-40 | a-7 | | f-3 | | b-5 | | a-7/f-3/b-5 = 40/30/30 | 7,000 | 1.7 |

| | Unit having acid-decomposable group | | Unit having acid-decomposable group | | Non-acid-decomposable unit having fluorine atom | | | | |
|---|---|---|---|---|---|---|---|---|---|
| | General Formula (1) | Others than General Formula (1) | 1 | 2 | 1 | 2 | Compositional ratio (mass ratio) | Mw | Mw/Mn |
| A-41 | a-7 | | f-5 | | | | a-7/f-5 = 35/65 | 7,000 | 1.5 |
| A-42 | a-8 | | f-1 | | | | a-8/f-1 = 35/65 | 7,000 | 1.6 |
| A-43 | a-8 | | f-1 | f-7 | b-5 | | a-8/f-1/f-7/b-5 = 30/40/10/20 | 8,000 | 1.7 |
| A-44 | a-8 | | f-1 | | b-5 | b-9 | a-8/f-1/b-5/b-9 = 30/40/20/10 | 9,000 | 1.8 |
| A-45 | a-9 | | f-1 | | | | a-9/f-1 = 35/65 | 6,000 | 1.5 |
| A-46 | a-9 | | f-4 | | | | a-9/f-4 = 35/65 | 7,000 | 1.6 |
| A-47 | a-9 | | f-1 | | b-4 | | a-9/f-1/b-4 = 30/40/30 | 5,000 | 1.6 |
| A-48 | a-10 | | f-1 | | b-1 | | a-10/f-1/b-1 = 50/30/20 | 7,000 | 1.6 |
| A-49 | a-10 | | f-5 | | | | a-10/f-5 = 35/65 | 7,000 | 1.6 |
| A-50 | a-11 | | f-1 | | | | a-11/f-1 = 35/65 | 7,000 | 1.5 |
| A-51 | a-11 | | f-1 | | b-4 | | a-11/f-1/b-4 = 30/40/30 | 6,000 | 1.6 |
| A-52 | a-11 | | f-1 | | b-4 | b-9 | a-11/f-1/b-4/b-9 = 30/40/20/10 | 6,000 | 1.6 |
| A-53 | a-12 | | f-1 | | b-5 | | a-12/f-1/b-5 = 30/50/20 | 7,000 | 1.6 |
| A-54 | a-12 | | f-1 | f-2 | | | a-12/f-1/f-2 = 30/50/20 | 9,000 | 1.5 |
| A-55 | a-13 | | f-1 | | | | a-13/f-1 = 35/65 | 7,000 | 1.6 |
| A-56 | a-13 | | f-4 | | b-5 | | a-13/f-4/b-5 = 40/40/20 | 6,000 | 1.5 |
| A-57 | a-14 | | f-1 | | b-4 | | a-14/f-1/b-4 = 30/40/30 | 7,000 | 1.6 |
| A-58 | a-14 | | f-1 | | b-4 | b-9 | a-14/f-1/b-4/b-9 = 30/35/20/15 | 9,000 | 1.8 |
| A-59 | a-14 | | f-1 | | b-3 | b-5 | a-14/f-1/b-3/b-5 = 30/30/20/20 | 5,000 | 1.5 |
| A-60 | a-15 | | | | b-1 | | a-15/b-1 = 50/50 | 5,000 | 1.5 |
| A-61 | a-15 | | f-1 | | b-5 | | a-15/f-1/b-5 = 30/35/35 | 6,000 | 1.5 |
| A-62 | a-16 | | f-1 | | b-4 | | a-16/f-1/b-4 = 40/40/20 | 6,000 | 1.6 |
| A-63 | a-16 | | f-1 | | b-4 | b-9 | a-16/f-1/b-4/b-9 = 35/35/20/10 | 8,000 | 1.8 |

TABLE 1-continued
| | | | | | | | |
|---|---|---|---|---|---|---|---|
| A-64 | a-16 | | f-1 | f-2 | b-5 | a-16/f-1/f-2/b-5 = 30/40/10/20 | 8,000 | 1.6 |
| A-65 | a-17 | | | | b-1 | a-17/b-1 = 50/50 | 5,000 | 1.5 |
| A-66 | a-17 | | f-4 | | b-6 | a-17/f-4/b-6 = 30/40/30 | 8,000 | 1.6 |
| A-67 | a-17 | | f-3 | | b-5 | a-17/f-3/b-5 = 40/30/30 | 7,000 | 1.6 |
| A-68 | a-18 | | | | b-3 | a-18/b-3 = 50/50 | 5,000 | 1.5 |
| A-69 | a-18 | | f-1 | | b-5 | a-18/f-1/b-5 = 30/40/30 | 10,000 | 1.8 |
| A-70 | a-18 | | f-4 | | b-4 | a-18/f-4/b-4 = 40/30/30 | 9,000 | 1.8 |
| A-71 | a-19 | | | | b-1 | a-19/b-1 = 50/50 | 5,000 | 1.5 |
| R-1 | | ra-1 | | | b-1 | ra-1/b-1 = 35/65 | 6,000 | 1.6 |
| R-2 | | ra-1 | f-1 | | | ra-1/f-1 = 35/65 | 7,000 | 1.6 |
| R-3 | | ra-2 | | | b-1 | ra-2/b-1 = 35/65 | 5,000 | 1.5 |
| R-4 | | ra-3 | f-1 | | | ra-3/f-1 = 35/65 | 7,000 | 1.6 |
| R-5 | | ra-4 | | | b-1 | ra-4/b-1 = 35/65 | 5,000 | 1.6 |
| R-6 | | ra-5 | | | b-1 | ra-5/b-1 = 35/65 | 5,000 | 1.5 |
| R-7 | | ra-6 | | | b-1 | ra-6/b-1 = 35/65 | 5,000 | 1.5 |
<Photoacid Generator>
Photoacid generators set forth below were used.
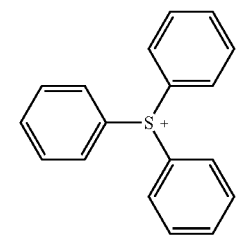
B-1
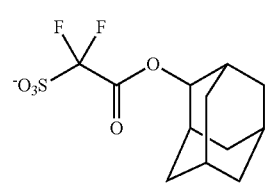
B-2
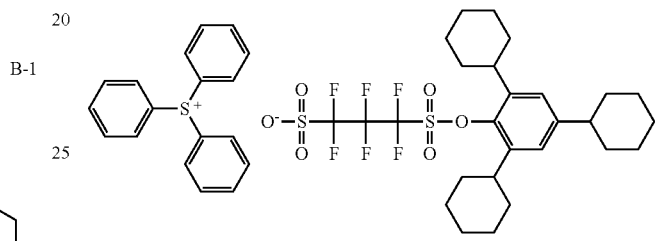
B-5
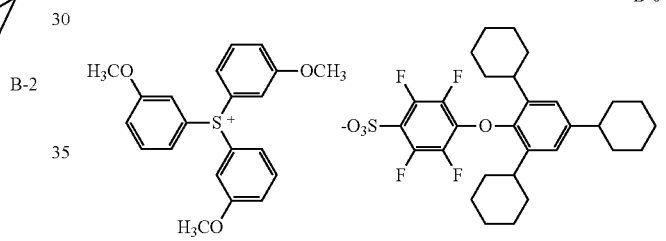
B-6
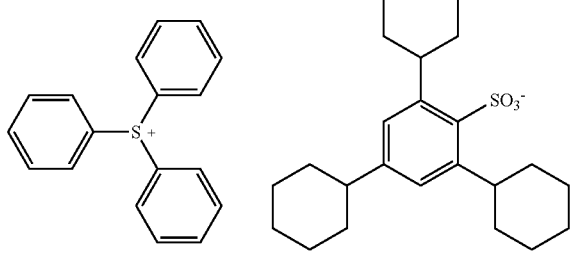
B-3
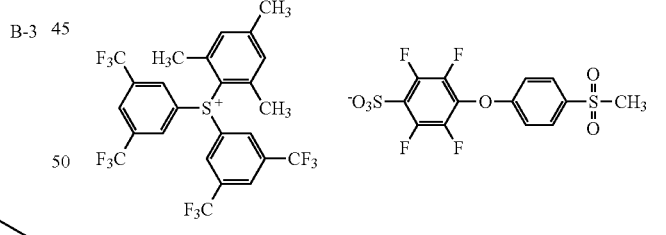
B-7
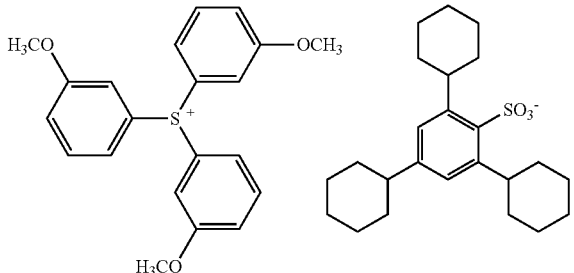
B-4
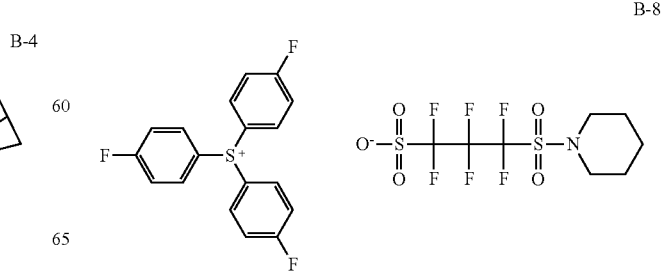
B-8

B-9
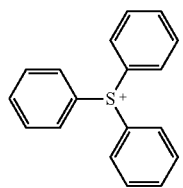 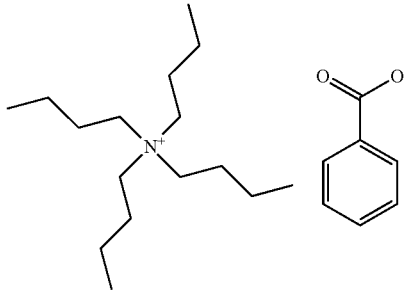
Q-4
B-10
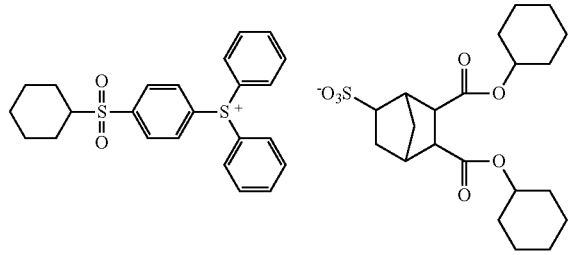
<Acid Diffusion Control Agent>
Acid diffusion control agents set forth below were used.
Q-1
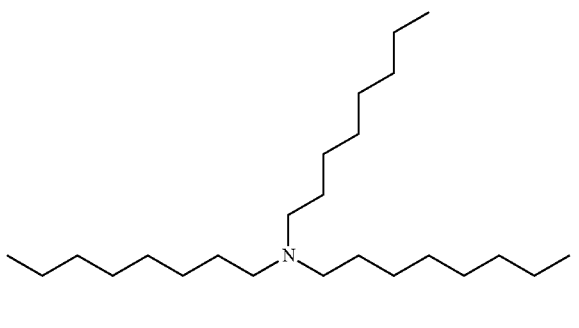
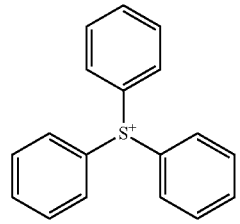
Q-5
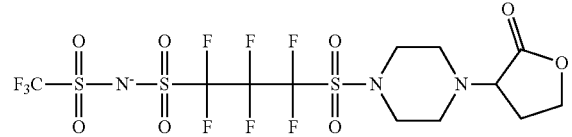
Q-6
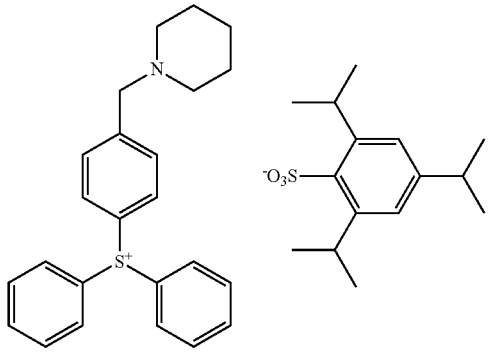
Q-2
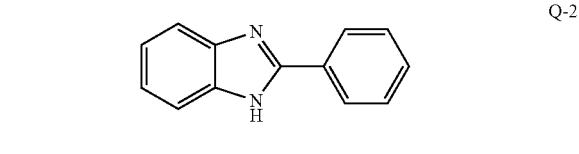
<Hydrophobic Resin>
Hydrophobic resins set forth below were used.
Furthermore, the numerical values in the structural formulae represent molar ratios of the respective repeating units with respect to the entire hydrophobic resin.
ADP-1
Q-3
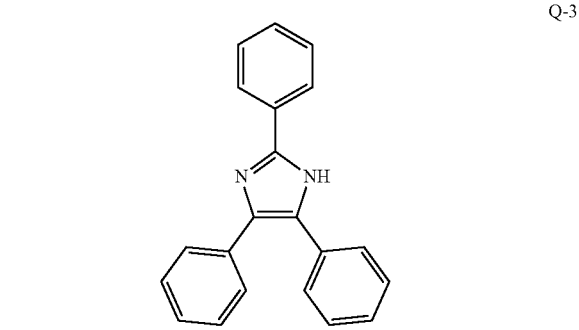
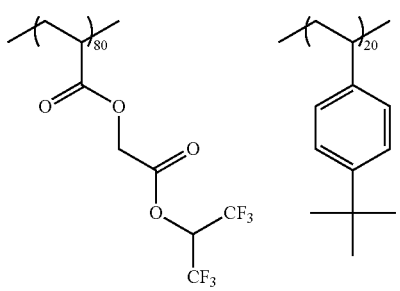
Mw = 14,000
Mw/Mn = 1.7

<Surfactant>
Surfactants set forth below were used.
W-1: MEGAFACE F176 (manufactured by DIC Corporation, fluorine-based)
W-2: MEGAFACE R08 (manufactured by DIC Corporation, fluorine and silicone-based)
<Solvent>
Solvents set forth below were used.
SL-1: Propylene glycol monomethyl ether acetate (PGMEA)
SL-2: Propylene glycol monomethyl ether (PGME)
SL-3: Ethyl lactate
SL-4: γ-Butyrolactone
SL-5: Cyclohexanone The above-mentioned respective components were mixed such that the concentration of the solid content and the composition shown in Table 2 were achieved. The obtained mixed liquid was filtered through a polyethylene filter having a pore size of 0.03 μm to obtain each of actinic ray-sensitive or radiation-sensitive resin compositions (hereinafter also referred to as "resist compositions"). In addition, in the resist composition, the solid content means all the components excluding the solvent. The obtained resist composition was used in Examples and Comparative Examples.

Furthermore, the content (% by mass) of each component in the section of "Resin", the section of "Photoacid generator", the section of "Acid diffusion control agent", and the section of "Hydrophobic resin or surfactant" indicates a ratio of each component with respect to the total solid content. The description in the section of "Solvent" indicates a mixing ratio (mass ratio) of each solvent.

TABLE 2

| | Resin (A) | | Photoacid generator | | Acid diffusion control agent | | Hydrophobic resin or surfactant | | Solvent | Concentration of solid content % by mass |
|---|---|---|---|---|---|---|---|---|---|---|
| | Type | % by mass | Type | % by mass | Type | % by mass | Type | % by mass | | |
| N-1 | A-1 | 74 | B-2 | 25 | Q-3 | 1 | | | SL-1/SL-2/SL-3 = 30/20/50 | 1.5 |
| N-2 | A-1 | 73.7 | B-2 | 25 | Q-3 | 1 | W-1 | 0.3 | SL-1/SL-3 = 60/40 | 1.5 |
| N-3 | A-2 | 74 | B-2 | 25 | Q-3 | 1 | | | SL-1/SL-3 = 60/40 | 1.5 |
| N-4 | A-2 | 74 | B-2 | 25 | Q-4 | 1 | | | SL-1/SL-4 = 80/20 | 1.5 |
| N-5 | A-2 | 79 | B-6 | 20 | Q-4 | 1 | | | SL-3 = 100 | 1.5 |
| N-6 | A-2 | 79 | B-9 | 20 | Q-4 | 1 | | | SL-1 = 100 | 1.5 |
| N-7 | A-3 | 79 | B-6 | 20 | Q-4 | 1 | | | SL-1/SL-3 = 80/20 | 1.5 |
| N-8 | A-4 | 79 | B-6 | 20 | Q-4 | 1 | | | SL-1/SL-3 = 80/20 | 1.5 |
| N-9 | A-4 | 75 | B-6 | 20 | Q-6 | 5 | | | SL-1/SL-3 = 60/40 | 1.5 |
| N-10 | A-5 | 70 | B-10 | 25 | Q-6 | 5 | | | SL-1/SL-2/SL-3 = 60/20/20 | 1.5 |
| N-11 | A-5 | 74 | B-2 | 25 | Q-4 | 1 | | | SL-1/SL-2/SL-3 = 30/20/50 | 1.5 |
| N-12 | A-5 | 69 | B-2 | 25 | Q-5 | 6 | | | SL-1/SL-3 = 50/50 | 1.5 |
| N-13 | A-5 | 74 | B-7 | 20 | Q-5 | 6 | | | SL-1/SL-2 = 80/20 | 1.5 |
| N-14 | A-5 | 79 | B-6 | 20 | Q-4 | 1 | | | SL-1/SL-2 = 70/30 | 1.5 |
| N-15 | A-5 | 74 | B-9 | 20 | Q-5 | 6 | | | SL-1/SL-4 = 90/10 | 1.5 |
| N-16 | A-2/A-5 | 34/45 | B-6 | 20 | Q-4 | 1 | | | SL-3/SL-4 = 95/5 | 1.5 |
| N-17 | A-6 | 69 | B-2 | 25 | Q-5 | 6 | | | SL-1/SL-3 = 80/20 | 1.5 |
| N-18 | A-6 | 79 | B-4 | 20 | Q-3 | 1 | | | SL-3 = 100 | 1.5 |
| N-19 | A-6 | 79 | B-5 | 20 | Q-4 | 1 | | | SL-1/SL-3/SL-4 = 30/60/10 | 1.5 |
| N-20 | A-6 | 74 | B-5 | 20 | Q-5 | 6 | | | SL-1/SL-3/SL-5 = 30/40/30 | 1.5 |
| N-21 | A-6 | 72 | B-2/B-4 | 10/12 | Q-5 | 6 | | | SL-1/SL-3 = 60/40 | 1.5 |
| N-22 | A-7 | 74 | B-2 | 25 | Q-4 | 1 | | | SL-1/SL-3 = 60/40 | 1.5 |
| N-23 | A-7 | 79 | B-5 | 20 | Q-4 | 1 | | | SL-1/SL-2/SL-3 = 30/20/50 | 1.5 |
| N-24 | A-8 | 79 | B-5 | 20 | Q-3 | 1 | | | SL-1/SL-2/SL-3 = 30/20/50 | 1.5 |
| N-25 | A-8 | 79 | B-1 | 20 | Q-3 | 1 | | | SL-1/SL-2 = 60/40 | 1.5 |
| N-26 | A-9 | 74 | B-5 | 20 | Q-5 | 6 | | | SL-1/SL-3 = 60/40 | 1.5 |
| N-27 | A-9 | 79 | B-5 | 20 | Q-2 | 1 | | | SL-3/SL-4 = 95/5 | 1.5 |
| N-28 | A-9 | 79 | B-5 | 20 | Q-3 | 1 | | | SL-1/SL-2/SL-3 = 30/20/50 | 1.5 |
| N-29 | A-9 | 79 | B-8 | 20 | Q-3 | 1 | | | SL-1/SL-2 = 60/40 | 1.5 |
| N-30 | A-10 | 79 | B-1 | 20 | Q-3 | 1 | | | SL-1/SL-3 = 60/40 | 1.5 |
| N-31 | A-10 | 74 | B-10 | 25 | Q-3 | 1 | | | SL-1/SL-2 = 60/40 | 1.5 |
| N-32 | A-10 | 79 | B-5 | 20 | Q-4 | 1 | | | SL-1/SL-2 = 60/40 | 1.5 |
| N-33 | A-10 | 79 | B-1 | 20 | Q-3 | 1 | | | SL-1 = 100 | 1.5 |
| N-34 | A-11 | 79 | B-6 | 20 | Q-4 | 1 | | | SL-3/SL-5 = 90/10 | 1.5 |
| N-35 | A-11 | 74 | B-7 | 20 | Q-5 | 6 | | | SL-1/SL-2 = 60/40 | 1.5 |
| N-36 | A-11 | 74 | B-4 | 20 | Q-5 | 6 | | | SL-1 = 100 | 1.5 |
| N-37 | A-12 | 74 | B-6 | 20 | Q-5 | 6 | | | SL-1/SL-2 = 60/40 | 1.5 |
| N-38 | A-12 | 74 | B-9 | 20 | Q-5 | 6 | | | SL-1/SL-2 = 70/30 | 1.5 |
| N-39 | A-12 | 74 | B-7 | 20 | Q-5 | 6 | | | SL-1/SL-3 = 60/40 | 1.5 |
| N-40 | A-13 | 74.2 | B-3 | 25 | Q-1 | 0.8 | | | SL-3/SL-5 = 80/20 | 1.5 |
| N-41 | A-14 | 79 | B-6 | 20 | Q-4 | 1 | | | SL-3/SL-5 = 90/10 | 1.5 |
| N-42 | A-14 | 79 | B-9 | 20 | Q-4 | 1 | | | SL-1/SL-2 = 60/40 | 1.5 |
| N-43 | A-14 | 74 | B-2 | 25 | Q-4 | 1 | | | SL-1/SL-2 = 60/40 | 1.5 |
| N-44 | A-14 | 75 | B-4 | 20 | Q-6 | 5 | | | SL-1/SL-2/SL-3 = 60/20/20 | 1.5 |
| N-45 | A-15 | 74 | B-6 | 20 | Q-5 | 6 | | | SL-1/SL-3 = 60/40 | 1.5 |
| N-46 | A-16 | 79 | B-5 | 20 | Q-3 | 1 | | | SL-1/SL-3 = 50/50 | 1.5 |
| N-47 | A-17 | 79 | B-5 | 20 | Q-3 | 1 | | | SL-1/SL-2/SL-3 = 30/20/50 | 1.5 |
| N-48 | A-18 | 79.2 | B-4 | 20 | Q-1 | 0.8 | | | SL-1/SL-2 = 60/40 | 1.5 |
| N-49 | A-18 | 79.2 | B-8 | 20 | Q-1 | 0.8 | | | SL-1/SL-2 = 80/20 | 1.5 |
| N-50 | A-19 | 79 | B-8 | 20 | Q-3 | 1 | | | SL-1/S1-2 = 70/30 | 1.5 |
| N-51 | A-20 | 79 | B-6 | 20 | Q-4 | 1 | | | SL-3 = 100 | 1.5 |
| N-52 | A-20 | 74 | B-3 | 25 | Q-4 | 1 | | | SL-1/SL-2 = 60/40 | 1.5 |
| N-53 | A-20 | 75 | B-1 | 20 | Q-6 | 5 | | | SL-1/SL-2/SL-3 = 60/20/20 | 1.5 |

TABLE 2-continued

| | Resin (A) | | Photoacid generator | | Acid diffusion control agent | | Hydrophobic resin or surfactant | | Solvent | Concentration of solid content |
|---|---|---|---|---|---|---|---|---|---|---|
| | Type | % by mass | Type | % by mass | Type | % by mass | Type | % by mass | | % by mass |
| N-54 | A-21 | 79 | B-8 | 20 | Q-3 | 1 | | | SL-1/SL-2 = 60/40 | 1.5 |
| N-55 | A-22 | 74 | B-3 | 25 | Q-3 | 1 | | | SL-1/SL-2/SL-3 = 30/20/50 | 1.5 |
| N-56 | A-22 | 79 | B-6 | 20 | Q-4 | 1 | | | SL-1/SL-3 = 60/40 | 1.5 |
| N-57 | A-23 | 74 | B-4 | 20 | Q-5 | 6 | | | SL-1/SL-3/SL-5 = 30/40/30 | 1.5 |
| N-58 | A-24 | 74 | B-3 | 25 | Q-2 | 1 | | | SL-1/SL-3 = 50/50 | 1.5 |
| N-59 | A-25 | 74 | B-2 | 25 | Q-3 | 1 | | | SL-1/SL-2/SL-3 = 30/20/50 | 1.5 |
| N-60 | A-25 | 79 | B-6 | 20 | Q-4 | 1 | | | SL-1/SL-3 = 60/40 | 1.5 |
| N-61 | A-26 | 74 | B-2 | 25 | Q-3 | 1 | | | SL-1/SL-2/SL-3 = 60/20/20 | 1.5 |
| N-62 | A-27 | 79 | B-8 | 20 | Q-3 | 1 | | | SL-1/SL-3 = 60/40 | 1.5 |
| N-63 | A-28 | 74 | B-7 | 20 | Q-5 | 6 | | | SL-1/SL-2 = 60/40 | 1.5 |
| N-64 | A-28 | 74 | B-8 | 20 | Q-5 | 6 | | | SL-1/SL-2 = 60/40 | 1.5 |
| N-65 | A-28 | 79 | B-8 | 20 | Q-4 | 1 | | | SL-1/SL-2 = 80/20 | 1.5 |
| N-66 | A-29 | 74 | B-3 | 25 | Q-3 | 1 | | | SL-1/SL-3 = 50/50 | 1.5 |
| N-67 | A-29 | 79 | B-5 | 20 | Q-3 | 1 | | | SL-1/SL-2/SL-3 = 30/20/50 | 1.5 |
| N-68 | A-30 | 74.2 | B-3 | 25 | Q-1 | 0.8 | | | SL-1/SL-4 = 90/10 | 1.5 |
| N-69 | A-31 | 70 | B-2 | 25 | Q-6 | 5 | | | SL-1/SL-3/SL-4 = 30/60/10 | 1.5 |
| N-70 | A-32 | 75 | B-6 | 20 | Q-6 | 5 | | | SL-1/SL-3 = 60/40 | 1.5 |
| N-71 | A-33 | 79 | B-1 | 20 | Q-3 | 1 | | | SL-1/SL-2 = 60/40 | 1.5 |
| N-72 | A-34 | 79 | B-6 | 20 | Q-4 | 1 | | | SL-1/SL-3 = 50/50 | 1.5 |
| N-73 | A-34 | 79 | B-9 | 20 | Q-4 | 1 | | | SL-1/SL-2 = 80/20 | 1.5 |
| N-74 | A-34 | 75 | B-4 | 20 | Q-6 | 5 | | | SL-1/SL-2/SL-3 = 30/20/50 | 1.5 |
| N-75 | A-35 | 74 | B-8 | 20 | Q-5 | 6 | | | SL-1/SL-2 = 70/30 | 1.5 |
| N-76 | A-36 | 79 | B-5 | 20 | Q-4 | 1 | | | SL-3/SL-5 = 90/10 | 1.5 |
| N-77 | A-36 | 74 | B-2 | 25 | Q-3 | 1 | | | SL-1/SL-3 = 60/40 | 1.5 |
| N-78 | A-37 | 75 | B-6 | 20 | Q-6 | 5 | | | SL-1/SL-2/SL-3 = 60/20/20 | 1.5 |
| N-79 | A-37 | 75 | B-4 | 20 | Q-6 | 5 | | | SL-1/SL-2 = 60/40 | 1.5 |
| N-80 | A-38 | 74 | B-4 | 20 | Q-5 | 6 | | | SL-1/SL-2/SL-3 = 30/20/50 | 1.5 |
| N-81 | A-39 | 78.5 | B-6 | 20 | Q-4 | 1 | W-2 | 0.5 | SL-1/SL-2/SL-3 = 60/20/20 | 1.5 |
| N-82 | A-39 | 79 | B-6 | 20 | Q-4 | 1 | | | SL-3/SL-5 = 90/10 | 1.5 |
| N-83 | A-39 | 70 | B-10 | 25 | Q-6 | 5 | | | SL-1/SL-2/SL-3 = 30/20/50 | 1.5 |
| N-84 | A-40 | 75 | B-6 | 20 | Q-6 | 5 | | | SL-1/SL-3 = 60/40 | 1.5 |
| N-85 | A-40 | 76 | B-6 | 20 | Q-3/Q-6 | 1/3 | | | SL-1/SL-2 = 60/40 | 1.5 |
| N-86 | A-41 | 75 | B-5 | 20 | Q-6 | 5 | | | SL-3/SL-5 = 90/10 | 1.5 |
| N-87 | A-42 | 74 | B-7 | 20 | Q-5 | 6 | | | SL-1/SL-2 = 60/40 | 1.5 |
| N-88 | A-42 | 74 | B-8 | 20 | Q-5 | 6 | | | SL-1/SL-2 = 70/30 | 1.5 |
| N-89 | A-43 | 74 | B-7 | 20 | Q-5 | 6 | | | SL-1 = 100 | 1.5 |
| N-90 | A-44 | 74 | B-5 | 20 | Q-5 | 6 | | | SL-1/SL-2/SL-3 = 30/20/50 | 1.5 |
| N-91 | A-45 | 74 | B-7 | 20 | Q-5 | 6 | | | SL-1/SL-2 = 60/40 | 1.5 |
| N-92 | A-46 | 75 | B-8 | 20 | Q-6 | 5 | | | SL-1/SL-3/SL-5 = 30/40/30 | 1.5 |
| N-93 | A-47 | 79 | B-6 | 20 | Q-4 | 1 | | | SL-1/SL-3 = 60/40 | 1.5 |
| N-94 | A-48 | 79 | B-6 | 20 | Q-3 | 1 | | | SL-1/SL-4 = 80/20 | 1.5 |
| N-95 | A-48 | 79 | B-4 | 20 | Q-3 | 1 | | | SL-1/SL-2 = 60/40 | 1.5 |
| N-96 | A-48 | 77 | B-4 | 20 | Q-3 | 1 | ADP-1 | 2 | SL-1/SL-2 = 80/20 | 1.5 |
| N-97 | A-49 | 79 | B-4 | 20 | Q-3 | 1 | | | SL-1/SL-2 = 60/40 | 1.5 |
| N-98 | A-50 | 79 | B-6 | 20 | Q-4 | 1 | | | SL-1/SL-3 = 60/40 | 1.5 |
| N-99 | A-50 | 75 | B-1 | 20 | Q-6 | 5 | | | SL-1/SL-2/SL-3 = 30/20/50 | 1.5 |
| N-100 | A-51 | 75 | B-5 | 20 | Q-6 | 5 | | | SL-1/SL-3/SL-4 = 30/60/10 | 1.5 |
| N-101 | A-52 | 74 | B-2 | 25 | Q-4 | 1 | | | SL-1/SL-2/SL-3 = 30/20/50 | 1.5 |
| N-102 | A-53 | 75 | B-5 | 20 | Q-6 | 5 | | | SL-1/SL-2 = 60/40 | 1.5 |
| N-103 | A-54 | 74 | B-5 | 20 | Q-5 | 6 | | | SL-1/SL-4 = 80/20 | 1.5 |
| N-104 | A-55 | 74 | B-2 | 25 | Q-3 | 1 | | | SL-1 = 100 | 1.5 |
| N-105 | A-56 | 75 | B-6 | 20 | Q-6 | 5 | | | SL-1/SL-2/SL-3 = 60/20/20 | 1.5 |
| N-106 | A-57 | 79 | B-6 | 20 | Q-4 | 1 | | | SL-3/SL-5 = 90/10 | 1.5 |
| N-107 | A-57 | 74 | B-7 | 20 | Q-5 | 6 | | | SL-1/SL-3 = 60/40 | 1.5 |
| N-108 | A-57 | 74 | B-8 | 20 | Q-5 | 6 | | | SL-1/SL-2 = 60/40 | 1.5 |
| N-109 | A-57 | 79 | B-9 | 20 | Q-4 | 1 | | | SL-1/SL-2 = 60/40 | 1.5 |
| N-110 | A-58 | 79 | B-8 | 20 | Q-3 | 1 | | | SL-1/SL-3/SL-4 = 30/60/10 | 1.5 |
| N-111 | A-59 | 79 | B-5 | 20 | Q-4 | 1 | | | SL-1/SL-2 = 60/40 | 1.5 |
| N-112 | A-59 | 70 | B-2 | 25 | Q-6 | 5 | | | SL-1/SL-2/SL-3 = 30/20/50 | 1.5 |
| N-113 | A-60 | 74 | B-3 | 25 | Q-3 | 1 | | | SL-1/SL-3 = 50/50 | 1.5 |
| N-114 | A-61 | 79 | B-5 | 20 | Q-3 | 1 | | | SL-1/SL-4 = 80/20 | 1.5 |
| N-115 | A-62 | 79 | B-6 | 20 | Q-4 | 1 | | | SL-1/SL-3/SL-5 = 30/40/30 | 1.5 |
| N-116 | A-63 | 75 | B-5 | 20 | Q-6 | 5 | | | SL-1/SL-2/SL-3 = 30/20/50 | 1.5 |
| N-117 | A-64 | 74 | B-8 | 20 | Q-5 | 6 | | | SL-1 = 100 | 1.5 |
| N-118 | A-65 | 74.2 | B-2 | 25 | Q-1 | 0.8 | | | SL-3/SL-5 = 90/10 | 1.5 |
| N-119 | A-66 | 79 | B-5 | 20 | Q-3 | 1 | | | SL-1/SL-3 = 50/50 | 1.5 |
| N-120 | A-67 | 74 | B-2 | 25 | Q-4 | 1 | | | SL-1/SL-3/SL-4 = 30/60/10 | 1.5 |
| N-121 | A-68 | 75 | B-6 | 20 | Q-6 | 5 | | | SL-1/SL-3 = 60/40 | 1.5 |
| N-122 | A-69 | 79 | B-4 | 20 | Q-3 | 1 | | | SL-1/SL-2 = 60/40 | 1.5 |
| N-123 | A-70 | 74 | B-5 | 20 | Q-5 | 6 | | | SL-1/SL-3/SL-5 = 30/40/30 | 1.5 |
| N-124 | A-71 | 79 | B-6 | 20 | Q-4 | 1 | | | SL-1/SL-2/SL-3 = 60/20/20 | 1.5 |
| RN-1 | R-1 | 74 | B-5 | 20 | Q-5 | 6 | | | SL-1/SL-2/SL-3 = 30/20/50 | 1.5 |
| RN-2 | R-2 | 74 | B-5 | 20 | Q-5 | 6 | | | SL-1/L-3 = 60/40 | 1.5 |
| RN-3 | R-3 | 74 | B-5 | 20 | Q-5 | 6 | | | SL-1/SL-4 = 80/20 | 1.5 |

TABLE 2-continued

| | Resin (A) | | Photoacid generator | | Acid diffusion control agent | | Hydrophobic resin or surfactant | | | Concentration of solid |
|---|---|---|---|---|---|---|---|---|---|---|
| | Type | % by mass | Type | % by mass | Type | % by mass | Type | % by mass | Solvent | content % by mass |
| RN-4 | R-4 | 74 | B-5 | 20 | Q-5 | 6 | | | SL-3 = 100 | 1.5 |
| RN-5 | R-5 | 74 | B-5 | 20 | Q-5 | 6 | | | SL-1/SL-2 = 70/30 | 1.5 |
| RN-6 | R-6 | 74 | B-5 | 20 | Q-5 | 6 | | | SL-1/SL-3 = 60/40 | 1.5 |
| RN-7 | R-7 | 74 | B-5 | 20 | Q-5 | 6 | | | SL-1/SL-3/SL-4 = 30/60/10 | 1.5 |

[Pattern Formation]
<Developer and Rinsing Liquid>

Development and washing of the pattern were carried out by the methods set forth in the section below, using a developer and a rinsing liquid set forth below.

D-1: 3.00%-by-mass Aqueous tetramethylammonium hydroxide solution

D-2: 2.3850%-by-mass Aqueous tetramethylammonium hydroxide solution

D-3: 1.50%-by-mass Aqueous tetramethylammonium hydroxide solution

D-4: 1.00%-by-mass Aqueous tetramethylammonium hydroxide solution

D-5: 0.80%-by-mass Aqueous tetramethylammonium hydroxide solution

D-6: Pure water

D-7: FIRM Extreme 10 (manufactured by AZEM) (an aqueous surfactant solution)

<EUV Exposure>

AL412 (manufactured by Brewer Science) was applied onto a silicon wafer to form an underlayer film. A resist composition described in Table 2 was applied thereonto and the obtained coating film was heated at 120° C. for 60 seconds to form a resist film having a film thickness of 35 nm.

The silicon wafer having the resist film was subjected to pattern irradiation using an EUV exposure device (manufactured by Exitech Ltd., Micro Exposure Tool, NA 0.3, Quadrupole, an outer sigma of 0.68, and an inner sigma of 0.36). Further, a mask with a line size=20 nm and a line:space=1:1 was used as a reticle.

Thereafter, the silicon wafer was post-exposure baked (PEB) at a temperature shown in Table 3 for 60 seconds, and then puddle-developed for 30 seconds using a developer shown in Table 3. In addition, the silicon wafer was puddle-rinsed with a rinsing liquid shown in Table 3 by a puddle method, and then the silicon wafer was rotated at a rotation speed of 4,000 rpm for 30 seconds and further baked at 90° C. for 60 seconds to obtain a line-and-space pattern.

[Evaluation]
<LER>

The line-and-space pattern resolved at an optimal exposure dose (an exposure dose at which the line width reached 20 nm) was observed from an upper part thereof using a critical dimension scanning electron microscope (SEM: CG-4100 manufactured by Hitachi High Technologies Corporation). At this time, a distance from a center of the pattern to the edge was measured at any points (100 points) and a measurement deviation thereof was evaluated as $3\sigma$. A smaller value thereof indicates better LER performance.

The results are shown in Table 3.

<Suppression of Pattern Collapse>

While the exposure dose was changed, the line width of the line-and-space pattern formed was measured. At this time, a minimum line width with which the pattern was resolved without collapse over 10 $\mu m^2$ was defined as a collapse line width. A smaller value thereof indicates a wider margin of the pattern collapse and further suppression of pattern collapse.

The results are shown in Table 3.

[Results]

In Table 3, the section of "Resin (A)" shows the types of the resin whose polarity increases by the action of an acid (resin (A)) used in the resist composition.

In Table 3, the section of "Acid-decomposable unit" shows the types of the repeating unit having an acid-decomposable group contained in the resin (A) used.

In Table 3, the section of "Halogen (F)" shows whether the halogen atom contained in the group represented by General Formula (1) is a fluorine atom in a case where the unit having acid-decomposable group contained in the resin (A) used has the group.

In Table 3, the section of "General Formula (2)" shows whether the unit having an acid-decomposable group contained in the resin (A) used corresponds to the unit represented by General Formula (2) in a case where the unit has the group represented by General Formula (1).

In Table 3, the section of "Single bond ($L_1$)" shows whether the repeating unit represented by General Formula (2) corresponds to a case where L in General Formula (2) is a single bond, in a case where the resin (A) used has the repeating unit.

In Table 3, the section of "Bond species ($L_2$)" shows the form of a position corresponding to $L_2$ in a case where the resin (A) used has the repeating unit represented by General Formula (2). A case where $L_2$ is a single bond is cited as "Single", a case where $L_2$ is a carbonyl group is cited as "CO", and a case where $L_2$ is —$C(CF_3)_2$— is cited as "$C(CF_3)_2$".

In Table 3, the section of "AR($R_4$, $R_5$)" shows whether the repeating unit represented by General Formula (2) corresponds to a case where at least one of $R_4$ or $R_5$ in the group represented by General Formula (1) is an aryl group substituted with a fluorine atom or a fluorinated alkyl group, in a case where the resin (A) used has the repeating unit.

In Table 3, the section of "AR($R_4$)" shows whether the repeating unit corresponds to a case where $R_4$ in the group represented by General Formula (1) is an aryl group substituted with a fluorine atom or a fluorinated alkyl group, in a case corresponding to a requirement of "AR($R_4$, $R_5$)".

In Table 3, the section of "Benzene (Ar)" shows whether the repeating unit represented by General Formula (2) corresponds to a case where Ar in General Formula (2) is a benzene ring group, in a case where the resin (A) used has the repeating unit.

Furthermore, with regard to the repeating unit having an acid-decomposable group, a case corresponding to each of the above-mentioned conditions is cited as "Presence" and a case not corresponding thereto is cited as "Absence". Furthermore, "(Presence)" means that an acid-decomposable unit corresponding to the requirement and an acid-decomposable unit not corresponding to the requirement are used in combination.

In Table 3, the section of "F-Containing indecomposable unit" shows the types of the repeating unit having a fluorine atom and having no acid-decomposable group contained in the resin (A) used. A case having no repeating unit having a fluorine atom and having no acid-decomposable group was cited as "Absence".

In Table 3, the results from a use of the resist compositions (N-1) to (N-124) correspond to Examples, and the results from a use of the resist compositions (RN-1) to (RN-7) correspond to Comparative Examples.

TABLE 3

| | Pattern forming condition | | | Features of resin (A) | | | | | | | | F-containing indecomposable unit | Evaluation | |
|---|---|---|---|---|---|---|---|---|---|---|---|---|---|---|
| | | | | | Repeating unit having acid-decomposable group | | | | | | | | | |
| | PEB (° C.) | Developer | Rinsing liquid | Resin (A) | Acid-decomposable unit | Halogen (F) | General Formula (2) | Single bond ($L_1$) | Bond species ($L_2$) | AR ($R_4, R_5$) | AR ($R_4$) | Benzene (Ar) | | LER (nm) | Line width (nm) before collapse |
| N-1 | 110 | D-2 | D-6 | A-1 | a-1 | Presence | Presence | Presence | Single | Presence | Presence | Presence | f-1 | 2.3 | 19 |
| N-2 | 110 | D-2 | D-6 | A-1 | a-1 | Presence | Presence | Presence | Single | Presence | Presence | Presence | f-1 | 2.3 | 18 |
| N-3 | 110 | D-2 | D-7 | A-2 | a-1 | Presence | Presence | Presence | Single | Presence | Presence | Presence | f-1 | 2.2 | 17 |
| N-4 | 110 | D-1 | D-6 | A-2 | a-1 | Presence | Presence | Presence | Single | Presence | Presence | Presence | f-1 | 2.2 | 17 |
| N-5 | 95 | D-4 | D-6 | A-2 | a-1 | Presence | Presence | Presence | Single | Presence | Presence | Presence | f-1 | 2.3 | 18 |
| N-6 | 90 | D-2 | D-6 | A-2 | a-1 | Presence | Presence | Presence | Single | Presence | Presence | Presence | f-1 | 2.1 | 17 |
| N-7 | 95 | D-2 | D-7 | A-3 | a-1 | Presence | Presence | Presence | Single | Presence | Presence | Presence | f-1 | 2 | 18 |
| N-8 | 95 | D-2 | D-6 | A-4 | a-1 | Presence | Presence | Presence | Single | Presence | Presence | Presence | Absence | 2.8 | 19 |
| N-9 | 95 | D-3 | D-7 | A-4 | a-1 | Presence | Presence | Presence | Single | Presence | Presence | Presence | Absence | 2.9 | 19 |
| N-10 | 105 | D-2 | D-7 | A-5 | a-1 | Presence | Presence | Presence | Single | Presence | Presence | Presence | f-1 | 2 | 16 |
| N-11 | 110 | D-5 | D-6 | A-5 | a-1 | Presence | Presence | Presence | Single | Presence | Presence | Presence | f-1 | 1.8 | 16 |
| N-12 | 110 | D-2 | D-6 | A-5 | a-1 | Presence | Presence | Presence | Single | Presence | Presence | Presence | f-1 | 1.7 | 15 |
| N-13 | 100 | D-2 | D-6 | A-5 | a-1 | Presence | Presence | Presence | Single | Presence | Presence | Presence | f-1 | 1.6 | 16 |
| N-14 | 95 | D-2 | D-6 | A-5 | a-1 | Presence | Presence | Presence | Single | Presence | Presence | Presence | f-1 | 1.6 | 15 |
| N-15 | 90 | D-3 | D-6 | A-5 | a-1 | Presence | Presence | Presence | Single | Presence | Presence | Presence | f-1 | 1.7 | 15 |
| N-16 | 95 | D-2 | D-6 | A-2/A-5 | a-1 | Presence | Presence | Presence | Single | Presence | Presence | Presence | f-1 | 1.8 | 16 |
| N-17 | 115 | D-2 | D-7 | A-6 | a-1 | Presence | Presence | Presence | Single | Presence | Presence | Presence | f-1 | 1.7 | 15 |
| N-18 | 95 | D-2 | D-6 | A-6 | a-1 | Presence | Presence | Presence | Single | Presence | Presence | Presence | f-1 | 1.7 | 16 |
| N-19 | 95 | D-2 | D-7 | A-6 | a-1 | Presence | Presence | Presence | Single | Presence | Presence | Presence | f-1 | 1.6 | 15 |
| N-20 | 100 | D-2 | D-6 | A-6 | a-1 | Presence | Presence | Presence | Single | Presence | Presence | Presence | f-1 | 1.7 | 16 |
| N-21 | 95 | D-2 | D-6 | A-6 | a-1 | Presence | Presence | Presence | Single | Presence | Presence | Presence | f-1 | 1.7 | 16 |
| N-22 | 110 | D-2 | D-6 | A-7 | a-1/ra-2 | (Presence) | (Presence) | (Presence) | Single | (Presence) | (Presence) | (Presence) | f-1 | 2.2 | 17 |
| N-23 | 95 | D-2 | D-6 | A-7 | a-1/ra-2 | (Presence) | (Presence) | (Presence) | Single | (Presence) | (Presence) | (Presence) | f-1 | 2.3 | 17 |
| N-24 | 100 | D-2 | D-6 | A-8 | a-1/ra-3 | (Presence) | (Presence) | (Presence) | Single | (Presence) | (Presence) | (Presence) | f-1 | 2.2 | 18 |
| N-25 | 100 | D-2 | D-6 | A-8 | a-1/ra-3 | (Presence) | (Presence) | (Presence) | Single | (Presence) | (Presence) | (Presence) | f-1 | 2.1 | 17 |
| N-26 | 100 | D-2 | D-7 | A-9 | a-1 | Presence | Presence | Presence | Single | Presence | Presence | Presence | f-1 | 1.7 | 16 |
| N-27 | 100 | D-2 | D-6 | A-9 | a-1 | Presence | Presence | Presence | Single | Presence | Presence | Presence | f-1 | 1.8 | 17 |
| N-28 | 95 | D-2 | D-6 | A-9 | a-1 | Presence | Presence | Presence | Single | Presence | Presence | Presence | f-1 | 1.7 | 17 |
| N-29 | 90 | D-2 | D-7 | A-9 | a-1 | Presence | Presence | Presence | Single | Presence | Presence | Presence | f-1 | 1.6 | 15 |
| N-30 | 90 | D-2 | D-6 | A-10 | a-1 | Presence | Presence | Presence | Single | Presence | Presence | Presence | f-1 | 2 | 17 |
| N-31 | 105 | D-2 | D-7 | A-10 | a-1 | Presence | Presence | Presence | Single | Presence | Presence | Presence | f-1 | 1.9 | 16 |
| N-32 | 95 | D-2 | D-6 | A-10 | a-1 | Presence | Presence | Presence | Single | Presence | Presence | Presence | f-1 | 1.8 | 16 |
| N-33 | 90 | D-2 | D-6 | A-10 | a-1 | Presence | Presence | Presence | Single | Presence | Presence | Presence | f-1 | 1.8 | 16 |
| N-34 | 95 | D-2 | D-6 | A-11 | a-1/a-14 | Presence | Presence | Presence | Single | (Presence) | (Presence) | Presence | f-1 | 2 | 19 |
| N-35 | 100 | D-2 | D-6 | A-11 | a-1/a-14 | Presence | Presence | Presence | Single | (Presence) | (Presence) | Presence | f-1 | 1.7 | 19 |
| N-36 | 90 | D-2 | D-6 | A-11 | a-1/a-14 | Presence | Presence | Presence | Single | (Presence) | (Presence) | Presence | f-1 | 2 | 19 |
| N-37 | 90 | D-2 | D-6 | A-12 | a-1 | Presence | Presence | Presence | Single | Presence | Presence | Presence | f-1/f-2 | 1.6 | 17 |
| N-38 | 90 | D-2 | D-6 | A-12 | a-1 | Presence | Presence | Presence | Single | Presence | Presence | Presence | f-1/f-2 | 1.8 | 17 |
| N-39 | 95 | D-2 | D-6 | A-12 | a-1 | Presence | Presence | Presence | Single | Presence | Presence | Presence | f-1/f-2 | 1.6 | 16 |
| N-40 | 115 | D-2 | D-6 | A-13 | a-1 | Presence | Presence | Presence | Single | Presence | Presence | Presence | f-1 | 2.2 | 18 |
| N-41 | 95 | D-3 | D-6 | A-14 | a-1 | Presence | Presence | Presence | Single | Presence | Presence | Presence | f-1 | 2 | 16 |
| N-42 | 90 | D-2 | D-7 | A-14 | a-1 | Presence | Presence | Presence | Single | Presence | Presence | Presence | f-1 | 2.1 | 16 |
| N-43 | 110 | D-4 | D-6 | A-14 | a-1 | Presence | Presence | Presence | Single | Presence | Presence | Benzene | f-1 | 1.9 | 16 |
| N-44 | 90 | D-2 | D-7 | A-14 | a-1 | Presence | Presence | Presence | Single | Presence | Presence | Presence | f-1 | 2 | 17 |
| N-45 | 95 | D-1 | D-6 | A-15 | a-1 | Presence | Presence | Presence | Single | Presence | Presence | Presence | f-1/f-7 | 1.8 | 17 |
| N-46 | 95 | D-2 | D-6 | A-16 | a-1 | Presence | Presence | Presence | Single | Presence | Presence | Presence | f-1 | 2.2 | 18 |
| N-47 | 95 | D-2 | D-6 | A-17 | a-1 | Presence | Presence | Presence | Single | Presence | Presence | Presence | f-1 | 2.2 | 18 |
| N-48 | 90 | D-2 | D-6 | A-18 | a-1 | Presence | Presence | Presence | Single | Presence | Presence | Presence | f-4 | 2.1 | 17 |
| N-49 | 90 | D-3 | D-6 | A-18 | a-1 | Presence | Presence | Presence | Single | Presence | Presence | Presence | f-4 | 2 | 17 |

TABLE 3-continued

| | Pattern forming condition | | | Features of resin (A) | | | | | | | | F-containing decomposable unit | Evaluation | |
|---|---|---|---|---|---|---|---|---|---|---|---|---|---|---|
| | | | | Repeating unit having acid-decomposable group | | | | | | | | | | |
| | PEB (°C.) | Developer | Rinsing liquid | Resin (A) | Acid-decomposable unit | Halogen (F) | General Formula (2) | Single bond (L₁) | Bond species (L₂) | AR (R₄, R₅) | AR (R₄) | Benzene (Ar) | LER (nm) | Line width (nm) before collapse |
| N-50 | 90 | D-2 | D-6 | A-19 | a-1 | Presence | Presence | Presence | Single | Presence | Presence | Presence | f-5 | 1.9 | 16 |
| N-51 | 95 | D-2 | D-7 | A-20 | a-1 | Presence | Presence | Presence | Single | Presence | Presence | Presence | f-6 | 1.9 | 17 |
| N-52 | 110 | D-5 | D-6 | A-20 | a-1 | Presence | Presence | Presence | Single | Presence | Presence | Presence | f-6 | 2.1 | 17 |
| N-53 | 90 | D-2 | D-6 | A-20 | a-1 | Presence | Presence | Presence | Single | Presence | Presence | Presence | f-6 | 2.2 | 17 |
| N-54 | 90 | D-2 | D-6 | A-21 | a-1 | Presence | Presence | Presence | Single | Presence | Presence | Presence | f-4 | 2 | 16 |
| N-55 | 110 | D-2 | D-6 | A-22 | a-1 | Presence | Presence | Presence | Single | Presence | Presence | Presence | f-1 | 2.1 | 17 |
| N-56 | 95 | D-2 | D-6 | A-22 | a-1 | Presence | Presence | Presence | Single | Presence | Presence | Presence | f-1 | 1.8 | 18 |
| N-57 | 95 | D-2 | D-6 | A-23 | a-1 | Presence | Presence | Presence | Single | Presence | Presence | Presence | f-7 | 1.7 | 17 |
| N-58 | 110 | D-2 | D-6 | A-24 | a-1 | Presence | Presence | Presence | Single | Presence | Presence | Presence | f-3 | 1.8 | 17 |
| N-59 | 115 | D-2 | D-6 | A-25 | a-2 | Presence | Presence | Presence | $C(CF_3)_2$ | Presence | Presence | Presence | f-4 | 1.7 | 18 |
| N-60 | 95 | D-2 | D-7 | A-25 | a-2 | Presence | Presence | Presence | $C(CF_3)_2$ | Presence | Presence | Presence | f-4 | 1.8 | 18 |
| N-61 | 110 | D-2 | D-6 | A-26 | a-2 | Presence | Presence | Presence | $C(CF_3)_2$ | Presence | Presence | Presence | f-4 | 1.9 | 18 |
| N-62 | 90 | D-2 | D-6 | A-27 | a-2 | Presence | Presence | Presence | $C(CF_3)_2$ | Presence | Presence | Presence | f-4 | 1.9 | 19 |
| N-63 | 100 | D-2 | D-7 | A-28 | a-2 | Presence | Presence | Presence | $C(CF_3)_2$ | Presence | Presence | Presence | f-1 | 2.2 | 18 |
| N-64 | 90 | D-2 | D-6 | A-28 | a-2 | Presence | Presence | Presence | $C(CF_3)_2$ | Presence | Presence | Presence | f-1 | 2 | 17 |
| N-65 | 90 | D-3 | D-6 | A-28 | a-2 | Presence | Presence | Presence | $C(CF_3)_2$ | Presence | Presence | Presence | f-1 | 2 | 17 |
| N-66 | 110 | D-2 | D-6 | A-29 | a-3 | Presence | Presence | Presence | Single | Presence | Presence | Presence | f-1 | 2.1 | 17 |
| N-67 | 95 | D-4 | D-6 | A-29 | a-3 | Presence | Presence | Presence | Single | Presence | Presence | Presence | f-1 | 2 | 18 |
| N-68 | 110 | D-2 | D-6 | A-30 | a-3 | Presence | Presence | Presence | Single | Presence | Presence | Presence | f-1 | 2.1 | 17 |
| N-69 | 110 | D-2 | D-6 | A-31 | a-3 | Presence | Presence | Presence | Single | Presence | Presence | Presence | f-3 | 2 | 18 |
| N-70 | 100 | D-2 | D-7 | A-32 | a-4 | Presence | Presence | Presence | Single | Presence | Presence | Presence | f-1 | 2 | 19 |
| N-71 | 95 | D-2 | D-7 | A-33 | a-4 | Presence | Presence | Presence | Single | Presence | Presence | Presence | f-1 | 2 | 19 |
| N-72 | 95 | D-2 | D-6 | A-34 | a-5 | Presence | Presence | Presence | Single | Presence | Presence | Presence | f-1 | 2.1 | 17 |
| N-73 | 90 | D-3 | D-6 | A-34 | a-5 | Presence | Presence | Presence | Single | Presence | Presence | Presence | f-1 | 1.9 | 16 |
| N-74 | 90 | D-2 | D-6 | A-34 | a-5 | Presence | Presence | Presence | Single | Presence | Presence | Presence | f-1 | 2.1 | 16 |
| N-75 | 90 | D-4 | D-6 | A-35 | a-5 | Presence | Presence | Presence | Single | Presence | Presence | Presence | f-1/f-2 | 2.2 | 18 |
| N-76 | 95 | D-2 | D-6 | A-36 | a-6 | Presence | Presence | Presence | Single | Presence | Presence | Presence | f-1 | 2.3 | 18 |
| N-77 | 115 | D-1 | D-7 | A-36 | a-6 | Presence | Presence | Presence | Single | Presence | Presence | Presence | f-1 | 2.1 | 16 |
| N-78 | 95 | D-2 | D-6 | A-37 | a-6 | Presence | Presence | Presence | Single | Presence | Presence | Presence | Absence | 2.7 | 17 |
| N-79 | 95 | D-2 | D-6 | A-37 | a-6 | Presence | Presence | Presence | Single | Presence | Presence | Presence | Absence | 2.9 | 18 |
| N-80 | 90 | D-2 | D-6 | A-38 | a-6 | Presence | Presence | Presence | Single | Presence | Presence | Presence | f-1/f-7 | 2 | 16 |
| N-81 | 95 | D-3 | D-6 | A-39 | a-7 | Presence | Presence | Presence | Single | Presence | Presence | Presence | f-3 | 1.7 | 16 |
| N-82 | 95 | D-2 | D-6 | A-39 | a-7 | Presence | Presence | Presence | Single | Presence | Presence | Presence | f-3 | 1.7 | 16 |
| N-83 | 105 | D-2 | D-6 | A-39 | a-7 | Presence | Presence | Presence | Single | Presence | Presence | Presence | f-3 | 1.6 | 15 |
| N-84 | 95 | D-5 | D-7 | A-40 | a-7 | Presence | Presence | Presence | Single | Presence | Presence | Presence | f-3 | 1.7 | 16 |
| N-85 | 100 | D-2 | D-6 | A-40 | a-7 | Presence | Presence | Presence | Single | Presence | Presence | Presence | f-3 | 18 | 17 |
| N-86 | 95 | D-2 | D-6 | A-41 | a-7 | Presence | Presence | Presence | Single | Presence | Presence | Presence | f-5 | 1.6 | 16 |
| N-87 | 95 | D-2 | D-7 | A-42 | a-8 | Presence | Presence | Presence | Single | Presence | Presence | Presence | f-1 | 1.7 | 16 |
| N-88 | 90 | D-2 | D-6 | A-42 | a-8 | Presence | Presence | Presence | Single | Presence | Presence | Presence | f-1 | 1.7 | 17 |
| N-89 | 95 | D-2 | D-6 | A-43 | a-8 | Presence | Presence | Presence | Single | Presence | Presence | Presence | f-1/f-7 | 1.9 | 18 |
| N-90 | 95 | D-2 | D-6 | A-44 | a-8 | Presence | Presence | Presence | Single | Presence | Presence | Presence | f-1 | 1.8 | 17 |
| N-91 | 95 | D-2 | D-6 | A-45 | a-9 | Presence | Presence | Presence | $C(CF_3)_2$ | Presence | Presence | Presence | f-1 | 1.8 | 18 |
| N-92 | 90 | D-2 | D-6 | A-46 | a-9 | Presence | Presence | Presence | $C(CF_3)_2$ | Presence | Presence | Presence | f-4 | 1.7 | 18 |
| N-93 | 95 | D-2 | D-6 | A-47 | a-9 | Presence | Presence | Presence | $C(CF_3)_2$ | Presence | Presence | Presence | f-1 | 1.7 | 18 |
| N-94 | 95 | D-2 | D-7 | A-48 | a-10 | Presence | Presence | Presence | Single | Presence | Absence | Presence | f-1 | 2.5 | 18 |
| N-95 | 90 | D-2 | D-6 | A-48 | a-10 | Presence | Presence | Presence | Single | Presence | Absence | Presence | f-1 | 2.5 | 17 |
| N-96 | 90 | D-2 | D-7 | A-48 | a-10 | Presence | Presence | Presence | Single | Presence | Absence | Presence | f-1 | 2.6 | 18 |
| N-97 | 90 | D-2 | D-6 | A-49 | a-10 | Presence | Presence | Presence | Single | Presence | Absence | Presence | f-5 | 2.6 | 17 |
| N-98 | 95 | D-2 | D-6 | A-50 | a-11 | Presence | Presence | Presence | Single | Presence | Absence | Presence | f-1 | 2.4 | 17 |
| N-99 | 90 | D-2 | D-6 | A-50 | a-11 | Presence | Presence | Presence | Single | Presence | Absence | Presence | f-1 | 2.3 | 16 |
| N-100 | 95 | D-2 | D-7 | A-51 | a-11 | Presence | Presence | Presence | Single | Presence | Absence | Presence | f-1 | 2.3 | 17 |
| N-101 | 115 | D-2 | D-6 | A-52 | a-11 | Presence | Presence | Presence | Single | Presence | Absence | Presence | f-1 | 2.2 | 16 |
| N-102 | 95 | D-2 | D-6 | A-53 | a-12 | Presence | Presence | Presence | Single | Presence | Presence | Absence | f-1 | 2.6 | 17 |
| N-103 | 95 | D-4 | D-7 | A-54 | a-12 | Presence | Presence | Presence | Single | Presence | Presence | Absence | f-1/f-2 | 2.7 | 17 |
| N-104 | 110 | D-2 | D-6 | A-55 | a-13 | Presence | Presence | Absence | Single | Presence | Presence | Presence | f-1 | 2.5 | 20 |
| N-105 | 95 | D-1 | D-6 | A-56 | a-13 | Presence | Presence | Absence | Single | Presence | Presence | Presence | f-4 | 2.5 | 21 |
| N-106 | 100 | D-2 | D-6 | A-57 | a-14 | Presence | Presence | Presence | Single | Absence | — | Presence | f-1 | 1.9 | 23 |
| N-107 | 110 | D-2 | D-6 | A-57 | a-14 | Presence | Presence | Presence | Single | Absence | — | Presence | f-1 | 1.8 | 23 |
| N-108 | 95 | D-2 | D-6 | A-57 | a-14 | Presence | Presence | Presence | Single | Absence | — | Presence | f-1 | 2 | 24 |
| N-109 | 95 | D-3 | D-6 | A-57 | a-14 | Presence | Presence | Presence | Single | Absence | — | Presence | f-1 | 2 | 23 |
| N-110 | 95 | D-2 | D-7 | A-58 | a-14 | Presence | Presence | Presence | Single | Absence | — | Presence | f-1 | 2.1 | 24 |
| N-111 | 100 | D-2 | D-6 | A-59 | a-14 | Presence | Presence | Presence | Single | Absence | — | Presence | f-1 | 2 | 23 |
| N-112 | 120 | D-2 | D-6 | A-59 | a-14 | Presence | Presence | Presence | Single | Absence | — | Presence | f-1 | 2 | 23 |
| N-113 | 120 | D-2 | D-6 | A-60 | a-15 | Presence | Presence | Presence | Single | Absence | — | Presence | Absence | 2.9 | 25 |
| N-114 | 100 | D-2 | D-6 | A-61 | a-15 | Presence | Presence | Presence | Single | Absence | — | Presence | f-1 | 2.1 | 24 |
| N-115 | 95 | D-2 | D-6 | A-62 | a-16 | Presence | Absence | — | — | — | — | — | f-1 | 2.4 | 26 |
| N-116 | 100 | D-3 | D-6 | A-63 | a-16 | Presence | Absence | — | — | — | — | — | f-1 | 2.4 | 26 |
| N-117 | 90 | D-2 | D-7 | A-64 | a-16 | Presence | Absence | — | — | — | — | — | f-1/f-2 | 2.5 | 26 |

TABLE 3-continued

| | Pattern forming condition | | | Features of resin (A) | | | | | | | | F-containing composable unit | Evaluation | |
|---|---|---|---|---|---|---|---|---|---|---|---|---|---|---|
| | | | | | Repeating unit having acid-decomposable group | | | | | | | | | |
| | PEB (°C.) | Developer | Rinsing liquid | Resin (A) | Acid-decomposable unit | Halogen (F) | General Formula (2) | Single bond ($L_1$) | Bond species ($L_2$) | AR ($R_4, R_5$) | AR ($R_4$) | Benzene (Ar) | | LER (nm) | Line width (nm) before collapse |
| N-118 | 115 | D-4 | D-6 | A-65 | a-17 | Presence | Absence | — | — | — | — | — | Absence | 3.1 | 26 |
| N-119 | 95 | D-2 | D-6 | A-66 | a-17 | Presence | Absence | — | — | — | — | — | f-4 | 2.8 | 26 |
| N-120 | 115 | D-2 | D-6 | A-67 | a-17 | Presence | Absence | — | — | — | — | — | f-3 | 2.8 | 25 |
| N-121 | 95 | D-3 | D-6 | A-68 | a-18 | Presence | Presence | Presence | CO | Presence | Presence | Presence | Absence | 3.1 | 25 |
| N-122 | 90 | D-2 | D-6 | A-69 | a-18 | Presence | Presence | Presence | CO | Presence | Presence | Presence | f-1 | 2.6 | 22 |
| N-123 | 95 | D-2 | D-6 | A-70 | a-18 | Presence | Presence | Presence | CO | Presence | Presence | Presence | f-4 | 2.5 | 21 |
| N-124 | 100 | D-2 | D-7 | A-71 | a-19 | Absence | Presence | Presence | Single | Presence | Presence | Presence | Absence | 2.8 | 24 |
| RN-1 | 100 | D-2 | D-6 | R-1 | ra-1 | — | — | — | — | — | — | — | Absence | 4.5 | 29 |
| RN-2 | 100 | D-2 | D-6 | R-2 | ra-1 | — | — | — | — | — | — | — | f-1 | 3.6 | 29 |
| RN-3 | 100 | D-2 | D-6 | R-3 | ra-2 | — | — | — | — | — | — | — | Absence | 4.2 | 28 |
| RN-4 | 100 | D-3 | D-6 | R-4 | ra-3 | — | — | — | — | — | — | — | f-1 | 3.7 | 30 |
| RN-5 | 100 | D-2 | D-6 | R-5 | ra-4 | — | — | — | — | — | — | — | Absence | 4 | 29 |
| RN-6 | 100 | D-2 | D-6 | R-6 | ra-5 | — | — | — | — | — | — | — | Absence | 3.5 | 30 |
| RN-7 | 100 | D-2 | D-6 | R-7 | ra-6 | — | — | — | — | — | — | — | Absence | 3 6 | 28 |

From the results shown in Table 3, it was confirmed that a pattern having excellent LER performance can be formed and pattern collapse can be suppressed by using the composition of the embodiment of the present invention.

Furthermore, in a case where the resin (A) further has a repeating unit having a fluorine atom and having no acid-decomposable group, a tendency that the LER performance of a pattern is more excellent was confirmed.

In a case where the halogen atom of the group represented by General Formula (1) is a fluorine atom, a tendency that the pattern collapse can be further suppressed was confirmed.

In a case where the resin (A) has the repeating unit represented by General Formula (2), a tendency that the pattern collapse can be further suppressed was confirmed.

In a case where the resin (A) has a repeating unit in which $L_1$ in General Formula (2) is a single bond, a tendency that the LER performance of a pattern is more excellent and the pattern collapse is further suppressed was confirmed.

In a case where the resin (A) has a repeating unit in which $L_1$ in General Formula (2) is a single bond or a perfluoroalkylene group, a tendency that the LER performance of a pattern is more excellent and the pattern collapse is further suppressed was confirmed.

In a case where the resin (A) has a repeating unit in which at least one of $R_4$ or $R_5$ in General Formula (1) is an aryl group substituted with a fluorine atom or a fluorinated alkyl group, a tendency that the pattern collapse can be further suppressed was confirmed.

In addition, in a case where the resin (A) has a repeating unit in which $R_4$ in General Formula (1) is an aryl group substituted with a fluorine atom or a fluorinated alkyl group, a tendency that the LER performance of a pattern is more excellent was confirmed.

In a case where the resin (A) has a repeating unit in which Ar in General Formula (2) is a benzene ring group, a tendency that the LER performance of a pattern is more excellent was confirmed.

What is claimed is:

1. An actinic ray-sensitive or radiation-sensitive resin composition comprising a resin having a group represented by General Formula (1) and a compound that generates an acid upon irradiation with actinic rays or radiation,

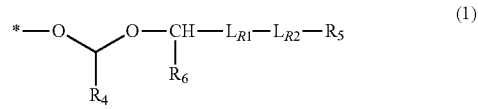

in General Formula (1), $R_4$ represents an aryl group substituted with a fluorine atom or a fluorinated alkyl group, $R_5$ represents a hydrogen atom, a halogen atom, a cycloalkyl group which may be substituted with a halogen atom or a halogenated alkyl group, or an aryl group which may be substituted with a halogen atom or a halogenated alkyl group, $R_6$ represents a hydrogen atom, or a methyl group which may be substituted with a halogen atom, $L_{R1}$ represents a single bond, or a methylene group which may be substituted with a halogen atom, and $L_{R2}$ represents a single bond, —CO—, —COO—, —NHCO—, —SO—, —SO$_2$—, —SO$_3$—, or —NHSO—, provided that the total number of halogen atoms included in $R_4$, $R_5$, $R_6$, and $L_{R1}$ is 4 or more.

2. The actinic ray-sensitive or radiation-sensitive resin composition according to claim 1,
wherein in General Formula (1), the halogen atom is a fluorine atom and the halogenated alkyl group is a fluorinated alkyl group.

3. The actinic ray-sensitive or radiation-sensitive resin composition according to claim 1,
wherein $L_{R2}$ represents a single bond.

4. The actinic ray-sensitive or radiation-sensitive resin composition according to claim 1,
wherein $R_5$ represents an aryl group substituted with a fluorine atom or a fluorinated alkyl group.

5. The actinic ray-sensitive or radiation-sensitive resin composition according to claim 1,
wherein the resin has a repeating unit represented by General Formula (2),

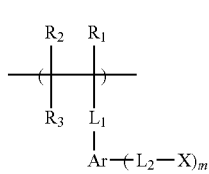

(2)

in the General Formula (2), $R_1$ to $R_3$ each independently represents a hydrogen atom, a halogen atom, an alkyl group, a cycloalkyl group, a cyano group, or an alkoxycarbonyl group, Ar represents an aromatic ring group, $R_3$ and Ar may be bonded to each other to form a ring, $L_1$ and $L_2$ each independently represents a single bond or a divalent linking group, X represents the group represented by General Formula (1), and m represents an integer of 1 or more.

6. The actinic ray-sensitive or radiation-sensitive resin composition according to claim 5,
wherein Ar represents a benzene ring group.

7. The actinic ray-sensitive or radiation-sensitive resin composition according to claim 5,
wherein $L_1$ represents a single bond.

8. The actinic ray-sensitive or radiation-sensitive resin composition according to claim 5,
wherein $L_2$ represents a single bond or a perfluoroalkylene group.

9. The actinic ray-sensitive or radiation-sensitive resin composition according to claim 1,
wherein the resin further has a repeating unit having a fluorine atom and having no acid-decomposable group.

10. A resist film formed with the actinic ray-sensitive or radiation-sensitive resin composition according to claim 1.

11. A pattern forming method comprising:
forming a resist film with the actinic ray-sensitive or radiation-sensitive resin composition according to claim 1;
exposing the resist film; and
developing the exposed resist film with a developer.

12. A method for manufacturing an electronic device, the method comprising the pattern forming method according to claim 11.

13. The actinic ray-sensitive or radiation-sensitive resin composition according to claim 1,
wherein the resin further has at least one repeating unit selected from the group consisting of (a) a repeating unit having a fluorine atom and having no acid-decomposable group, (b) a repeating unit having a lactone structure and having no fluorine atom, (c) a repeating unit having a phenolic hydroxyl group and no fluorine atom, and (d) a repeating unit represented by General Formula (V-1) or General Formula (V-2),

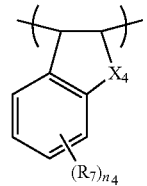

(V-1)

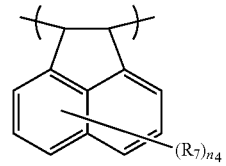

(V-2)

in the General Formula (V-1) or General Formula (V-2),
$R_6$ and $R_7$ each independently represents a hydrogen atom, a linear, branched, or cyclic alkyl group having 1 to 10 carbon atoms, an alkoxy group, an acyloxy group, a cyano group, nitro group, an amino group, a halogen atom (excluding a fluorine atom), an ester group (—COO—R: R is an alkyl group having 1 to 6 carbon atoms), or a carboxy group, $n_3$ represents an integer of 0 to 6, $n_4$ represents an integer of 0 to 4, and $X_4$ represents a methylene group, an oxygen atom, or a sulfur atom.

14. The actinic ray-sensitive or radiation-sensitive resin composition according to claim 1,
wherein the resin further has (b) a repeating unit having a lactone structure and having no fluorine atom or (c) a repeating unit having a phenolic hydroxyl group and no fluorine atom.

15. The actinic ray-sensitive or radiation-sensitive resin composition according to claim 1,
wherein $R_5$ represents a hydrogen atom, a halogen atom, or an aryl group which may be substituted with a halogen atom or a halogenated alkyl group.

16. The actinic ray-sensitive or radiation-sensitive resin composition according to claim 1,
wherein the resin has a repeating unit represented by General Formula (1'),

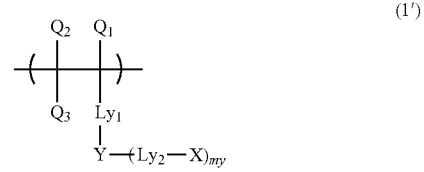

(1')

in the General Formula (1'), my represents an integer of 1, $Q_1$ to $Q_3$ each independently represents a hydrogen atom, a halogen atom, an alkyl group, a cycloalkyl group, a cyano group, an alkoxycarbonyl group, or a phenyl group, Y represents a single bond or a linking group including an aromatic ring group, $Ly_1$ and $Ly_2$ each independently represents a single bond, —O—, —CO—, —COO—, —S—, —SO$_2$—, —NR— (in which R represents a hydrogen atom or an alkyl group), or a group formed by combination thereof, and R represents a hydrogen atom or an alkyl group, and X represents the group represented by General Formula (1).

* * * * *